(12) United States Patent
Kimba et al.

(10) Patent No.: US 7,408,643 B2
(45) Date of Patent: Aug. 5, 2008

(54) METHOD AND APPARATUS FOR INSPECTING SAMPLES, AND METHOD FOR MANUFACTURING DEVICES USING METHOD AND APPARATUS FOR INSPECTING SAMPLES

(75) Inventors: Toshifumi Kimba, Fujisawa (JP); Mamoru Nakasuji, Yokohama (JP); Tohru Satake, Chigasaki (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 11/806,722

(22) Filed: Jun. 4, 2007

(65) Prior Publication Data

US 2007/0236690 A1 Oct. 11, 2007

Related U.S. Application Data

(62) Division of application No. 10/855,808, filed on May 28, 2004, now Pat. No. 7,248,353.

(30) Foreign Application Priority Data

| May 30, 2003 | (JP) | 2003-153902 |
| Jun. 6, 2003 | (JP) | 2003-161589 |
| Aug. 8, 2003 | (JP) | 2003-290021 |
| Feb. 23, 2004 | (JP) | 2004-046868 |
| Mar. 1, 2004 | (JP) | 2004-056134 |

(51) Int. Cl.
*G01B 11/00* (2006.01)

(52) U.S. Cl. .................................................. 356/401

(58) Field of Classification Search .......... 356/399–401
See application file for complete search history.

(56) References Cited

U.S. PATENT DOCUMENTS 6,310,341 B1 * 10/2001 Todokoro et al. ........... 250/305

(Continued)

FOREIGN PATENT DOCUMENTS

JP 3-075507 3/1991

(Continued)

OTHER PUBLICATIONS

Translation of Written Opinion of the International Searching Authority Form PCT/ISA/237 of International Application No. PCT/JP2004/007351 filed May 28, 2004.

(Continued)

*Primary Examiner*—Tarifur R. Chowdhury
*Assistant Examiner*—Isiaka O Akanbi
(74) *Attorney, Agent, or Firm*—Westerman, Hattori, Daniels & Adrian, LLP.

(57) ABSTRACT

A method for alignment of a chip in a substrate surface inspection is provided, in which a surface of a substrate including a chip formed therein is inspected by using a beam. The method is characterized in comprising: a step of placing the substrate so that the chip is positioned within a field of view subject to the inspection; a step of measuring a magnification for the detection when the chip is positioned within the field of view subject to the inspection; a step of calculating a size of position error of the chip based on the measured magnification for the detection; and a step of compensating for the position of the chip based on the calculated position error.

7 Claims, 34 Drawing Sheets

U.S. PATENT DOCUMENTS

| | | | |
|---|---|---|---|
| 6,320,187 B1 * | 11/2001 | Enichen | 250/252.1 |
| 6,476,388 B1 * | 11/2002 | Nakagaki et al. | 250/310 |
| 6,515,296 B1 * | 2/2003 | Komatsu et al. | 250/559.44 |
| 6,597,684 B1 | 7/2003 | Gulati et al. | |
| 6,625,156 B2 | 9/2003 | Shaio et al. | |
| 6,735,702 B1 | 5/2004 | Yavatkar et al. | |
| 2001/0054692 A1 | 12/2001 | Nakada et al. | |
| 2002/0088940 A1 | 7/2002 | Watanabe et al. | |
| 2002/0179812 A1 * | 12/2002 | Kochi et al. | 250/200 |
| 2003/0105976 A1 | 6/2003 | Copeland, III | |

FOREIGN PATENT DOCUMENTS

| | | |
|---|---|---|
| JP | 5-190639 | 7/1993 |
| JP | 9-232387 | 9/1997 |
| JP | 11-185688 | 7/1999 |
| JP | 11-219993 | 8/1999 |
| JP | 2001-84944 | 3/2001 |
| JP | 2001-357812 | 12/2001 |

OTHER PUBLICATIONS

B. Lischke et al., *Multi-Beam Concepts for Nanometer Devices*, Japanese Journal of Applied Physics, vol. 28, No. 10, pp. 2058-2064, 1989.

* cited by examiner

Fig. 8
(a)
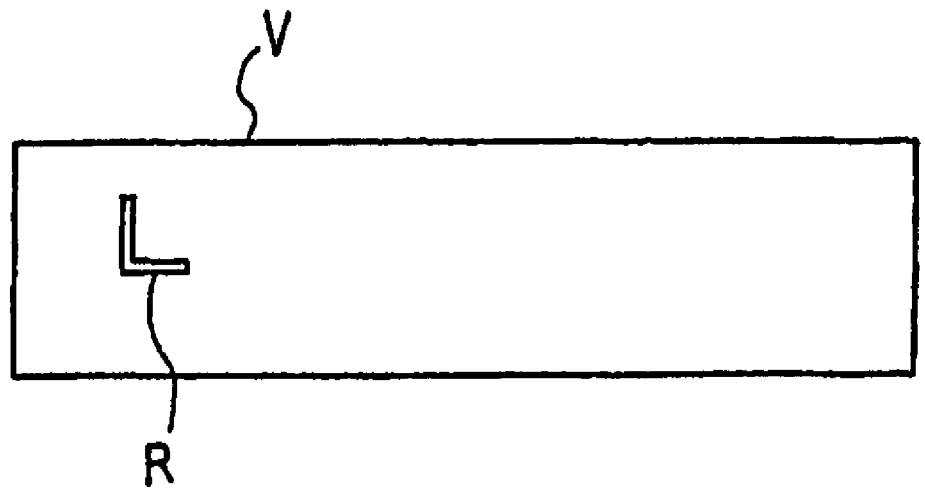
(b)
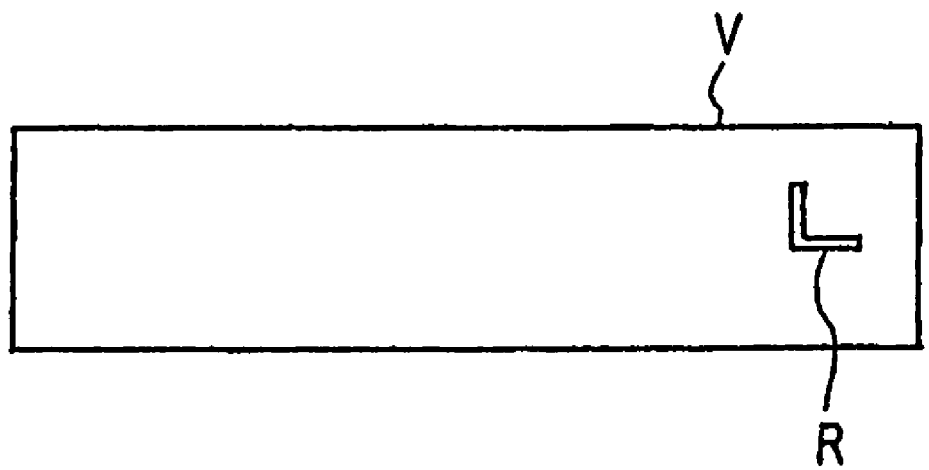

Fig. 9
(a)
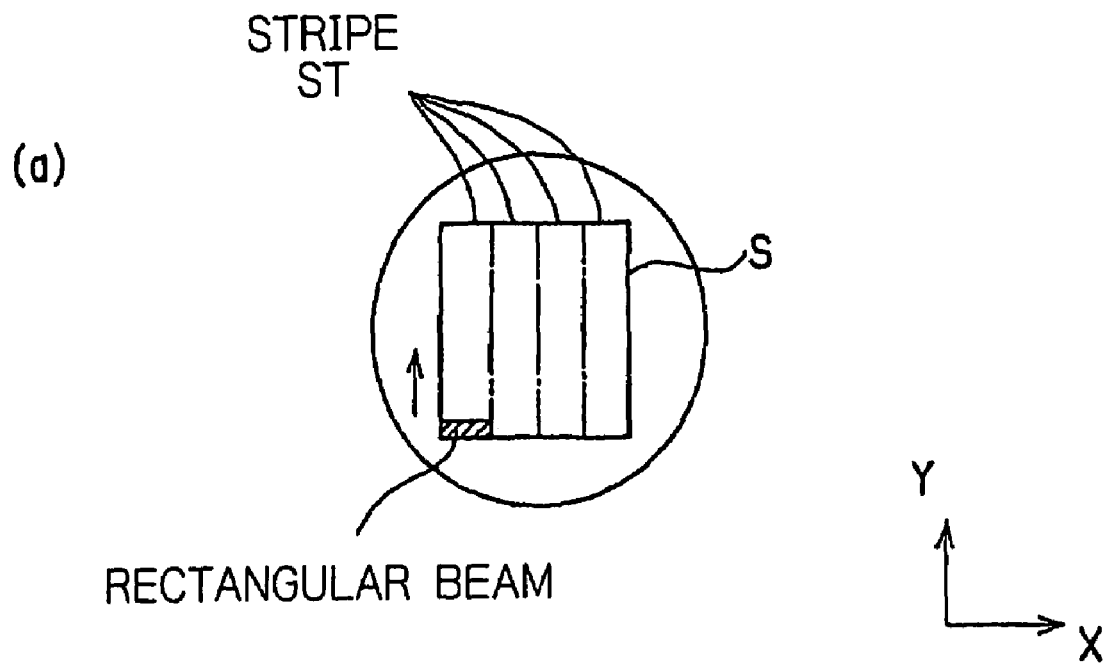
STRIPE ST
RECTANGULAR BEAM
(b)
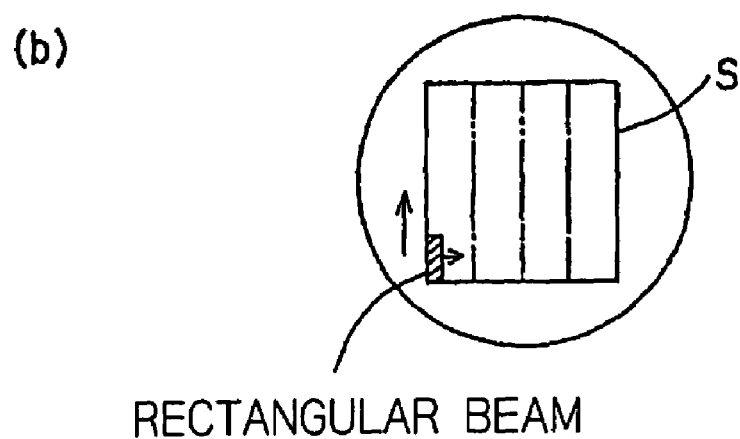
RECTANGULAR BEAM Fig. 13
(a)
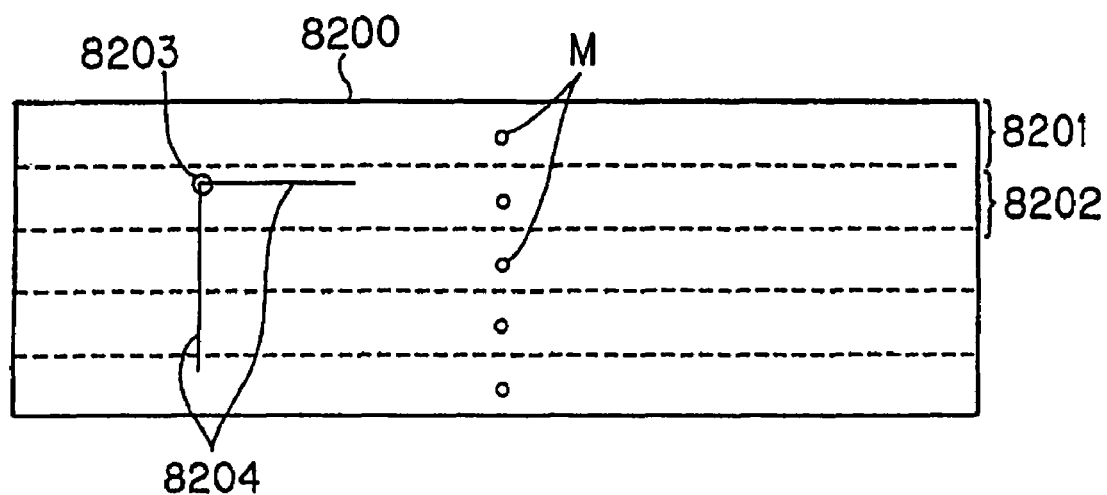
(b)
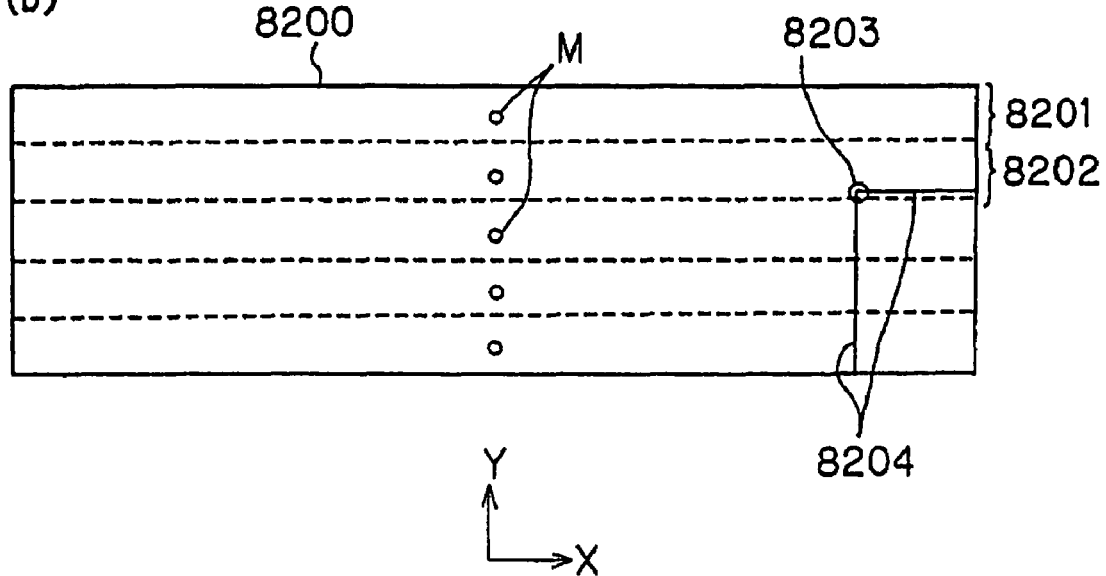

Fig. 22
(A) 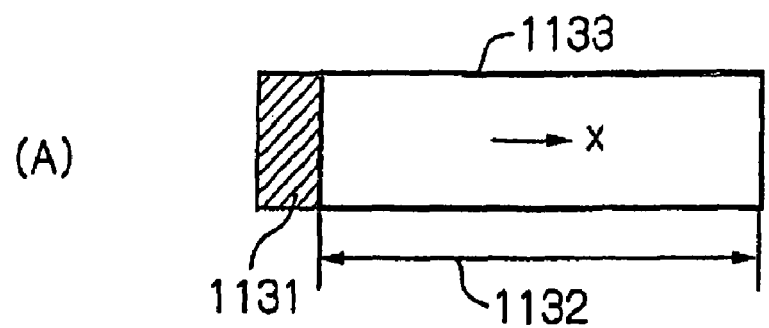
(B) 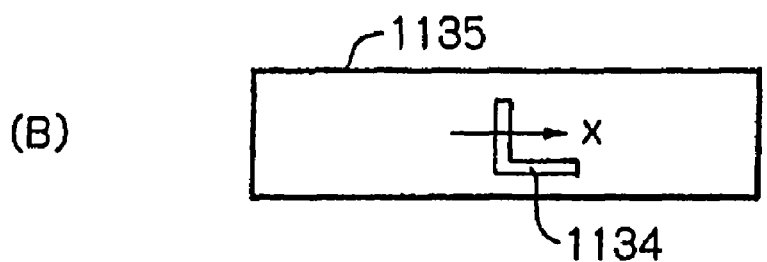
(C) 
(D) 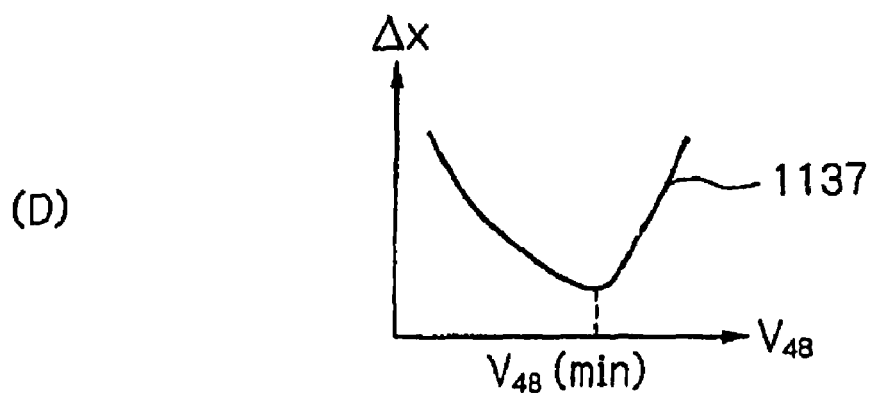

DIE MAP DIAGRAM

INSPECTION AREA INSIDE OF A DIE SETTING DIAGRAM 16 dots

OPERATION A (A)

OPERATION B (B)

$$\frac{\overset{t_1}{\sqcap}+\overset{t_2}{\sqcap}+\overset{t_3}{\sqcap}}{3} = \sqcap \text{ REFERENCE IMAGE}$$

Fig. 39
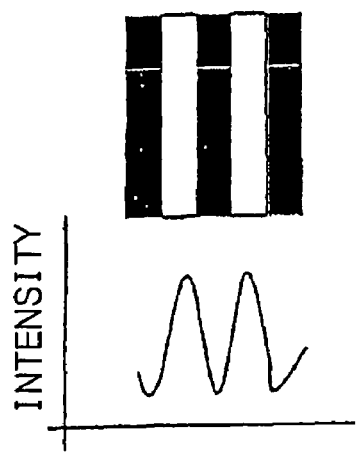
Fig. 40  DIRECTION OF SCANNING Y →
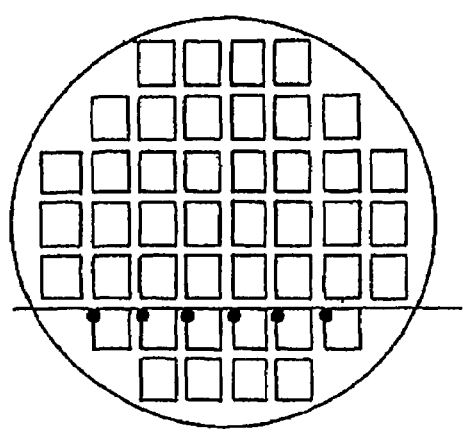
(A)
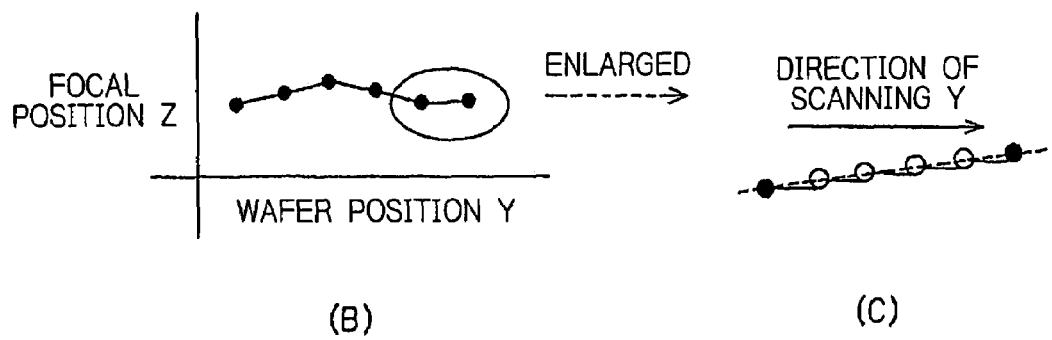
(B)     (C)

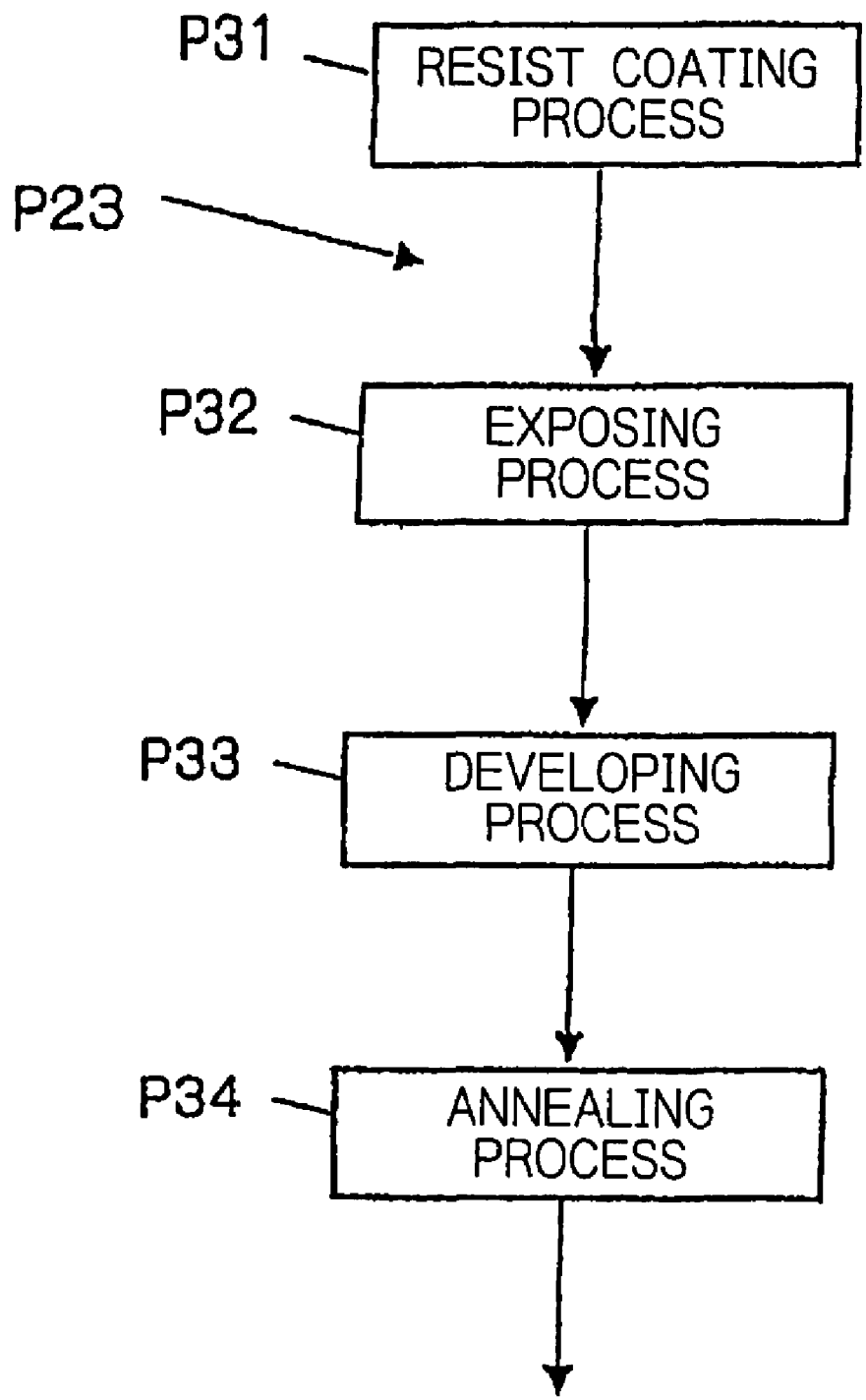

ered image signals will not be obtained.
METHOD AND APPARATUS FOR INSPECTING SAMPLES, AND METHOD FOR MANUFACTURING DEVICES USING METHOD AND APPARATUS FOR INSPECTING SAMPLES This application is a divisional of application Ser. No. 10/855,808, filed on May 28, 2004, now U.S. Pat. No. 7,248, 353 which is based upon and claims priority of Japanese Patent Application Numbers 2003-153902, 2003-161589, 2003-290021, 2004-046868 and 2004-056134 filed on May 30, 2003, Jun. 6, 2003, Aug. 8, 2003, Feb. 23, 2004 and Mar. 1, 2004, respectively, the contents being incorporated herein by reference.

BACKGROUND OF THE INVENTION

The present invention relates generally to an aligning method of a chip, an apparatus and method for inspecting samples using the same aligning method, and a method for manufacturing devices using the same apparatus and method, and specifically to: an aligning method for performing a defect inspection of a device pattern having a pattern of size equal to or less than 0.1 µm formed on a surface of a sample, such as a stencil mask, a wafer and the like, with a high precision, a high reliability and a high resolution, and also with a high throughput; an apparatus and method for inspecting samples using the same aligning method; and a method for manufacturing devices, which includes a step of inspecting samples by using the same apparatus and method for inspecting samples.

An apparatus for inspecting a sample for defects is typically operated in a manner in which an electron beam is irradiated onto a sample to be inspected, such as a wafer, to thereby generate electrons containing data related to a device pattern formed on a sample surface to be inspected; the generated electrons are then used to form an image of the data representing the device pattern; and thus obtained image is inspected in accordance with a predetermined inspection program. To improve the reliability of the result of the inspection, it is required that data having a high precision should be obtained from the device pattern on the sample surface through the irradiation of electrons. One means to address this is represented by the registration of a stage in the X-axis and the Y-axis directions, which carries the sample thereon and moves in the X-axis direction and in the Y-axis direction orthogonal to said X-axis direction, and by a focus adjustment in the Z-axis direction parallel with the axial direction of a secondary optical system.

In the practice according to the prior art method, taking as an example a case where images for two regions corresponding to each other are generated from the wafer surface to be inspected and thus obtained two images, or one of the image and another corresponding image are inspected for any defects, such a method has been typically employed, in which for said one image, a plurality of images is generated each taken by shifting a position by +1 pixel, +2 pixels, −1 pixel, −2 pixels, respectively, along the X-axis direction and the Y-axis direction, and a total of 25 thus obtained images consisting of those 24 shifted images plus 1 not-shifted image are compared with the other images, wherein a defect inspection apparatus using a single electron beam has been put into practical use for forming those images.

Further, an inspection system using a multi-beam to perform a defect inspection of the samples has been also suggested in order to improve the throughput (see, for example, Specification of U.S. Pat. No. 5,892,224 and B. Lischke, Japanese Journal of Applied Physics, Vol. 28, No. 10, p 2058). There is another known method, in which a rectangular beam is irradiated onto a sample, and an electron beam emanated from the irradiated point is magnified by a projection optical system for detection (see, for example, Japanese Patent Laid-open Publication No. Hei 7-24939).

Those systems that carry out the defect inspection using a plurality of electron beams with which a plurality of regions can be scanned at once, may be considered to theoretically improve the throughput in proportion to the number of electron beams.

The above-described inspection apparatuses for a pattern defect according to the prior art, however, have been associated with a problem that it could be difficult to perform an accurate inspection, which may possibly be arise for the following reasons:

(1) Although a stage is installed for carrying a sample thereon and moving therewith in the X-axis direction and in the Y-axis direction orthogonal to the X-axis direction, there might be a case where a distortion is induced in a stage guide serving for guiding the stage, or another case where the stage guides in the X-axis and the Y-axis directions are not crossing precisely at a right angle with respect to each other, which would prevent the stage from moving along an ideal track;

(2) Upon placing the sample on the stage, there might be a case where an X-Y coordinate of the sample is not aligned with an X-Y coordinate of the stage, and so an error would be generated in a rotational direction;

(3) There might be a case where an error is introduced in a laser interferometer for detecting a position of the sample;

(4) There might be a case where, in some samples, the die could be formed in a position offset from its designed position in the lithography process;

(5) There might be a case where a variation in moving speed is induced during a continuous movement of the stage; and (6) There might be a case where a charge-up is induced in the sample by the irradiation of the electron beam and a resultantly obtained image contains a distortion generated therefrom.

If the errors described above are not somehow compensated for, the obtained image could be offset from its theoretical position by ±2 or more pixels, for example. If there is a possibility that said offset occurs to an extent defined by each ±3 pixels in the X-axis and the Y-axis directions, then in order to ensure accurate defect inspection, the number of images to be generated for the comparison should be as much as 7×7=49. Consequently, with the above systems there could be a disadvantageous situation that the number of memories and comparator circuits required for the inspection must be increased, which in turn leads to a problem that the rate of the defect inspection could no longer keep up with that of the image taking, and accordingly the defect inspection could not be performed with high throughput.

In addition, in the defect inspection of the samples according to the prior art, as described above, simply the registration in the X-Y directions is typically practiced prior to two-dimensional image taking for subsequent pattern inspection, but an uneven surface of the sample has not been taken into consideration. From this reason also, it is possible that highly accurate image signals will not be obtained.

For example, a defect inspection apparatus using a projection optical system, which is known as an apparatus for obtaining a two-dimensional image for inspecting a sample or the like for any defects in the sample, has been associated with a problem that a magnification of a secondary electron image varies significantly over time or in response to any changes in the environment, such as a temperature change. Further, such a projection optical system has another problem that if the surface of the sample is uneven, a resolution of the two-dimensional image deteriorates because of a shallow focal depth of the system.

Yet further, those defect inspection apparatuses according to the prior art have been associated with a problem that an accurate defect inspection can not be carried out due to a frequent variation in the magnification of the image projection optical system, and in addition, no special attention has been paid to a need for an accurate measuring of a scanning sensibility of a multi-beam optical system, and also no reference specifically disclosing this matter has been found.

Still further, for the SEM using a single beam, since it comprises a single beam and a single detector, and accordingly the density of the signal fully represents data on the sample, therefore the defect detection can be performed by simply carrying out the pattern matching, but for the case of using multi beams, since the multi beams contain the variation in its beam current value by some percentage among respective beams and also has a difference in the detecting sensibility among respective beams. Therefore, the density of the signal is not necessarily representing the data on the sample exclusively. Besides, the defect detection method using the projection optical system has a problem that the density of the signal could be different even for the same pattern section in a sample depending on whether it is located in the marginal area of the field of view or in the area adjacent to an optical axis, and this may lead to a frequent detection of false-defect during the defect detecting operation.

SUMMARY OF THE INVENTION

The present invention has been made in the light of the above problems, and a first object thereof is to provide an aligning method for performing an aligning operation after measuring of a magnification when a rectangular beam is used in a sample inspection apparatus of image-projection type.

A second object of the present invention is to provide an aligning method for performing an aligning operation after measuring of a scanning sensibility when a multi-beam is used in a sample inspection apparatus of multi-beam type.

A third object of the present invention is to provide a defect inspection method for performing a defect inspection by using such an aligning method as described above.

A fourth object of the present invention is to provide a method and apparatus for inspecting a pattern, which allows a defect inspection to be performed with high accuracy even in a case where a manufacturing error of the defect inspection apparatus (a distortion in a stage guide, an orthogonal error in the stage guide) and an error relating to a positioning of the stage during its traveling motion are in a problematic level and/or a die on a sample has not been formed on an ideal coordinate in conformity with the theoretical value, as well as in the case where the moving speed of the sample is not constant.

A fifth object of the present invention is to provide an inspection method and apparatus which allows a two dimensional image to be obtained with high accuracy, high reliability and high resolution, even if the magnification in a projection optical system varies and/or even if a sample surface is uneven.

A sixth object of the present invention is to provide a defect inspection method that can prevent any false-defects from being produced in a multi-beam or a projection optical system.

A seventh object of the present invention is to provide a device manufacturing method, in which a high throughput can be expected by carrying out the defect inspection using the above-described inspection method and apparatus.

According to another aspect of the invention, a method is provided for aligning a chip in a substrate surface inspection, in which a surface of a substrate including a chip formed therein is inspected by using a beam, the method comprising steps of:

placing the substrate so that the chip is positioned within a field of view subject to the inspection;

measuring a magnification for the detection when the chip is positioned within the field of view subject to the inspection;

calculating a distance of misalignment of the chip based on the measured magnification for the detection; and compensating for the position of the chip based on the calculated distance.

In the method for aligning a chip to this aspect of the invention, the step of measuring a magnification for the detection when the chip is positioned within the field of view subject to the inspection may include steps of:

obtaining an image of a structure having a previously known actual size;

determining the number of pixels in the image of the structure; and measuring the magnification for the detection from the actual size of the structure and the number of pixels. Further, in the method for aligning a chip to this aspect of the invention, the step of measuring the magnification for the detection may include a step of obtaining at once any two of an X-coordinate, a Y-coordinate and a Z-coordinate indicating the position of the substrate.

According to another aspect of the invention, an inspection method of a substrate surface is provided, in which a surface of a substrate including a chip formed therein is inspected by using a beam, the method comprising steps of:

placing the substrate so that the chip is positioned within a field of view subject to the inspection;

measuring a magnification for the detection when the chip is positioned within the field of view subject to the inspection;

calculating a distance of misalignment of the chip based on the measured magnification for the detection;

compensating for the position of the chip based on the calculated distance;

irradiating the beam toward the surface of the substrate in which the position of the chip has been compensated for;

detecting a back-scattered beam containing the data obtained on the surface of the substrate;

obtaining an image of the surface of the substrate from the detected back-scattered beam; and performing an inspection of the substrate by using the obtained image.

In the inspection method of a substrate surface in accordance with this aspect of the invention, the step of measuring a magnification when the chip is positioned within the field of view subject to the inspection may include steps of:

obtaining an image of a structure having a previously known actual size;

determining the number of pixels in the image of the structure; and measuring the magnification for the image from the actual size of the structure and the number of pixels.

Further, in the inspection method of a substrate surface in accordance with this aspect of the invention, the step of measuring the magnification of the image may include a step of obtaining at once any two of an X-coordinate, a Y-coordinate and a Z-coordinate indicating the position of the substrate.

According to another aspect of the invention, a method is provided for aligning a chip in a sample surface inspection, in which a surface of a sample including a chip formed therein is inspected, the method comprising steps of:

(a) moving a stage so that a dicing line in a corner of a sample or a characteristic pattern on the sample comes into a field of view of an optical system in a defect inspection apparatus;

(b) irradiating a beam onto the characteristic pattern on the sample, detecting back-scattered electrons or secondary electrons from the sample by a detector and obtaining a two-dimensional image;

(c) storing a coordinate of the stage (Xc, Yc) when the two-dimensional image is obtained in the step (b);

(d) moving the stage and thus the characteristic pattern by a certain distance within the field of view;

(e) performing the same operation as the step (b) so as to obtain the two-dimensional image of the characteristic pattern in the moved position;

(f) storing a coordinate of the stage (Xf, Yf) when the image is obtained in the step (e);

(g) applying a pattern matching between a portion of the image obtained in the step (b) and the image obtained in the step (e) to calculate a displacement between the two images in the X- or the Y-directions ($\Delta X$ pixel, $\Delta Y$ pixel);

(h) calculating a difference between the coordinate (Xc, Yc) stored in the step (d) and the coordinate (Xf, Yf) stored in the step (g), defined by (Xf−Xc) or (Yf−Yc);

(i) calculating a size per pixel, (Xf−Xc)/$\Delta X$ or (Yf−Yc)/$\Delta Y$, or a magnification of a projection optical system;

(j) storing the size per pixel or the magnification of the projection optical system, which has been calculated in the step (i), into a memory; and (k) calculating a moving distance of the stage by using the size per pixel so as to perform the alignment operation.

In the method in accordance with this aspect of the invention, the beam used in the step (b) may define a shape having a longitudinal axis in one axial direction and the beam may be controlled by a deflector so as to scan the field of view along the other axial direction, while, in synchronization with the scanning, an optical parameter of a secondary optical system may be changed.

According to another aspect of the invention, a method for inspecting a substrate surface is provided, in which a surface of a substrate having a chip formed therein is inspected by using a beam, the method comprising steps of:

(a) placing the substrate on a stage;

(b) moving the stage so that a dicing line in a corner of a sample or a characteristic pattern on the sample comes into a field of view of an optical system in a defect inspection apparatus;

(c) irradiating a beam onto the characteristic pattern on the sample, detecting back-scattered electrons or secondary electrons from the sample by a detector and obtaining a two-dimensional image;

(d) storing a coordinate of the stage (Xc, Yc) when the two-dimensional image is obtained in the step (c);

(e) moving the stage by a certain distance and thus moving the characteristic pattern, within the field of view;

(f) performing the same operation as the step (c) so as to obtain the two-dimensional image of the characteristic pattern in the moved position;

(g) storing a coordinate of the stage (Xf, Yf) when the image is obtained in the step (f);

(h) applying a pattern matching between a portion of the image obtained in the step (c) and the image obtained in the step (f) to calculate a displacement between the two images in the X- and the Y-directions ($\Delta X$ pixel, $\Delta Y$ pixel);

(i) calculating a difference between the coordinate (Xc, Yc) stored in the step (c) and the coordinate (Xf, Yf) stored in the step (f), defined by (Xf−Xc) or (Yf−Yc);

(j) calculating a size per pixel, (Xf−Xc)/$\Delta X$ or (Yf−Yc)/$\Delta Y$, or a magnification of a projection optical system;

(k) storing the size per pixel or the magnification of the projection optical system, which has been calculated in the step (j), into a memory;

(l) calculating a moving distance of the stage by using the size per pixel so as to perform the alignment operation;

(m) irradiating the beam toward the surface of the substrate;

(n) detecting the back-scattered beam containing the information of the substrate;

(o) obtaining an image of the substrate from the detected back-scattered beam; and (p) performing an inspection of the substrate by using the obtained image.

According to another aspect of the invention, an apparatus for inspecting a substrate surface is provided, in which a surface of a substrate having a chip formed therein is inspected by using a beam, for aligning of the chips, the apparatus comprising:

a device for placing the substrate so that the chip is positioned within a field of view subject to the inspection;

a measuring device for measuring a magnification for a detection when the chip is positioned within the field of view subject to the inspection;

a calculator for calculating a distance of a position error of the chip based on the measured magnification for the detection; and a compensator for compensating for the position of the chip based on the calculated distance.

According to another aspect of the invention, an apparatus for inspecting a substrate surface is provided, in which a surface of a substrate having a chip formed therein is inspected by using a beam, for placing the substrate so that the chip is positioned within the field of view subject to the inspection, the apparatus comprising:

a measuring device for measuring a magnification for a detection when the chip is positioned within the field of view subject to the inspection;

a calculator for calculating a distance of a position error of the chip based on the measured magnification for the detection;

a compensator for compensating for the position of the chip based on the calculated distance;

a detector for detecting a back-scattered beam containing the information of the surface of the substrate, the back-scattered beam being emanated from the substrate which has been irradiated by the beam after the position of the chip is compensated for; and an image-obtaining device for obtaining an image of the surface of the substrate from the detected back-scattered beam, wherein the obtained image is used to carry out the inspection of the substrate.

According to another aspect of the invention, an apparatus is provided for inspecting patterns within a plurality of dies located approximately regularly along two axial directions that are not parallel with respect to each other on a substrate, the apparatus comprising:

a computing means for generating an equally spaced grid according to which the dies on the substrate should be virtually placed; and a means for compensating for a difference in positions of the dies on the substrate with respect to the target grid.

In the apparatus in accordance with another aspect of the invention, in which the means for compensating for a difference in positions of the dies on the substrate with respect to the target grid may comprise:

a means for computing a position error of the die on the substrate with respect to the target grid; and a control means for feeding back or feeding forward a compensation signal to offset the position error to a deflector.

According to another aspect of the invention, an apparatus for inspecting a sample surface is provided, comprising:

a beam irradiation source for irradiating a beam toward a sample;

a means for measuring a size per pixel on the sample within a beam irradiated region by the beam irradiation source;

a computing means for calculating a travel distance of a stage by using the size per pixel and performing an alignment operation of the sample;

a detector for detecting a secondary beam that has been emanated from the sample by the irradiation of the beam and contains the data on the surface of the sample; and a means for obtaining an image of the surface of the sample from the secondary beam that has been detected by the detector and thereby inspecting the sample.

According to another aspect of the invention, an apparatus for inspecting a surface of a sample having a plurality of dies including patterns formed therein is provided, the apparatus comprising:

a means for obtaining information necessary to compensate for the positions of the dies on the sample surface;

a means for measuring and storing a focusing condition of the sample surface in an arbitrary location within a region subject to the inspection on the sample surface during obtaining the information;

a beam irradiation source for irradiating a beam toward the surface of the sample; and a lens adapted to be adjustable to satisfy the focusing condition of the sample surface when the beam is moved relative to the region subject to the inspection.

The apparatus in accordance with another aspect of the invention may further comprise a deflector for compensating for a position error of the die when the beam is moved relative to the region subject to the inspection.

According to another aspect of the invention, a method is provided for inspecting patterns within a plurality of dies located approximately regularly along two axial directions that are not parallel with respect to each other on a substrate, the method comprising steps of:

(a) generating a target grid according to which the dies on the substrate should be virtually placed;

(b) determining an actual position coordinate of each die on the substrate;

(c) calculating a position error of the each die with respect to the target grid;

(d) compensating for the position of the image of the each die to be obtained, based on a value of the position error of the each die and thus obtaining the image; and (e) performing an inspection of the pattern of the die based on the image obtained after the position thereof is compensated for.

In the step (a) of the method in accordance with another aspect of the invention, the target grid may be generated in such a manner that at least two dies are selected in each of two axial directions from a plurality of dies formed across a surface of the substrate along the two axial directions that are not parallel to each other, and from a pitch between selected dies, a virtual pitch per die is determined along each of the two axial directions, and then based on the virtual pitch, the target grid is generated. Further, in the step (a) of the method in accordance with another aspect of the invention, the target grid may be generated based on position data contained in CAD data. Yet further, in the step (e) of the method in accordance with another aspect of the invention, images of two different dies corresponding to each other may be compared with each other, and a defect may be detected based on a difference obtained from the comparison. Still further, in the step (e) of the method in accordance with another aspect of the invention, the pattern subject to the inspection and the corresponding pattern generated according to the CAD data are compared to each other, and a defect is detected based on a difference obtained from the comparison.

In the step (a) of the method in accordance with another aspect of the invention which depends from another aspect of the invention, the two dies on the sample may be selected to thereby detect a pitch between the dies, which is determined as a first pitch; the first pitch is multiplied by a predetermined multiplier, and the thus obtained value is determined as a second pitch; an actual pitch between two dies that are spaced by a distance proximal to the second pitch is detected, which is determined as a third pitch; and a value determined by dividing the third pitch by the multiplier may be taken as the virtual pitch. Further, in the method in accordance with another aspect of the invention which depends from another aspect of the invention, the two axes that are not parallel with respect to each other may represent the X-axis and the Y-axis that are orthogonal to each other. Further, in the step (a) of the method in accordance with another aspect of the invention, the virtual pitch between dies may be determined by using a dicing line parallel to the X-axis or the Y-axis or a predetermined pattern within the die. Yet further, in the step (d) of the method in accordance with another aspect of the invention, the position compensation for the image may be carried out by a deflector for an electron beam.

According to another aspect of the invention, a method is provided for inspecting a surface of a sample, comprising steps of:

irradiating a beam toward the surface of the sample and measuring a size on the surface of the sample per pixel within the beam irradiated region;

calculating a moving distance of a stage by using the size and performing an alignment operation of the sample based on a result from the calculation; and irradiating the beam onto the sample and detecting a secondary beam that has been emanated from the surface of the sample by the irradiation of the beam and contains the information of the surface of the sample, and thereby inspecting the surface of the sample.

In the method in accordance with another aspect of the invention, the step of measuring the size may be carried out by measuring the number of pixels of a pattern having a known size.

According to another aspect of the invention, a method is provided for inspecting a surface of a sample, comprising steps of:

obtaining information necessary to compensate for a position of a die on the surface of the sample;

measuring and storing a focusing condition of the surface of the sample in an arbitrary location within a region subject to the inspection during obtaining the information;

irradiating a beam onto the sample;

controlling the beam to make a scanning operation or moving a stage so that the beam move relative to the region subject to the inspection on the surface of the sample, while adjusting a lens to satisfy the focusing condition of the surface of the sample; and detecting a secondary beam that has been emanated from the sample by the irradiation of the beam and contains data of the region subject to the inspection, and thereby inspecting the surface of the sample.

In the method in accordance with another aspect of the invention, the step of inspecting the surface of the sample may include a step of obtaining an image of the region subject to the inspection containing a plurality of pixels by using a CCD or a CCD-TDI and then inspecting the surface of the sample by comparing thus obtained image with a reference image. Similarly, in the method in accordance with another aspect of the invention, the step of inspecting the surface of the sample may include a step of obtaining an image of the region subject to the inspection containing a plurality of pixels by using a CCD or a CCD-TDI and then inspecting the surface of the sample by comparing thus obtained image with a reference image. Further, in the method in accordance with another aspect of the invention which depends from another aspect of the invention, the step of inspecting the surface of the sample may be carried out, for an area including patterns within a die defining a cyclic structure, by means of the comparison among the cyclic structures within the same die, but for an area including patterns not defining a cyclic structure, by means of the comparison with the reference image. Yet further, in the method in accordance with another aspect of the invention which depends from another aspect of the invention, the step of inspecting the surface of the sample may be carried out, for an area including patterns within a die defining a cyclic structure, by means of the comparison among the cyclic structures within the same die, but for an area including patterns not defining a cyclic structure, by means of the comparison with the reference image.

According to another aspect of the invention, a method is provided for evaluating a sample surface with an electron beam incident to the sample surface having a plurality of pixels, the method comprising steps of:

(a) irradiating an electron beam onto a sample and detecting secondary electrons or back-scattered electrons;

(b) amplifying and A/D converting a detected signal to thereby form a two-dimensional image containing a density data and inputting the formed image on a predetermined first region into a memory;

(c) forming a two-dimensional image containing a density data on a second region expected to contain the same pattern as of the region whose image has been input in the step (b) and inputting the formed image into another memory;

(d) performing a density matching between the image obtained in the step (b) and the image obtained in the step (c) and then increasing or decreasing the density of one of the two images so as to match the average density between the two images;

(e) performing a pattern matching between the images having the average density matched to each other, calculating a difference between images to which the pattern matching has been applied, and then taking the location having the difference as a candidate for a defect; and (f) obtaining a two-dimensional image of a third region expected to contain the same pattern as the first and the second regions, performing a density matching of the two-dimensional image of the third region with the image of the first or the second region, comparing to the candidate for the defect obtained in the step (e), and determining the defect from the candidate for the defect.

In the method in accordance with another aspect of the invention, the electron beam may be a multi-beam which consists of a plurality of beams arranged such that when the plurality of beams is projected in one axial direction, each beam is equally spaced from adjacent beam, and is adapted to make a scanning operation in a direction orthogonal to the one axial direction, wherein the two-dimensional image may be formed by electrically controlling the multi-beam so as to make the scanning operation while moving a sample stage continuously in the direction parallel to the one axial direction. Further, in the method in accordance with another aspect of the invention, the electron beam may be a beam having a rectangular shape elongated in one axial direction, wherein the beam is controlled to make a scanning operation along a short side direction of the rectangular shape while moving a sample stage continuously along a long side direction of the rectangular shape so as to irradiate the beam onto the sample, and secondary electrons emanated from the sample or back-scattered electrons therefrom are detected as an image by a projection optical system. Yet further, in the step (d) of method in accordance with another aspect of the invention, the density matching may be carried out such that firstly offset values are matched so that the lowest densities of the two images match each other and then a gain is adjusted so as for the highest densities of the two images to match each other.

According to another aspect of the invention, a device manufacturing method is provided, in which a sample in the course of processing or after having been processed is inspected for any defects by using a defect inspection apparatus in accordance with any one of the aspect of the invention.

According to another aspect of the invention, a device manufacturing method is provided, in which a sample in the course of processing or after having been processed is inspected for any defects by using a defect inspection method in accordance with any one of the aspect of the invention.

BRIEF DESCRIPTION OF THE DRAWINGS

FIG. 8($a$) is a diagram showing a field of view of an electron optical system in the electron optical device of FIG. 7 along with a characteristic pattern on a wafer, and FIG. 8(b) is a diagram showing a state where the characteristic pattern on the wafer has been moved within the field of view by shifting the field of view of the electron optical system by a certain distance;

FIG. 9(a) is a diagram showing one method for obtaining a two-dimensional image of the pattern on the wafer surface in the electron optical device of FIG. 7, while FIG. 9(b) is a diagram showing another method for obtaining a two-dimensional image of the pattern on the wafer surface in the electron optical device of FIG. 7;

FIG. 13(a) is a diagram showing a range of field of view of the electron optical system, a positioning of a plurality of electron beams and a characteristic pattern on a wafer during executing a defect inspection by using the electron optical device of FIG. 10, and FIG. 13(b) is a diagram showing a state where the characteristic pattern on the wafer has been moved within the field of view by shifting the field of view of the electron optical system by a certain distance;

FIG. 15 is a diagram for illustrating an inspection of a wafer provided by the defect inspection apparatus shown in FIG. 10 and FIG. 14, wherein FIG. 15(A) shows an entire view of a wafer, while FIG. 15(B) shows an enlarged view of a portion of a die on the wafer;

FIG. 19(A) is a schematic diagram showing a fourth embodiment of a sample inspection apparatus according to the present invention, which employs an electron optical device of multi-optical axis and multi-beam type, and FIG. 19(B) is a plan view of a magnifying lens shown in FIG. 19(A), while FIG. 19(C) is a plan view of an anode shown in FIG. 19(A);

FIGS. 22(A) through 22(D) are diagrams for illustrating an operation of the defect inspection apparatus shown in FIG. 21;

FIG. 39 is another diagram for illustrating the focus mapping in the inspection procedure in the semiconductor device manufacturing method;

FIGS. 40(A) through 40(C) illustrate the focus mapping in the inspection procedure in the semiconductor device manufacturing method;

FIG. 43 is a flow chart showing a lithography process in FIG. 42.

DETAILED DESCRIPTION OF THE INVENTION

An aligning method and a method for inspecting a sample by using the same alignment method according to the present invention will now be described. First of all, with reference to FIGS. 1 through 5, a general configuration of a sample inspection apparatus for embodying the above described method according to the present invention will be explained, said apparatus serving for inspecting a substrate or a wafer having a patterned surface as an object of the inspection for potential defects or the like contained therein. It is to be noted that the following description is directed to an example taking the wafer as the sample.

Figure 1:
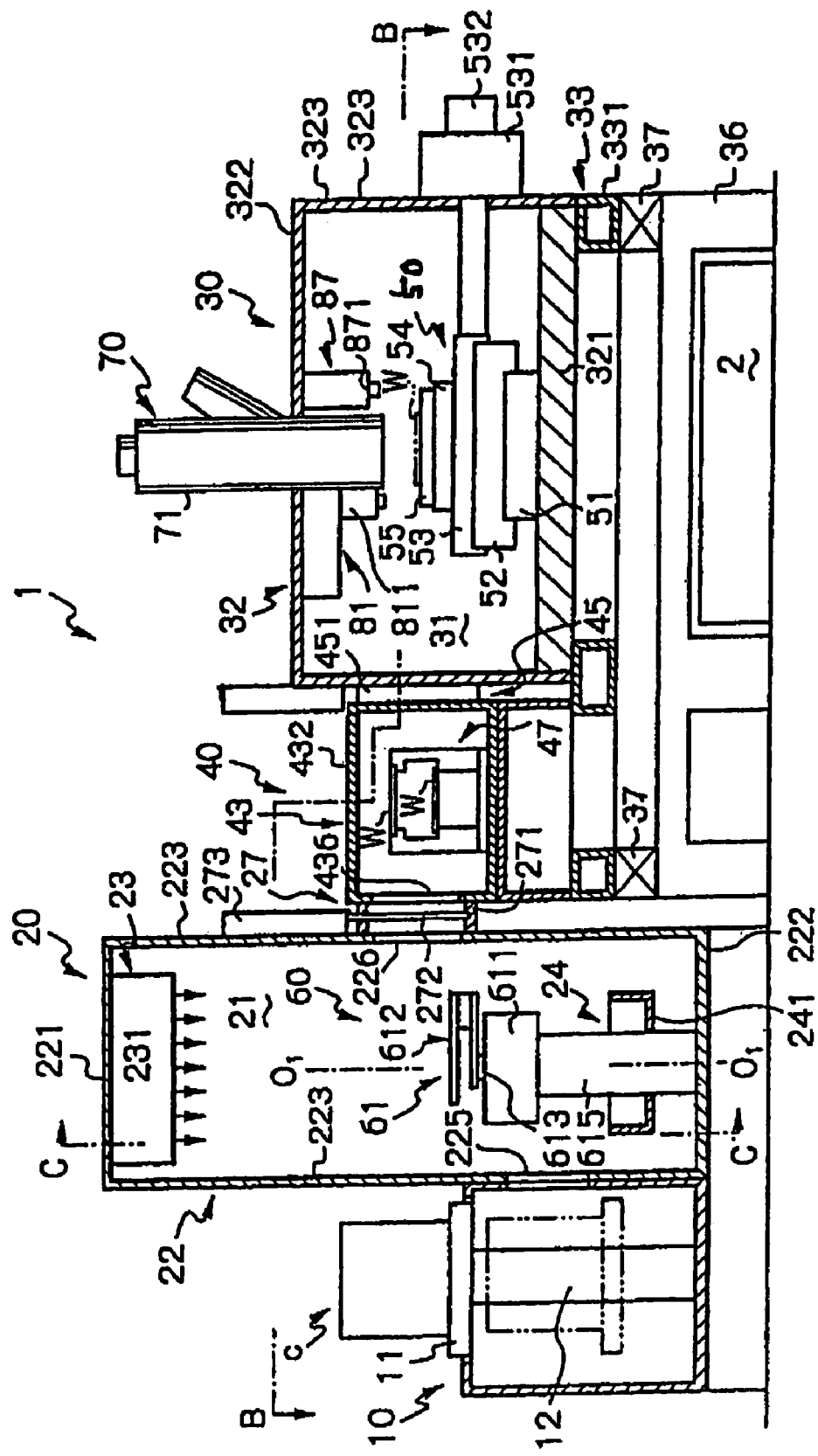
FIG. 1 is an elevational view showing main components of a defect inspection apparatus according to the present invention.
Figure 2:
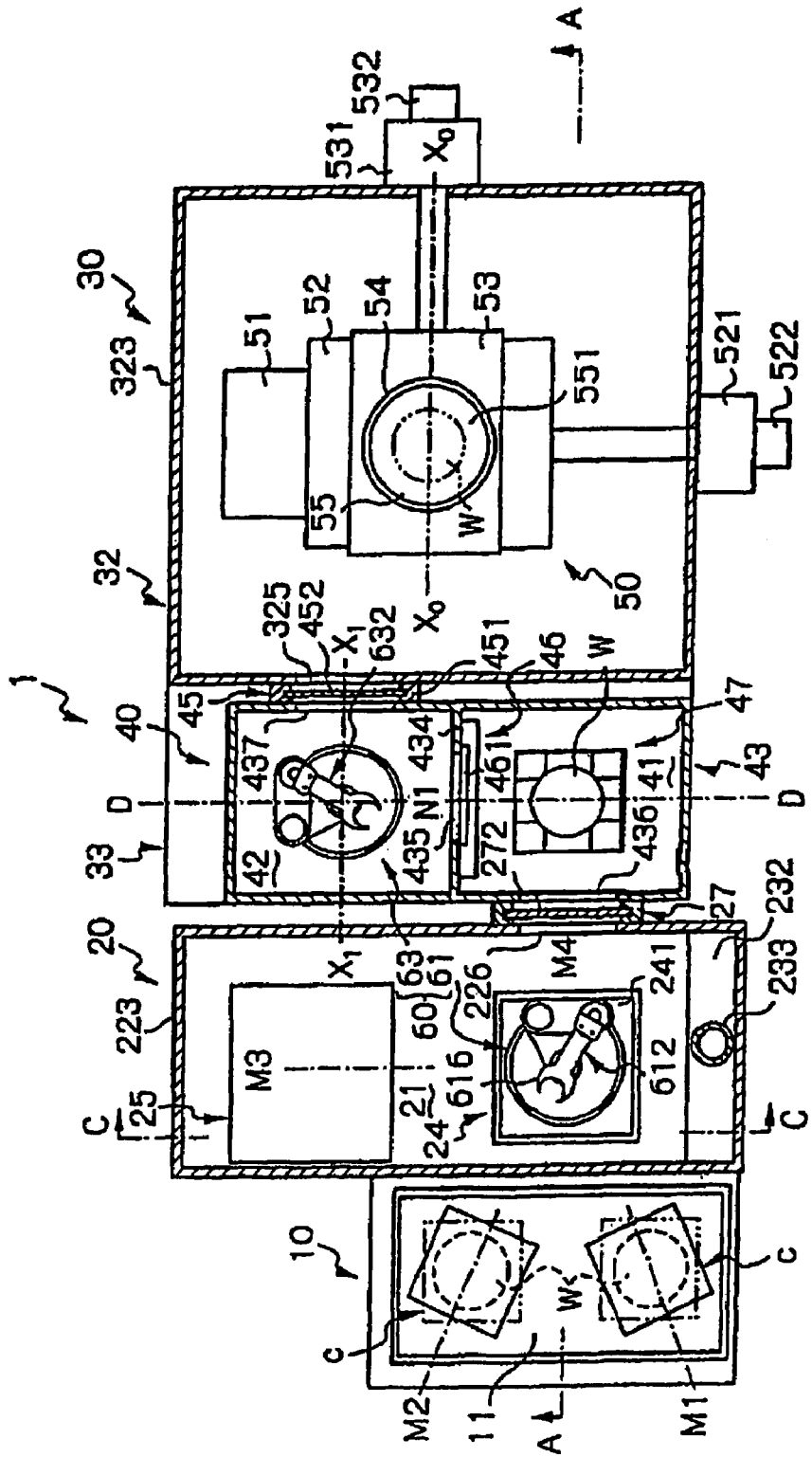
FIG. 2 is a plan view showing main components of a defect inspection apparatus according to the present invention.

In FIG. 1 and FIG. 2, a sample inspection apparatus 1 for inspecting a sample for any defects or the likes comprises: a cassette holder 10 for holding a cassette containing a plurality of wafers "W"; a mini-environment unit 20; a main housing 30 defining a working chamber 31; a loader housing 40 located between the mini-environment unit 20 and the main housing 30 and defining two loading chambers; a loader 60 for picking up the wafer W from the cassette holder 10 and loading it on a stage device 50 located within the main housing 30; and an electron optical device 70 attached to a vacuum housing, all of which are arranged in such a physical relationship as depicted in FIGS. 1 and 2.

The sample inspection apparatus 1 further comprises a pre-charging unit 81 located within the main chamber 30 which is under a vacuum condition; a potential application mechanism 83 for applying a potential to the wafer W (see FIG. 5); an electron beam calibration mechanism 87 (see FIG. 8); and an optical microscope 871 constituting an alignment controller for positioning the wafer W on the stage device 50.

The cassette holder 10 is designed to hold a plurality (two pieces in this embodiment) of cassettes "c" (e.g., a closed cassette, such as FOUP manufactured by Assist Inc.), each containing a plurality (e.g., 25 pieces) of wafers W placed side by side in parallel with each other along the up and down direction. This cassette holder 10 may employ a suitable structure depending on the specific cases selectively such that for a case where the cassette is transferred by a robot or the like and loaded onto the cassette holder 10 automatically, a specific suitable structure therefore may be employed and that for a case where the loading operation is manually carried out, an open cassette structure suitable therefore may be employed.

In this embodiment, the cassette holder 10 has a system for automatically loading the cassette c, and comprises, for example, an lifting table 11 and an lifting mechanism 12 for moving up and down the lifting table 11, wherein the cassette c is set on the lifting table 11 automatically in a state illustrated by the chain line in FIG. 2, and after having been set, the cassette c is rotated automatically into an orientation illustrated by the solid line in FIG. 2 for heading to an axial line of rotational movement of a first transport unit (as will be described later) within the mini-environment unit 20, and then the lifting table 11 is lowered down to the position indicated by the chain line in FIG. 1. The cassette holder used in the case of the automatic loading or the cassette holder used in the case of the manual loading may appropriately employ any known structures, and detailed description of its structure and function should be herein omitted.

The wafers W contained in the cassette c are those subject to the inspection, and such an inspection may be carried out after or in the course of a process for processing the wafer in the series of processes for manufacturing the semiconductor. Specifically, those wafers that have experienced the film-depositing step, the CMP step, the ion implantation step and the like, or those wafers that have been or have not been patterned on the surfaces thereof may be accommodated in the cassette. A plurality of those wafers W are accommodated in the cassette c so as to be spaced in parallel with each other along the up and down direction. For this reason, an arm of the first transport unit (as will be described later) is adapted to move up and down so that the wafer W in a desired position can be held by the first transport unit.

Figure 3:
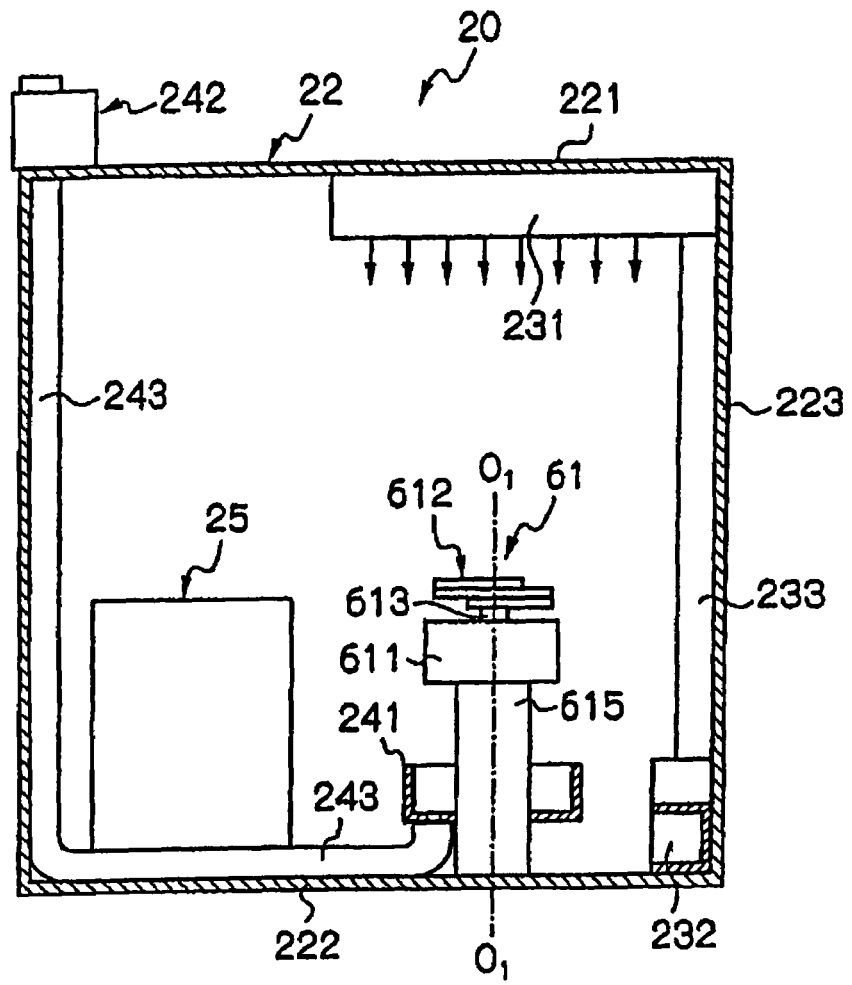
FIG. 3 is a diagram showing a mini-environment unit of a defect inspection apparatus according to the present invention.

In FIGS. 1 through 3, the mini-environment unit 20 comprises: a housing 22 defining a mini-environment space 21 of which atmosphere may be controlled; a gas circulator 23 for providing the atmosphere control by circulating a gas such as a clean air within the mini-environment space 21; an exhausting device 24 for recovering and then exhausting a portion of the air supplied into the mini-environment space 21; and a pre-aligner 25 arranged within the mini-environment space 21 for providing a coarse alignment of the wafer W subject to the inspection.

The housing 22 comprises a top wall 221, a bottom wall 222 and circumferential walls 223 surrounding four circumferential portions so as to provide a structure to separate the mini-environment space 21 from an external environment. In order to provide the atmosphere control of the mini-environment space 21, the gas circulator 23 comprises, as shown in FIG. 3, a gas supply unit 231 which is attached to the top wall 221 within the mini-environment space 21 for cleaning the air and then directing a laminar flow of thus cleaned air right below through one or more gas blowoff openings (not shown); a recovery duct 232 located on the bottom wall 222 within the mini-environment space 21 for recovering the air that has flown down toward the bottom; and a conduit 233 interconnecting the recovery duct 232 and the gas supply unit 231 for returning the recovered air back to the gas supply unit 231.

The laminar flow of the clean air directed downward, or the down flow, is supplied such that it can flow mainly through a conveying surface of the first transport unit 61 located within the mini-environment space 21 to thereby prevent any dust which could be produced by the transport unit 61 from adhering to the wafer W. An access port 225 is formed in a location of the circumferential wall 223 of the housing 22 adjacent to the cassette holder 10.

As shown in FIG. 3, the exhausting device 24 comprises: a suction duct 241 disposed in a location lower than the wafer conveying surface of said transport unit 61 and in the lower portion of the transport unit; a blower 242 disposed external to the housing 22; and a conduit 243 for interconnecting the suction duct 241 and the blower 242. This exhausting device 24 sucks the gas flowing down along the circumference of the transport unit and containing the dust which could be produced by the transport unit, through the suction duct 241, and exhausts that air to the outside of the housing 22 via the conduits 243 and the blower 242.

The pre-aligner 25 disposed within the mini-environment space 21 is designed to detect optically or mechanically an orientation-flat formed in the wafer W (referred to a flat portion formed in an outer periphery of a circular wafer) or one or more V-shaped cut-out or notch formed in an outer peripheral edge of the wafer W, and to provide in advance an alignment of the wafer W in the rotational direction around the axis line $O_1$-$O_1$ of the transfer unit 61 within an accuracy of ±1 degree. The pre-aligner 25 is a constitutional part of a mechanism for determining a coordinate of a subject to be inspected, and takes a role in providing a coarse alignment of the subject to be inspected. Since the pre-aligner 25 may be of any known structure, description of its structure and function should be omitted.

In FIG. 1 and FIG. 2, the main housing 30 defining the working chamber 31 comprises a housing main body 32. The housing main body 32 is supported by a housing supporting device 33 loaded on a vibration insulating device or a vibration isolating device 37 located on a table frame 36 and the housing supporting device 33 comprises a frame structure 331 assembled into a rectangular shape. Thus, the housing main body 32 is disposed and mounted securely onto the frame structure 331. The housing main body 32 comprises a bottom wall 321 loaded on the frame structure 331, a top wall 322 and circumferential walls 323 connected to both of the bottom wall 321 and the top wall 322 to surround four circumferential portions, thereby isolating the working chamber 31 from the outside.

The housing main body 32 and the housing supporting device 33 is assembled in a rigid structure, wherein the vibration isolating device 37 prevents the vibration from the floor on which the table frame 36 is installed from being transmitted to this rigid structure. An access port 325 for taking in and out the wafer is formed in one circumferential wall among those circumferential walls 323 of the housing main body 32, which is adjacent to a loader housing 40.

The working chamber 31 is designed to be held in a vacuum atmosphere by a vacuum device (not shown) having a known structure. A controller 2 for controlling an overall operation of the apparatus is located under the table frame 36. The working chamber 31 is typically held under a pressure in a range of $10^{-4}$ to $10^{-6}$ Pa.

Figure 4:
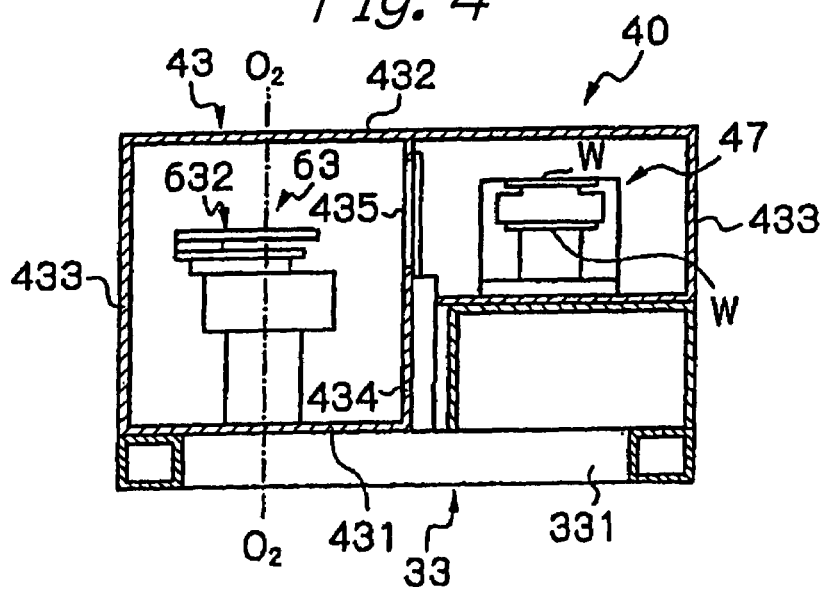
FIG. 4 is a diagram showing a configuration of a loader housing of a defect inspection apparatus according to the present invention.

Referring to FIGS. 1, 2 and 4, the loader housing 40 comprises a housing main body 43 defining a first loading chamber 41 and a second loading chamber 42. The housing main body 43 comprises a bottom wall 431, a top wall 432, circumferential walls 433 surrounding four circumferential portions and a partition wall 434 for separating the first loading chamber 41 and the second loading chamber 42, so that both loading chambers 41 and 42 may be isolated from the external environment. An access port 435 is formed in the partition wall 434 for passing the wafer W between two loading chambers 41 and 42. Further, access ports 436 and 437 are formed in locations of the circumferential walls 433 adjacent to the mini-environment unit 20 and the main housing 30, respectively.

As shown in FIG. 4, since the housing main body 43 of this loader housing 40 is mounted on and supported by the frame structure 331 of the housing supporting device 33, this loader housing 40 is also designed to be protected from any vibrations otherwise transmitted from the floor. The access port 436 of the loader housing 40 and the access port 226 of the housing 22 of the mini-environment unit 20 are aligned and interconnected with each other, and in a connecting point therebetween a shutter system 27 is arranged so as to selectively block the communication between the mini-environment space 21 and the first loading chamber 41.

The access port 437 of the loader housing 40 and the access port 325 of the housing main body 32 are aligned and interconnected with each other, and in a connecting point therebetween a shutter system 45 is arranged so as to selectively seal and block the communication between the second loading chamber 42 and the working chamber 31. Further, the opening 435 formed in the partition wall 434 is provided with a shutter system 46 which selectively blocks the communication between the first and the second loading chambers 41 and 42 by closing or opening a door 461. Those shutter systems 27, 45 and 46 are designed to provide an airtight sealing to each loading chamber when they are in closed positions.

In the first loading chamber 41, a wafer rack 47 is arranged, which holds a plurality, for example two pieces, of wafers W in a horizontal state to be spaced from each other in the up and down direction. The first and the second loading chambers 41 and 42 are adapted to have the atmosphere controlled to be high vacuum condition (in a range of $10^{-5}$ to $10^{-6}$ Pa as a vacuum level) by the aid of a well-known vacuum exhausting device (not shown) including vacuum pump, though not shown. In that case, the first loading chamber 41 may be held in a lower vacuum atmosphere as a low vacuum chamber, while the second loading chamber 42 may be held in a higher vacuum atmosphere as a high vacuum chamber, thereby providing an effective way to prevent the contamination of the wafer W. Employing such a configuration not only can help transfer the subsequent wafer W that is accommodated in the loading chamber and is to be subjected to a defect inspection into the working chamber 31 without delay, but also can help improve the throughput of the defect inspection and further help maintain the vacuum level in the surrounding of the electron beam source, which is required to be held in a high vacuum condition, at as high vacuum conditions as possible.

The first and the second loading chambers 41 and 42 are connected with a vacuum exhausting pipe (not shown) and a vent pipe (not shown) for an inactive gas (e.g., purified dry nitrogen), respectively. With this arrangement, injecting the inactive gas into each loading chamber can prevent an oxygen gas and the like other than the inactive gas from adhering to the surface of each chamber with the aid of the inactive gas vent.

It is to be noted that in a sample inspection apparatus using an electron beam according to the present invention, it is important that a substance represented by lanthanum hexaboride ($LaB_6$) that can be used as an electron beam source of an electron optical device should not be brought into contact with oxygen as much as possible after it is heated up to such a high temperature where the thermal electron is emitted therefrom in order not to reduce a lifetime thereof. As it is, this can be ensured by applying the atmosphere control as described above to the working chamber 31 in which the electron optical device is installed, in a step prior to a transfer operation of the wafer W thereinto.

The stage device 50 comprises: a stationary table 51 located on the bottom wall 321 of the main housing 30; a Y table 52 operatively mounted on the stationary table 51 to be capable of moving in the Y direction (the direction orthogonal to the sheet surface in FIG. 1); an X table 53 operatively mounted on the Y table 52 to be capable of moving in the X direction (the left and right direction in FIG. 1); a turntable 54 capable of rotating on the X table 53; and a holder 55 located on the turntable 54. The wafer W is releasably loaded on a wafer loading surface 551 of the holder 55. The holder 55 may have a known structure allowing for the wafer W to be releasably gripped in a mechanical manner or by an electrostatic chuck system.

The stage device 50 is adapted to provide a highly precise alignment of the wafer W held in the holder 55 on the loading surface 551 with respect to the electron beam irradiated from the electron optical device in the X direction, Y direction and Z direction (i.e., the up and down direction in FIG. 1) as well as in the rotational direction around the axial line orthogonal to the supporting surface of the wafer W (i.e., in the θ direction), by actuating the plurality of tables 51 to 54 described above using a servo motor, an encoder and a variety of sensors (not shown).

It is to be noted that the positioning of the wafer W in the Z direction may be achieved by, for example, making the position of the loading surface 551 on the holder 55 to be fine-tunable. In these operations, a reference position of the loading surface 551 is detected by a position measuring device employing laser having very fine diameter (laser interference range finder using a principle of interferometer) and said position is controlled by a feedback circuit (not shown) and in association with or instead of the above control, the position of the notch or the orientation-flat of the wafer is measured to detect a position within a plane and a rotational position of the wafer with respect to the electron beam, and the turntable is rotated by, for example, a stepping motor capable of fine angle controlling so as to control the position of the wafer. In order to prevent or minimize, any production of dust within the working chamber 31, the servo motors 521 and 531 and the encoders 522 and 532 for the stage device 50 are disposed external to the main housing 30. It is to be noted that the reference can be set for the signal obtained by inputting in advance the rotational position and/or the position in the X- and the Y-directions of the wafer W with respect to the electron beam to a signal detecting system or an image processing system, both of which will be described later.

The loader 60 comprises a first transport unit 61 of a robot system located within the housing 22 of the mini-environment unit 20 and a second transport unit 63 of a robot system located within the second loading chamber 42. The first transport unit 61 has a multi-joint arm 612 capable of rotating around an axial line $O_1$-$O_1$ with respect to a driving section 611. The multi-joint arm may employ any arbitrary structure, and in the illustrated embodiment, the arm 612 includes three parts operatively joined so as to be movable rotationally with respect to each other. A first part of the arm 612 of the first transport unit 61, which is one of the three parts located in the closest position to the driving section 611, is attached to a shaft 613 which may be driven to rotate by a driving mechanism of known structure (not shown) arranged in the driving section 611. The arm 612 can rotate around the axial line $O_1$-$O_1$ with the aid of the shaft 613, while it can be extended or contracted in the radial direction with respect to the axial line $O_1$-$O_1$ as a whole unit by a relative rotation among the parts. A tip portion of a third part of the arm 612, which is one of those parts located in the uppermost position, is provided with a gripping device 616 for gripping the wafer W, which is implemented by a mechanical, electrostatic or other type chuck of known structure. The driving section 611 is allowed to move in the up and down direction by an lifting mechanism 615.

In operation, the arm 612 of the first transport unit 61 is extended toward either one of the directions for M1 and for M2 between those for two cassettes c held in the cassette holder, and one piece of wafer W accommodated in the cassette c is placed onto the arm or gripped by the chuck (not shown) attached to the tip portion of the arm 612, so as to be taken out of it. After that, the arm 612 is contracted into the state shown in FIG. 2, and then is rotated to and stopped at a position from which it can be extended toward the direction M3 for the pre-aligner 25. As it is, the arm is again extended so as to place the wafer W held by the arm 612 onto the pre-aligner 25. The arm 612, after the pre-aligner 25 having applied a fine-tuning of the orientation of the wafer W, receives the wafer W from the pre-aligner 25 and then the arm 612 is further rotated to and stopped at a position in which the arm is allowed to be extended toward the first loading chamber 41 in the direction M4, where it is extended so as to hand over the wafer W to a wafer receiver 47 within the first loading chamber 41.

It is to be noted that in a case of gripping the wafer W mechanically, preferably a circumferential edge region defined by a range within about 5 mm from the circumferential edge of the wafer W should be gripped. This is because the wafer W is in its inner surface entirely patterned with devices such as circuit wirings only excluding the circumferential edge region, and accordingly gripping of the wafer W in that patterned region could cause a breakage of the device and a defect therein.

The second transport unit 63 has basically the same structure as the first transport unit 61, but it is operable so that the transfer operation of the wafer W is performed between the wafer rack 47 and the loading surface 551 of the stage device 50.

In said loader 60, the first and the second transport units 61 and 63 carry out the transfer operation of the wafer W as it is held in the horizontal state from the cassette c held by the cassette holder 10 onto the stage device 50 located within the working chamber 31 and vice versa. The up and down motions of the arms 612 and 632 of the transport units 61 and 63 are limited only to the steps where the wafer W is taken out of or inserted into the cassette c, where the wafer W is placed on or taken out of the wafer rack 47, and where the wafer W is placed on or taken out of the stage device 50. Therefore, even the transfer of such a large wafer W having a 30 cm diameter, for example, can be carried out smoothly.

The transfer operations of the wafer W from the cassette c carried by the cassette holder 10 onto the stage device 50 located in the working chamber 31 will now be described in order with reference to FIGS. 1 through 4. As for the cassette holder 10, a suitable structure may be selectively employed therefore, as already set forth, depending on particular cases, including one for the manual setting of the cassette and another for the automatic setting of the cassette. Once the cassette c is set on the lifting table 11 of the cassette holder 10, the lifting table 11 is lowered by the lifting mechanism 12 and the cassette c is aligned with the access port 225.

When the cassette c is aligned with the access port 225, the cover (not shown) arranged in the cassette c is opened, and at the same time, a cylindrical cover is disposed between the cassette c and the access port 225 so as to block the interior of the cassette c and the space inside of the mini-environment unit 21 from the external environment. It is to be noted that in the case where the shutter system for opening and closing the access port 225 is arranged in the mini-environment unit 20, that shutter system should be actuated to open and close the access port 225.

The arm 612 of the first transport unit 61 has been stopped as it is oriented to either of the direction M1 or M2. Assuming that it has stopped as oriented to the direction of M1, when the access port 225 is opened, the arm 612 is extended through the access port 225 to receive one of the wafers W accommodated in the cassette c by its tip portion. Once the receiving operation of the wafer W by the arm 612 is completed, the arm 612 is contracted and, if said shutter system is installed, said shutter system is actuated to close the access port 225. Then, the arm 612 is rotated around the axial line $O_1$-$O_1$ and stopped in a position allowing for the arm 612 to be extended toward the direction M3, where the arm 612 is extended and places the wafer W loaded on its tip portion or gripped by the chuck onto the pre-aligner 25, which in turn determines the orientation of the rotational direction of the wafer W, or the direction around the central axis line orthogonal to the wafer plane, to be set within a specified range.

Once the alignment operation has been completed, the first transport unit 61, after having received the wafer W from the pre-aligner 25 onto the tip portion of the arm 612, contracts its arm 612 and takes a posture ready to extend the arm 612 toward the direction M4. Then, the door 272 of the shutter system 27 is moved to open the access ports 226 and 436, so that the arm 612 is extended into the first loading chamber 41 and loads the wafer W into the upper step side or the lower step side of the wafer rack 47. It is to be noted that, as described above, before the shutter system 27 goes into the open position to allow the wafer W to be transferred to the wafer rack 47, the opening 435 defined in the partition wall 434 would have been closed to be airtight by the door 461 of the shutter system 46.

In the course of transfer operation of the wafer W by the first transport unit 61, clean air flows down in a laminar flow as the down flow from the gas supply unit 231 arranged in the upper side of the housing 22 of the mini-environment unit 20 so as to prevent the dust from adhering to the top surface of the wafer W during its transfer operation. A portion of the air in the surrounding of the transport unit 61 is sucked through the suction duct 241 of the exhausting device 24 and exhausted to the outside of the housing. This is because a portion of the air supplied from the supply unit 231, for example, about 20% thereof, is mainly contaminated air. The remaining portion of the air is recovered via the recovery duct 232 disposed in the bottom of the housing 22 and returned back to the gas supply unit 231.

Once the wafer W has been loaded in the wafer rack 47 within the first loading chamber 41 by the first transport unit 61, the shutter system 27 is actuated into the closed position to close the loading chamber 41. Subsequently, the first loading chamber 41 is filled with an inactive gas to purge the air, and after that said inactive gas is also exhausted to bring the interior of the loading chamber 41 into the vacuum atmosphere. The vacuum atmosphere of the first loading chamber 41 may be set at a low vacuum level.

Once a certain degree of vacuum has been obtained in the loading chamber 41, the shutter system 46 is actuated to open the access port 435, which has been closed to be airtight by the door 461, and the arm 632 of the second transport unit 63 is then extended into the first loading chamber 41 and receives one piece of wafer W from the wafer receiver 47 by placing it on the tip portion of the arm 632 or by gripping it by the gripping device, such as a chuck, installed in the tip portion of the arm 632. After the receiving operation of the wafer W having been completed, the arm 632 is contracted, and the shutter system 46 is again actuated to close the access port 435 by the door 461.

It is to be noted that before the shutter system 46 is actuated into the open position, the arm 632 takes a posture ready to extend toward the direction N1 for the wafer rack 47, and further, the access ports 437 and 325 have been closed by the door 452 of the shutter system 45 to block the communication between the second loading chamber 42 and the working chamber 31 in the airtight condition. Once the access port 435 and the access ports 437 and 325 have been closed, the second loading chamber 42 is vacuum evacuated and ultimately brought into the vacuum at a higher vacuum level than that in the first loading chamber 42.

During this vacuum evacuation of the second loading chamber 42, the arm 632 of the second transport unit 63 is rotated to a position in which it is allowed to extend toward the stage device 50 in the working chamber 31. On one hand, in the stage device 50 within the working chamber 31, the Y table 52 is moved until the centerline $X_0$-$X_0$ of the X table 53 approximately comes into alignment with the X-axis line $X_1$-$X_1$ crossing the rotational axial line of the second transport unit 63, while at the same time the X table 53 is moved to a position closest to the loader housing 40 and stands by in this state. When the second loading chamber 42 has been brought into the approximately same level of vacuum condition as the working chamber 31, the door 452 of the shutter system 45 is actuated to open the access ports 437 and 325, and the arm 632 is extended into the working chamber 31, such that the tip portion of the arm 632 holding the wafer W comes near to the stage device 50 in the working chamber 31 and then places the wafer W on the loading surface 551 of the stage device 50. When the loading operation of the wafer W has been completed, the arm 632 is contracted, and the shutter system 45 closes the access ports 437 and 325.

The stage device 50 comprises a mechanism for applying an negative-bias potential (or a retarding potential) to the wafer W. This is a mechanism intended to avoid a failure such as discharging due to a short circuit by way of setting the arm 632 in a potential similar or proximal to the potential level of the stage device 50 or in a floating potential during the arm 632 going to the stage device 50 to pick up or to place the wafer W from or onto the stage device 50. It is to be noted that during transferring of the wafer W onto the stage device 50, the bias potential applied to the wafer W may be turned off.

In controlling of the bias potential, the potential may be turned off until the wafer is transferred to the stage and it may be turned on after the wafer has been transferred to and placed on the stage so as to apply the bias potential. The timing of the application of the bias potential may be controlled by a tact time that has been determined in advance to apply the bias potential, or otherwise by a sensor which detects that the wafer has been placed on the stage and transmits a detection signal as a trigger to apply the bias potential. Further, the closing operation of the access ports 437 and 325 by the shutter system 45 may be detected so as to use the detection signal as the trigger to apply the bias potential. Yet further, in case of using the electrostatic chuck, the chucking operation by the electrostatic chuck may be detected so as to use the detection signal as the trigger to apply the bias potential.

Figure 5:
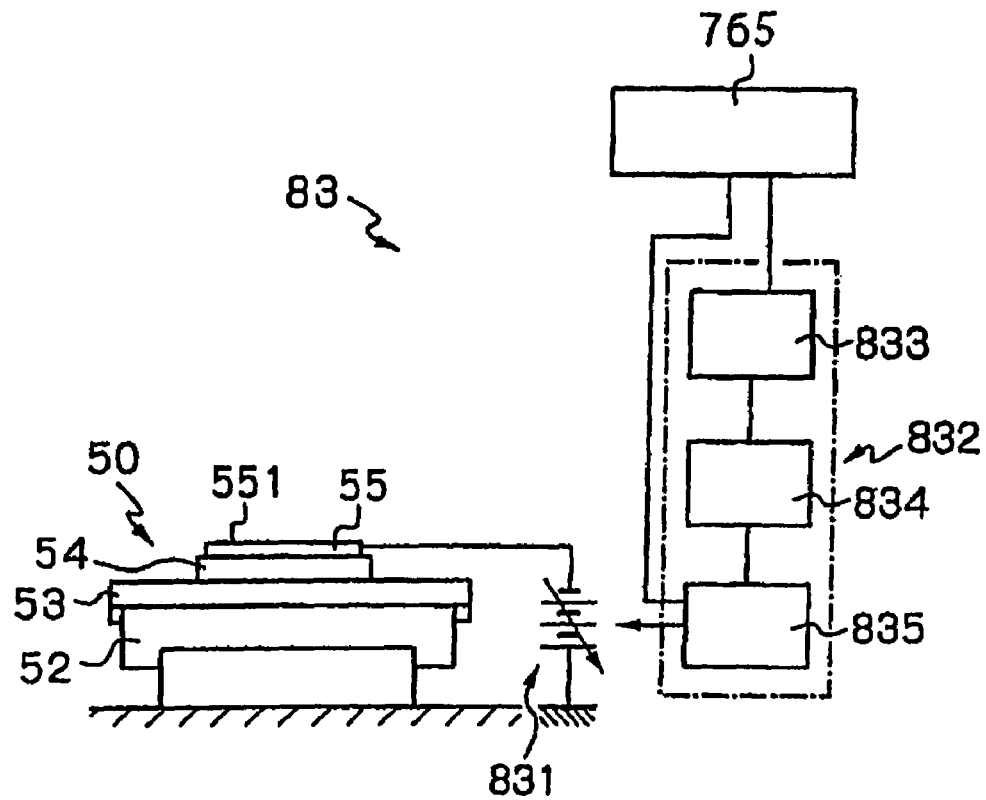
FIG. 5 is a diagram showing a potential applying mechanism in a defect inspection apparatus according to the present invention.
Figure 6:
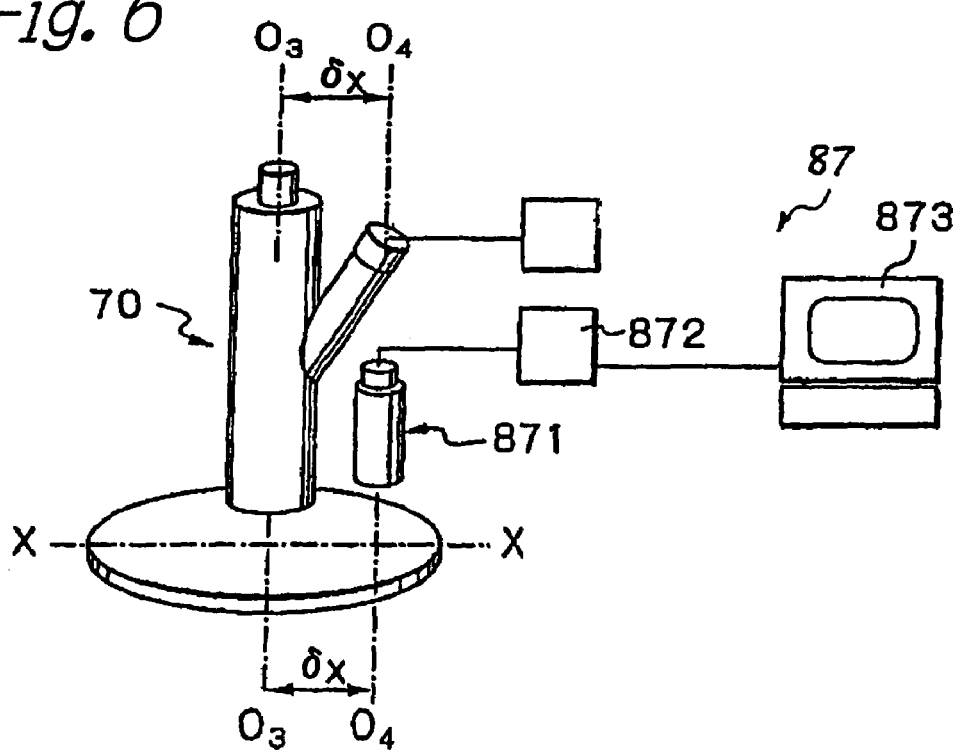
FIG. 6 is a schematic diagram showing a configuration of an electron beam calibration mechanism in a defect inspection apparatus shown in FIG. 1.

FIG. 5 shows a mechanism 83 installed in the stage device 50 to apply the negative-bias potential (retarding potential) to the wafer W. This potential application mechanism 83 is intended to control the generation of the secondary electrons by applying the potential in a range of ±some V to the platform 551 of the stage on which the wafer W is placed, based on the fact that the secondary electron data emanated from the wafer W (the generation rate of secondary electron) depends on the potential of the wafer W. Further, this potential application mechanism 83 also provides a function for decelerating the original energy of the irradiating electrons so as to irradiate the wafer W with the irradiating electron energy in a range of about 100 to 500 eV.

The potential application mechanism 83 comprises, as shown in FIG. 5, a voltage applying device 831 electrically connected to the loading surface 551 of the stage device 50, and a charge-up check and voltage determination system (hereinafter, referred to as a check and determination system) 832. The check and determination system 832 comprises a monitor 833 electrically connected to an image forming section 765 in a detecting system of the electron optical device 70, which will be described later, an operator 834 connected to the monitor 833 and a CPU 835 connected to the operator 834. The CPU 835 supplies a signal to the voltage applying device 831. The potential application mechanism 83 is designed to look for a potential that is not likely to charge the wafer subject to the inspection and applies that potential.

One method for inspecting the wafer W for any electrical defects may take advantage of the fact that the voltage of the portion to be electrically insulated in a normal condition varies when it is brought into conducting state. This may be achieved by a procedure in which firstly, charges are added in advance to the wafer W to thereby produce a voltage difference between one portion which is to be electrically insulated in a normal condition and has been kept actually in the normal condition and the other portion which is to be electrically insulated in the normal condition but has been brought into the conducting state by some reasons; secondly, the data containing the voltage difference is obtained by irradiating the electron beam to these portions; and then the thus obtained data is analyzed to detect that the latter portion has been actually in the conducting state.

The operations during a process for transferring the wafer W in the cassette c onto the stage device have been described, and in the process for returning the wafer W, which has been placed on the stage 50 and finished with a predetermined processing, from the stage device 50 back into the cassette c, the operations as described above should be performed in the inverse sequence. Further, since the first transfer unit 61 can transfer the wafer W between the cassette c and the wafer rack 47 while the second transfer unit 63 is transferring another wafer W between the wafer rack 47 and the stage device 50 so as to keep the a plurality of wafers loaded in the wafer rack 47, the inspection process can be progressed efficiently.

The pre-charge unit 81 is arranged within the working chamber 31 in a location adjacent to an optical column 71 of the electron optical device 70, as shown in FIG. 1. The present inspection apparatus employs such a system in which a device pattern or the like formed in the surface of the wafer W is inspected by irradiating the electron beam and scanning thereby the wafer W as an object to be inspected. Accordingly, in operations, the data of the secondary electrons generated by the irradiation of the electron beam are collected as the data of the wafer surface, wherein depending on the material of the wafer, energy of the irradiated electrons and so on, the wafer surface may be occasionally charged, or charged-up. In this regard, the wafer surface may possibly have some regions that would be charged intensively and other regions that would be charged moderately. If the wafer surface is not evenly charged, then the secondary electron data should be uneven, inhibiting the accurate data from being obtained. To prevent unevenness, the pre-charge unit 81 having a charged particle irradiating section 811 is provided. In order to eliminate the uneven charging, prior to the irradiation of the electrons for the inspection onto a predetermined location on the wafer W to be inspected, charged particles are irradiated from the charged particle irradiating section 811 of the pre-charge unit 81. The charge-up of the wafer surface can be detected by forming in advance an image of the wafer surface to be detected and making an evaluation on said image, and based on the detection result, the pre-charge unit 82 may be actuated. In the pre-charge unit 81, the primary electron beam may be irradiated in its out-of-focus condition.

The defect inspection apparatus 1 shown in FIG. 1 comprises an alignment controller 87. This alignment controller 87 is implemented with an apparatus for aligning the wafer W with respect to the electron optical device 70 by using the stage device 50, and it can provide the controls, as shown in FIG. 8, including a coarse aligning of the wafer W by a wide field observation of the wafer W using an optical microscope 871 in a lower magnification than that used in the electron optical device 70, an aligning of the wafer W in a high magnification by using an electron optical system of the electron optical device 70, a focal adjusting, an inspected region setting, a pattern alignment and the like. The reason the optical system is used to inspect the wafer W in the low magnification is that it is required in order to execute the inspection of the pattern of the wafer W automatically that the alignment mark should be detected easily by the electron beam when the pattern of the wafer W is observed by using the electron beam to thereby make a wafer alignment.

Preferably, the optical microscope 871 is operatively installed within the main housing 32 so as to be movable, and a light source (not shown) for actuating the optical microscope 871 is also disposed within the main housing 32. The electron optical system for providing the observation in the high magnification may share the electron optical systems in the electron optical device 70, or a primary optical system 701 and a secondary optical system 702. To make an observation in the low magnification for the point subject to the observation on the wafer W, the X-stage 53 of the stage device 50 is moved in the X-direction to bring the point subject to the observation on the wafer into the field of view of the optical microscope 871. The optical microscope 871 is used to look at the wafer W through a wide field of view, and the position on the wafer, which is to be observed, is indicated on a monitor 873 via a CCD 872, based on which the point of observation can be determined approximately. In this case, the magnification of the optical microscope 871 may be progressively changed from low to high.

Then, the stage device 50 is moved by a distance corresponding to a spacing δx between an optical axis $O_3$-$O_3$ of the electron optical device 70 and an optical axis $O_4$-$O_4$ of the optical microscope 871 to thereby bring the point on the wafer W subject to the observation, which has been previously determined with the optical microscope 871, into the position in the field of view of the electron optical device 70. In this case, since the distance δx between the axial line $O_3$-$O_3$ of the electron optical device 70 and the optical axis $O_4$-$O_4$ is known beforehand, only moving the point subject to the observation by the distance δx can bring it into the position for visual recognition by the electron optical device 70. It is to be noted that although in this illustration the electron optical device 70 and the optical microscope 871 are spaced from each other only along the X-axial line, they may be spaced both along the X- and the Y-axial directions. After the point subject to the observation is transferred into the visual recognition point of the electron optical device 70, the SEM image of the point subject to the observation is taken by the electron optical systems of the electron optical device 70 in the high magnification, and said image may be stored and/or may be indicated in a monitor via a camera unit.

In this way, after the point on the wafer W subject to the observation is indicated on the monitor by the electron optical system in the high magnification, a misalignment of the wafer W in the rotational direction with respect to the revolving center of the turntable 54 of the stage device 50, or a misalignment δθ of the wafer W in the rotational direction around the optical axis $O_3$-$O_3$ of the electron optical system, is detected by using a known method, and also a misalignment of a predetermined pattern in the X- and the Y-axial directions with respect to the electron optical device 70 is detected. Based on thus obtained values of detection as well as separately obtained data of the inspection mark formed in the wafer W or the set of data concerning to the geometry of the pattern of the wafer W and the like, the operation of the stage device 50 is controlled to provide the alignment of the wafer W.

With understanding of the above explanation, some preferred embodiments of the electron optical device 70 used in the defect inspection apparatus according to the present invention will now be described.

Figure 7:
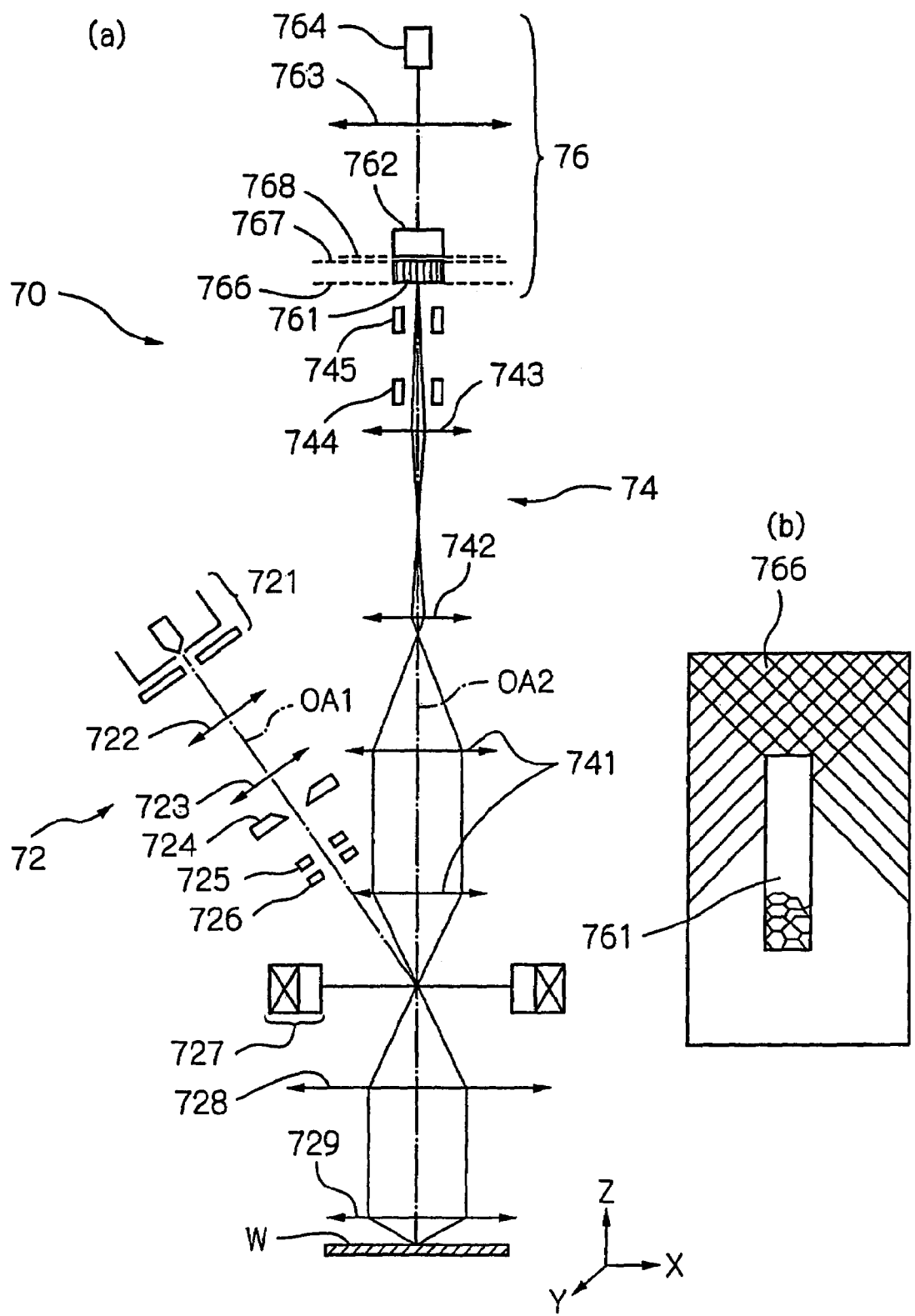
FIG. 7($a$) is a schematic diagram showing a projection type electron optical device of a sample inspection apparatus, with which an alignment method and a defect inspection method using said aligning method according to the present invention can be implemented, and FIG. 7($b$) is a pattern diagram showing a mesh for making an electric field uniform.

FIG. 7 schematically shows a configuration of the electron optical device 70 in the apparatus 1 for inspecting a wafer or a semiconductor, of FIG. 1, and this electron optical device 70 is used to implement a method for aligning a wafer according to the present invention, and the same method is in turn used to implement a sample inspection method for inspecting a sample, such as a wafer, for any defects. With reference to FIGS. 7 through 9, preferred embodiments of the wafer aligning method as well as the sample inspection method using the same wafer aligning method according to the present invention will now be described.

In FIG. 7, the electron optical device 70 is represented by the one of image projection-type, which comprises: a primary electron optical system (hereinafter, referred to as a primary optical system) 72 that makes an electron beam emitted from an electron gun into an elliptical or rectangular shape (e.g., a rectangle) and irradiates thus shaped electron beam onto a surface of a wafer W, such as a chip, to be inspected; a secondary electron optical system (hereinafter, referred to as a secondary optical system) 74 that guides secondary electrons emanated from the wafer W, or back-scattered electrons therefrom, along an optical axis B different from an optical axis A of the primary optical system 72; and a detecting system 76 that receives the secondary electrons or the back-scattered electrons from the secondary optical system 74, form an optical image of the wafer W and converts said optical image into an electric signal.

The primary optical system 72 comprises: an electron gun 721 having a thermionic emission cathode (LaB$_6$ cathode) for emitting an electron beam; lenses 722 and 723 for focusing the electron beams; a shaping aperture 724 for shaping the focused electron beam into an electron beam having a predetermined cross section; and deflectors 725 and 726, all of which are disposed in this order with the electron gun 721 in the topmost location along an optical axis OA1 having a certain angle with respect to a direction normal to the surface of the wafer W, as shown in FIG. 7. The primary optical system 72 further comprises: an E×B separator 727 for deflecting the electron beam into a direction normal to the wafer W by a field created by an electric field and a magnetic field each crossing at a right angle from each other as well as for separating the secondary electrons emanated from the sample or the back-scattered electrons therefrom; and two doublet-type objective lens sets 728 and 729, which are disposed in this order along a direction normal to the surface of the sample.

The secondary optical system 74 serves for guiding the secondary electrons or the back-scattered electrons from the wafer W, which have been separated by the E×B separator 727, along the optical axis OA2 normal to the wafer W into the detecting system 76, and it comprises: a doublet-type lens set 741 for magnifying the secondary electrons or the back-scattered electrons; magnifying lenses 742 and 743; and deflectors 744 and 745.

The detecting system 76 comprises: a MCP (Micro-Channel Plate) 761; a FOP (Fiber Optical Plate) 762 with a scintillator applied on its lower surface for converting the secondary electrons or the back-scattered electrons into an image of light; an optical lens 763; and a TDI detector 784. It is to be noted in FIG. 7 that reference numeral designates a mesh serving for making an electric field in a front surface of the MCP 7761 uniform, which is designed as shown in FIG. 7(*b*). In addition, reference numerals 767 and 768 designate meshes, respectively, for making an electric field between the MCP 761 and the FOP 762 uniform. A configuration and an operation of the detecting system 76 are well known and a detailed description thereof should be omitted. The MCP 761 and the TDI detector 763 together constitute the image forming section 765, which has been previously mentioned.

In the electron optical device 70 having the above-described configuration, the electron beam emitted from the electron gun 721 is focused by the lenses 722 and 723 and irradiated evenly onto the shaping aperture 724. The shaping aperture 724 provides an appropriate shaping operation so that the cross-section of the electron beam from the electron gun 721 viewed in the direction normal to the optical axis OA1 may be rectangular shape (e.g., the rectangle) and also that the irradiation density may be constant within the field of view "V" consisting of 512 pixels in the Y-direction and 2048 pixels in the X-direction as shown in FIG. 8(*a*).

The rectangular-shaped electron beam is transmitted through the deflector 725, 726, deflected by the E×B separator 727 toward the direction normal to the surface of the wafer W and then controlled by the objective lenses 728 and 729 so as to irradiate the wafer W, specifically the field of view V thereon. The secondary electrons emanated from the wafer W or the back-scattered electrons therefrom by the irradiation of the rectangular electron beam are focused by the objective lenses 729 and 728 into an image on a deflection principal plane of the E×B separator 727, thus to form an enlarged image. The secondary electrons or the back-scattered electrons that have been formed into the image are magnified sequentially by the doublet lens 741 and the magnifying lenses 742 and 743 and then introduced into the detecting system 76. The secondary electrons or the back-scattered electrons thus introduced into the detecting system 76 are focused into an image and amplified on the MCP 761, and converted by the scintillator into the signal of light, which are in turn formed into an image of the wafer W. This image is transmitted via the FOP 762, contracted by the optical lens 763 and then detected by the TDI detector 764 as a two-dimensional image.

Then a description will now be directed to a method for measuring a magnification of the secondary optical system 74 in the electron optical device 70 of image projection-type shown in FIG. 7. A first method for measuring the magnification may be implemented by using a Faraday cup, in which the magnification can be determined as R/r when an image obtained by scanning a hole having a known size of Faraday cup, R, disposed in a corner of the stage device 50, on which the wafer W is loaded, is equivalent to the number of pixels, r. That is, when an image of a structure having a previously known actual size, for example, the image of the Faraday cup, is taken, and the number of pixels contained in the image of said structure is counted, an actual size per pixel can be found, from which the magnification can also be determined.

Another method for measuring the magnification employs a laser interferometer to take an actual measurement of a travel distance of the stage, which may be performed in accordance with the following sequence. It is to be noted that the unit including the tables 52, 53 and 54 and the holder 55 is generally referred to as the stage.

(a) The stage is moved so that a dicing line at a corner of the wafer W or a characteristic pattern (e.g., an L-shaped or cross-shaped pattern) "R" on the wafer W may be brought into the field of view "V" of the electron optical system (FIG. 8(*a*)).

(b) The rectangular beam (not a square beam but an oblong beam, in the illustrated embodiment) is irradiated, and the back-scattered electrons or the secondary electrons from the wafer W are detected to obtain the two-dimensional image.

(c) The coordinate of the stage (Xc, Yc) at the time when the two-dimensional image is obtained in the above step (b) is read by the laser interferometer and stored.

(d) The stage and thus the characteristic pattern R on the wafer W are moved by a certain distance in the X-direction within the field of view V (FIG. 8(*b*)), so that the characteristic pattern R, from which said two-dimensional image has been obtained, may be observed in a marginal location of the field of view V.

(e) An operation similar to the step (b) is performed at the position to which the stage has been moved, and the two-dimensional image of the characteristic pattern R in the position to which it has been moved is taken.

(f) The coordinate of the stage (Xf, Yf) at the time when the image is taken in the step (e) is read by the laser interferometer and stored.

(g) A pattern matching is applied between a portion of the two-dimensional image taken in the position of said step (b) and the two-dimensional image taken in the position of said step (e) to thereby calculate a distance of offset between said two images in the X- and the Y-directions (ΔX pixels, ΔY pixels).

(h) Further, a difference between the coordinate (Xc, Yc) stored in said step (c) and the coordinate (Xf, Yf) stored in said step (f), which is defined by (Xf−Xc)nm or (Yf−Yc)nm, is calculated.

(i) From said calculated value, a size per pixel (Xf−Xc)/ΔX (nm/pixel) or (Yf−Yc)/ΔY (nm/pixel) is calculated. This size per pixel defines the magnification.

(j) The size per pixel calculated in said step (i) is stored in a memory.

(k) The steps as defined in said (a) through (j) are performed on the patterns in at least two locations within the surface of the wafer W, and the magnification is determined by the pattern matching between respective two-dimensional images that have been obtained.

(l) The determined magnification is then used to clarify a relationship among the arrangement of the patterns, the rotation of the stage coordinate, the pattern coordinate, the distance between the patterns and the field of view of the electron optical system on the basis per pixel or per actual size and thus to make an aligning operation so that the X- and the Y-axial directions of the wafer W may be aligned with the scanning direction of the electron beam.

A specific aligning method will now be described. After the aligning operations having been applied sequentially in accordance with the above steps (a) to (l), the wafer W is inspected for any defects in the procedure as defined in the following steps (m) to (q).

(m) The surface of the wafer W subject to the inspection is scanned by the electron beam with the aid of the combination of continuous movement of the stage and/or the scanning operation of the electron beam, and a two-dimensional image of the pattern in the inspected surface of the wafer W is obtained from the secondary electrons emanated from the wafer W or the back-scattered electrons therefrom.

(n) The two-dimensional image obtained in said step (m) is divided into a predetermined number of regions (into units of cell region) and stored in a memory.

(o) The operations defined in the above steps (m) and (n) are repeated.

(p) From the two-dimensional images that have been divided into the predetermined number of regions and stored, those two-dimensional images for the regions (cells) at different locations within the same chip in the inspected surface of the wafer W, which are expected to contain the identical patterns to each other, are selected and compared (cell-to-cell inspection) so as to calculate to find a candidate for a defect.

(q) The two-dimensional image of the region in a different chip on the sample surface, which is expected to contain the same pattern, is compared with the image of the either one of the regions taken in the operation (p) (chip-to-chip inspection) so as to determine the defect from said candidates for a defect.

In the above steps (l) to (p), a defect inspection result may be derived through the image comparison with reference to the size per pixel stored in the memory in the above step (j).

Turning now to FIGS. 9(a) and 9(b), the scanning operation on the wafer W in the above step (m) will be described. Assuming that the region on the wafer W, on which the image is taken in one time of continuous movement of is the stage, is referred to as a stripe "ST", the method for scanning the surface of the wafer W subject to the inspection can be performed by either of the following two methods: a first one as shown in FIG. 9(a), in which the longer side of the rectangular electron beam is defined to be equal to the width of the stripe ST (e.g., the longer side of the electron beam is oriented to the X-direction of the stripe ST), and the two-dimensional image of the pattern on the surface subject to the inspection is obtained while continuously moving the stage in the Y-direction; and a second one as shown in FIG. 9(b), in which the longer side of the electron beam is oriented to align with the direction of the continuous movement of the stage (i.e., the Y-direction), the two-dimensional image is taken by scanning the stripe ST in the X-direction with the aid of the deflector $725$ and $726$. In the latter method, since the section area of the electron beam can be reduced, the beam current density can be increased, and thus the S/n ratio of the signal can be made enhanced. Further, changing the optical parameters for the secondary optical system, such as a condition for an excitation of the lens or the like, in synchronization with the scanning by the electron beam can help the deflectors to control the orbit of the secondary electrons or the back-scattered electrons to be oriented closer to the optical axis B to thereby reduce the aberration.

The description will now be directed to an electron optical device $70a$ of multi-beam type in a semiconductor inspection apparatus, with which an aligning method and a defect inspection method using the same aligning method according to the present invention can be implemented. FIG. $10(a)$ schematically shows a configuration of the electron optical device $70a$ of multi-beam type, while FIG. $10(b)$ is a plan view of a multi-aperture employed in said device.

In FIG. $10(a)$, the electron optical system of multi-beam type $70a$ comprises a primary optical system $72a$, a secondary optical system $74a$, and a detecting system $76a$. The primary optical system $72a$ is provided as an optical system for irradiating an electron beam over a pattern, such as a chip, on a wafer W and it comprises: an electron gun $721a$ for emitting an electron beam; a multi-aperture plate $722a$ with a plurality of small holes formed therein in a two-dimensional arrangement for splitting the electron beam emitted from the electron gun $721a$ into a plurality of electron beams (a multi-beam); an electrostatic lens $723a$ for focusing said plurality of electron beams; an NA aperture member $724a$ for defining an NA aperture; an electrostatic lens $725a$ for demagnificating the electron beam having passed through the NA aperture member $724a$; an electrostatic deflector $726a$; an E×B separator $727a$; a first electrostatic objective lens $728a$; deflectors $729a$ and $730a$; and a second electrostatic objective lens $731a$. The elements are arranged in this order, as shown in FIG. $10(a)$, with the electron gun $721$ in the topmost location in such an orientation that an optical axis OA1 of the electron beam emitted from the electron gun $721a$ should be normal to the surface of the wafer W.

As shown in FIG. $10(b)$, the multi-aperture plate $722a$ is provided with a plurality of small holes formed along a line as spaced equally from each other in the Y-direction, and thereby allows the minimum intervals between adjacent two beams to be kept greater than the distance for the resolution of the secondary optical system.

The secondary optical system $74a$ comprises an electrostatic magnifying lens $741a$ and a deflector $742a$, which are disposed along an optical axis OA2 branched at a predetermined angle from the optical axis OA1 in the vicinity of the E×B separator $727a$, and serves to guide the secondary electrons or the back-scattered electrons that have passed through the E×B separator $727a$ into the detecting system $76a$.

Figure 11:
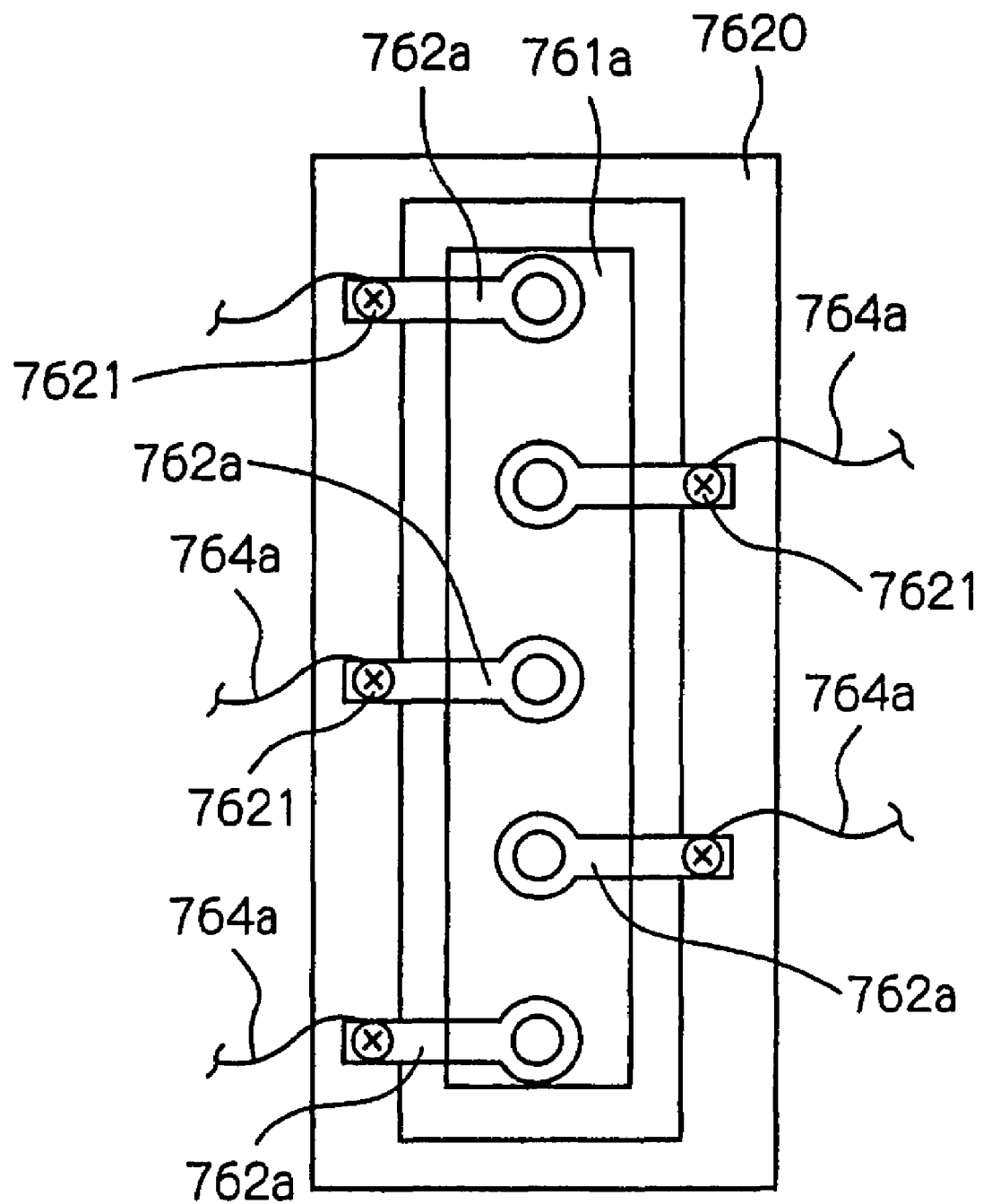
FIG. 11 is a schematic diagram showing a multi-anode used in the electron optical device shown in FIG. 10.

The detecting system $76a$ comprises a micro-channel plate (MCP) $761a$ having channels each corresponding to each of the small holes of the multi-aperture plate 722a, a multi-anode 762a, a resistor 763a, an image forming circuit 765a including an A/D converter, and a memory 766a. As shown in FIG. 11, the multi-anode 762a defines an elongated structure so as to allow the gas discharged from the MCP 761a to be exhausted quickly. One end 7621 of each one of the multi-anode 762a is fixed to a substrate 7620 of ceramics and connected to the resistor 763a and the image forming circuit 765a via a lead 764a.

An operation of the electron optical device 70a of multi-beam type having the above-described configuration will now be described. The electron beam emitted from a single electron gun 721a irradiates the multi-aperture plate 722a. The electron beam passes through a plurality of small holes formed in the multi-aperture plate 622a and is shaped into a plurality of electron beams (a multi-beam) M. The plurality of beams is focused by the electrostatic lens 723a to form a crossover in the NA aperture 724a. The electron beams, after having formed into the crossover, are demagnified by the electrostatic lens 725a, the first electrostatic objective lens 728a and the second electrostatic objective lens 731a, and thereby a plurality of electron beams are irradiated on the sample, each defining a size of 0.1 to 0.05 μm thereon. In this case, each of the electron beams is deflected slightly by the E×B separator 727a so that it can pass through the center of the lens in the first electrostatic objective lens 728a, and further deflected by the deflector 729a to follow an orbit indicated by reference symbol L1. The electrostatic deflectors 729a and 730a control in combination the electron beams so as to make the scanning operation in the X-direction.

The secondary electrons emanated from the wafer W or the back-scattered electrons therefrom follow an orbit indicated by reference symbol L2, deflected by the E×B separator 727a into the secondary optical system 74a and advanced along the optical axis OA2. In this case, the group of secondary electrons, after having been focused separately for each electron beam and magnified by the second electrostatic objective lens 731a and the first electrostatic objective lens 728a, is deflected by the E×B separator 727a into the secondary optical system 74a, where the electrostatic lens 741a adjusts the magnification such that the intervals between respective electron beams should be equal to the intervals between respective anodes in the multi-anode 762a disposed behind the MCP 761a. Further, in synchronization with the scanning operation of the primary electron beam on the wafer W, the deflector 742a provides a compensation to the electron beam so as to be always focused into an image on the front surface of the multi-anode 762a (the above description corresponds to the step (a) defined in claim of WHAT IS CLAIMED IS). The group of secondary electrons absorbed in the multi-anode 762a is converted by the resistor 763a into a voltage signal, which is amplified and A/D converted to form a two-dimensional image in the image forming circuit 765a, and this two-dimensional image is stored in the memory 766a (Step (b)).

This two-dimensional image contains the data of density obtained in a first region (e.g., the left side end of the field of view), wherein reference symbols S1, S2, S3 and S4 represent the regions having the density of 1.0, 0.7, 0.3 and 0.1, respectively.

Figure 12:
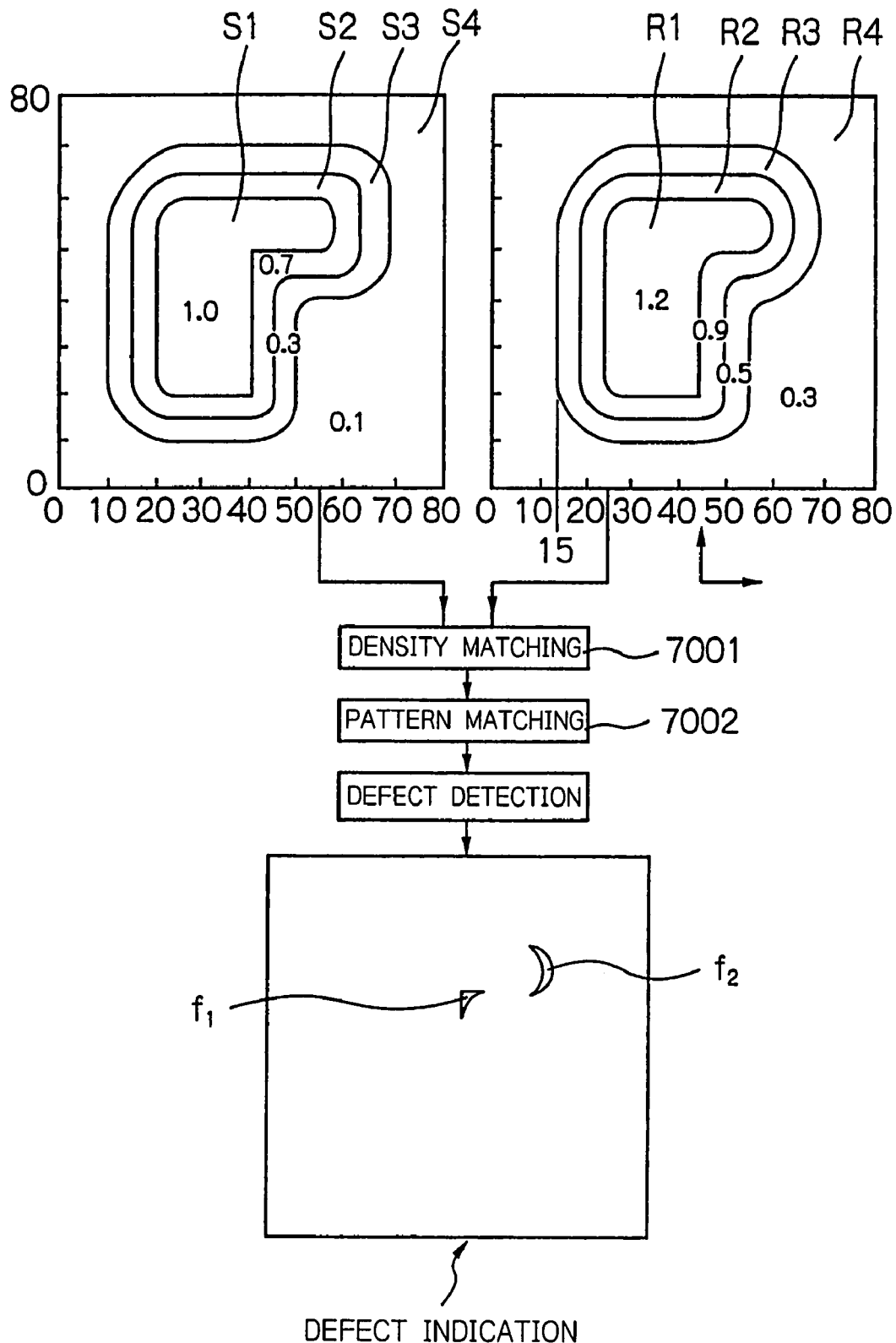
FIG. 12 is a chart for illustrating a density control of a two-dimensional image.

Subsequently, another two-dimensional image, for example, the one shown in the right-hand side in FIG. 12, having the data of density on a second region (e.g., a region in the vicinity of the optical axis expected to contain the same pattern as the region input in said step (b) is formed and input in another memory (Step (c)). In FIG. 12, reference symbols R1, R2, R3 and R4 represent the regions having the density of 1.2, 0.9, 0.5 and 0.3, respectively.

Then, the images taken in said steps (b) and (c) are called for from the memories, respectively, and a density matching 7001 is applied between them, wherein the density of one of the image should be increased or decreased to make an average density matched between said two images (Step (d)). For example, as illustrated in FIG. 12, the density R1, R2, R3 and R4 representing 1.2, 0.9, 0.5 and 0.3 as before the matching is changed to read 1.0, 0.7, 0.3 and 0.1, respectively, thus enabling the pattern matching 7002 to be applied. As a result of the application of the pattern matching 7002, it may be found that the image in the left-hand side has been shifted by a distance of five-addresses in the −X-direction.

Further, a pattern matching is applied between those images that have matched their average densities, and a difference between the images to which the pattern matching has been applied is calculated, wherein the location defined by the difference may be considered as a candidate for a defect (Step (e)). The defects f1 and f2 can be detected by date by comparing the density among every one of addresses after the pattern matching.

Lastly, a two-dimensional image of a third region expected to contain the same pattern as said first and said second regions is obtained, and additionally the density matching is applied between the two-dimensional image of the third region and the image of either one of said first or said second region, wherein the comparison is made with the candidate for the defect obtained in said step (e) and the defect is determined from the candidates (Step (f). In these processes, the defect inspection method of the present invention is carried out.

In the above defect inspection method, the electron beam is the multi-beam which consists of a plurality of beams arranged such that when said plurality of beam is projected in one axial direction, each beam is equally spaced from adjacent beam and is adapted to make a scanning operation in the direction orthogonal to said one axial direction, in which said two-dimensional image is formed by electrically controlling said multi-beam so as to make the scanning operation while moving the sample stage continuously in the direction parallel to said one axial direction. Further, in said step (d), said density matching may be carried out such that firstly the offset values are matched so as for the lowest densities of said two images to match to each other and then the gain is adjusted so as for the highest densities of said two images to match to each other.

Further, in the electron optical device 70a of multi-beam type, the scanning sensitivity may be measured and adjusted appropriately. A procedure to achieve this will be described below with reference to FIG. 13.

(a) First of all, a stage is moved so that a dicing line at a corner of the wafer W or a characteristic pattern on the wafer W may be brought into a field of view 8200 of the electron optical system of the electron optical device 70a. As illustrated in FIG. 13(*a*), the field of view 8200 of the electron optical system encompasses, in this illustrated embodiment, an area defined by 2048 pixels in the X-direction and 50 pixels in the Y-direction. A plurality of electron beams M (e.g., five of electron beams) is positioned on a circle formed around the optical axis OA1 of the primary optical system (indicated by the dashed line in FIG. 10(*b*)) within the field of view 8200, as described above, and arranged such that when said plurality of electron beams is projected in the Y-direction, each beam is equally spaced from an adjacent beam. Each electron beam is adapted to scan a sub-field of view defined by 2048 pixels×10 pixels indicated by reference numeral 8201 or 8202. The wafer W includes the characteristic pattern 8204 having a point 8203 with which the pattern position in the X- and the Y-directions can be specified, and the stage is moved so that said characteristic pattern 8204 may appear within the field of view 8200.

(b) A plurality of electron beams is irradiated on the characteristic pattern 8204 on the wafer W, and secondary electrons or back-scattered electrons from the wafer W are detected to thereby obtain a two-dimensional image.

(c) The coordinate of the stage (Xc, Yc) at the time when the two-dimensional image is obtained in the above step (b) is stored in the memory.

(d) The stage is moved in the X- and the Y-directions by a certain distance within which the characteristic pattern 8204 does not disappear from the sub-field of view 8201 or 8202 covered by a single electron beam (FIG. 13(b)).

(e) The two-dimensional image of the characteristic pattern is taken at the position to which it has been moved, and the coordinate of the stage (Xe, Ye) at the time when the image is taken is stored.

(f) A pattern matching is applied between those two-dimensional images taken in said steps (b) and (e) specifically onto the parts thereof containing the characteristic pattern 8204 to thereby calculate a distance of offset between said two images in the X- and the Y-directions ($\Delta X$ pixels, $\Delta Y$ pixels).

(g) A difference between the coordinate (Xc, Yc) stored in said step (c) and the coordinate (Xe, Ye) stored in the step (e), which is defined by (Xe–Xc)nm and (Ye–Yc)nm, is calculated.

(h) A scanning sensitivity in the X-direction, (Xe–Xc)/$\Delta X$ (nm/pixel), and that in the Y-direction, (Ye–Yc)/$\Delta Y$ (nm/pixel) are calculated. It is to be noted that the scanning sensitivity is a value indicating how long a single pixel in the displayed image would be in the wafer W.

(i) The scanning sensibility that has been calculated in said step (h) is stored in a memory. This scanning sensibility provides a value needed in the alignment operation that will be performed later. That is, it is required in order to make an alignment operation to thereby cancel the misalignment of the wafer that the distance by pixel representing the indicated misalignment should be converted into an actual distance on the wafer W by using the scanning sensibility.

After the scanning sensibility is determined in the above steps (a) through (i), the defect inspection of the wafer W may be carried out in accordance with the following steps.

(j) A series of steps (a) to (e) is applied to the wafer W on at least two locations within the surface to be inspected, respectively, and a pattern matching is carried out on the obtained images to estimate a relationship among the stage coordinate, the pattern coordinate and the field of view of the electron optical system. At this time, a precise value of the scanning sensibility is used. After the alignment operation is performed in the above manner, the defect inspection is performed.

(k) A two-dimensional image of the pattern on the surface of the wafer W subject to the inspection is taken while moving the stage continuously in one axial direction and at the same time controlling the electron beam so as to make a scanning operation in the other axial direction.

(l) The two-dimensional image obtained in said step (k) is divided into a predetermined number of regions and stored in a memory.

(m) The operations defined in the above steps (k) and (l) are repeated.

(n) From the two-dimensional images that have been divided into the predetermined number of regions and stored, those two-dimensional images for the regions within the same chip in the inspected surface of the wafer W, which are expected to contain identical patterns to each other, are selected and compared so as to calculate to find a candidate for a defect.

(o) The two-dimensional image of the region in a different chip on the inspected surface, which is expected to contain the same pattern, is compared with the image of the either one of the regions taken in the step (n) so as to determine the defect from said candidates for a defect.

In the above steps (j) to (n), the comparison between the images may be performed by referring to the scanning sensibility stored in the memory in said step (i).

Figure 14:
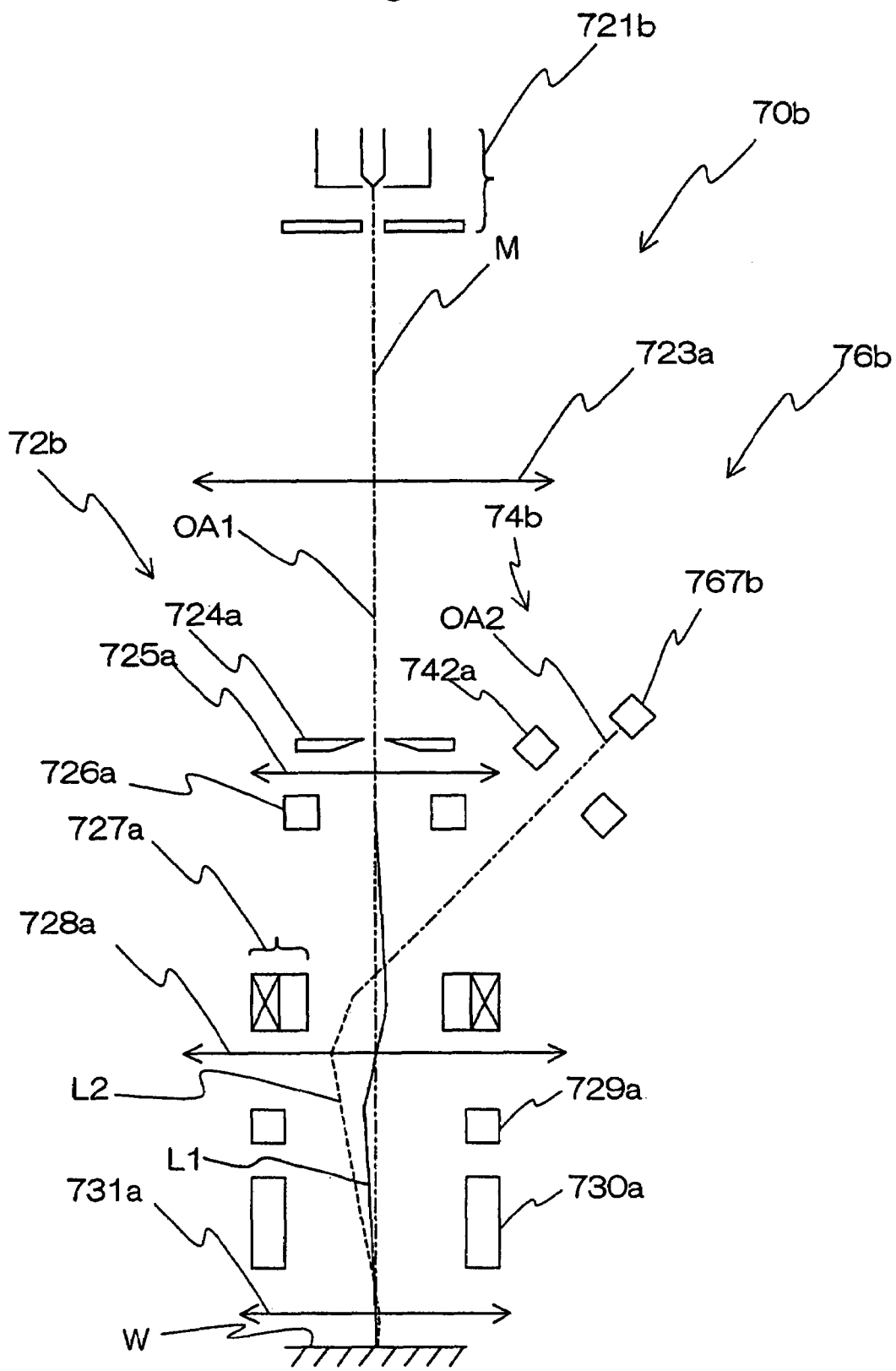
FIG. 14 is a schematic diagram showing a third embodiment of a defect inspection apparatus according to the present invention, which employs a single beam type electron optical device.

FIG. 14 shows schematically a configuration of a third embodiment of an electron optical device used in a defect inspection apparatus according to the present invention, which is generally designated by a reference numeral 70b. This third embodiment represents a scanning electron optical device of single beam type similar to the first embodiment shown in FIG. 7, and is different from the second embodiment shown in FIG. 10 in a point that the multi-aperture plate 722a and the multi-anode 762a (FIG. 11) are not necessary. Also, the scanning electron optical device of single beam type is different therefrom in a point that the detecting system 76b in the device of multi-beam type is replaced with a detector 767b comprising a PIN diode or a scintillator and a photo-multiplier. It is to be noted that in FIG. 14, the same reference numerals are used to designate the similar components to those in FIG. 10, and description of those components should be omitted.

In the electron optical device 70b of single-beam type shown in FIG. 7 and FIG. 14, in which a single beam is used to detect the data for one pixel, it is only required to detect a signal intensity corresponding to the number of secondary-electron groups emanated from the surface of the wafer W subject to the inspection, which means that, advantageously the detecting system can be made simple.

Figure 10:
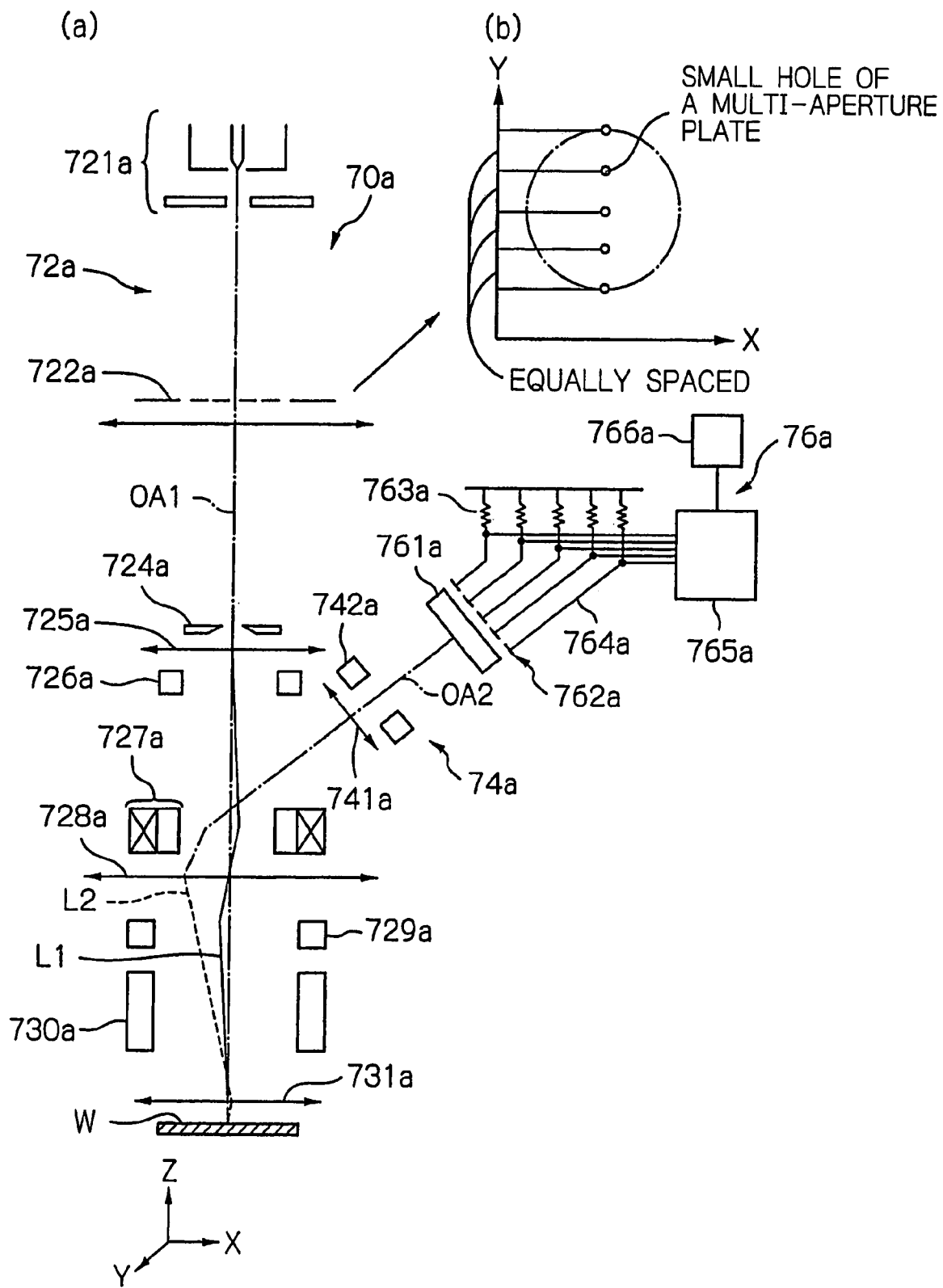
FIG. 10(a) is a schematic diagram showing a multi-beam type electron optical device in a semiconductor inspection apparatus of FIG. 1, with which an aligning method and a defect inspection method using said aligning method according to the present invention can be implemented.
FIG. 10(b) is a plan view of a multi aperture used therein.
FIG. 10(c) is an enlarged view of the circled portion "A" in FIG. 10(a).

One embodiment of a pattern inspection method according to the present invention, which can be implemented by a defect inspection apparatus employing the electron optical device 70 shown in FIG. 10 or FIG. 14, will now be described.

When an electron beam is irradiated onto a substrate such as a wafer containing a plurality of dies formed thereon and an image of a pattern on that surface to be inspected is obtained, theoretically respective dies should be arrayed as designed even in the obtained image. However, actually the array of the dies on the formed image could be occasionally different from the array of dies on the wafer due to the distortion generated in a stage guide for moving the stage and/or an error in an exposure occurring in the lithography process, as explained previously. Since this situation may cause a problem in the defect inspection which depends on the image comparison, it is preferable that the deflecting direction and/or the deflecting amount of the electron beam should be compensated for by the deflector in the electron optical system in order to obtain an image containing the array of respective dies corresponding to that on the wafer.

To apply the above compensation, it is necessary to obtain a grid that can be used as a reference for the image comparison. That is, what is needed is to obtain "a target grid" to be used as the reference for the image comparison. The target grid may be the CAD data created in a design process, or may be determined from a calculation based on an actual measurement of the position of a die on the wafer. In the latter case, using the actual die on the substrate, in order to generate the target grid, pitches in the X- and the Y-directions between the dies on the sample are detected and averaged so as to determine the virtual target grid. Further, also for the case using the CAD data, a similar arithmetic operation may be executed as desired. The thus determined virtual target grid is used to carry out the defect inspection.

Figure 15:
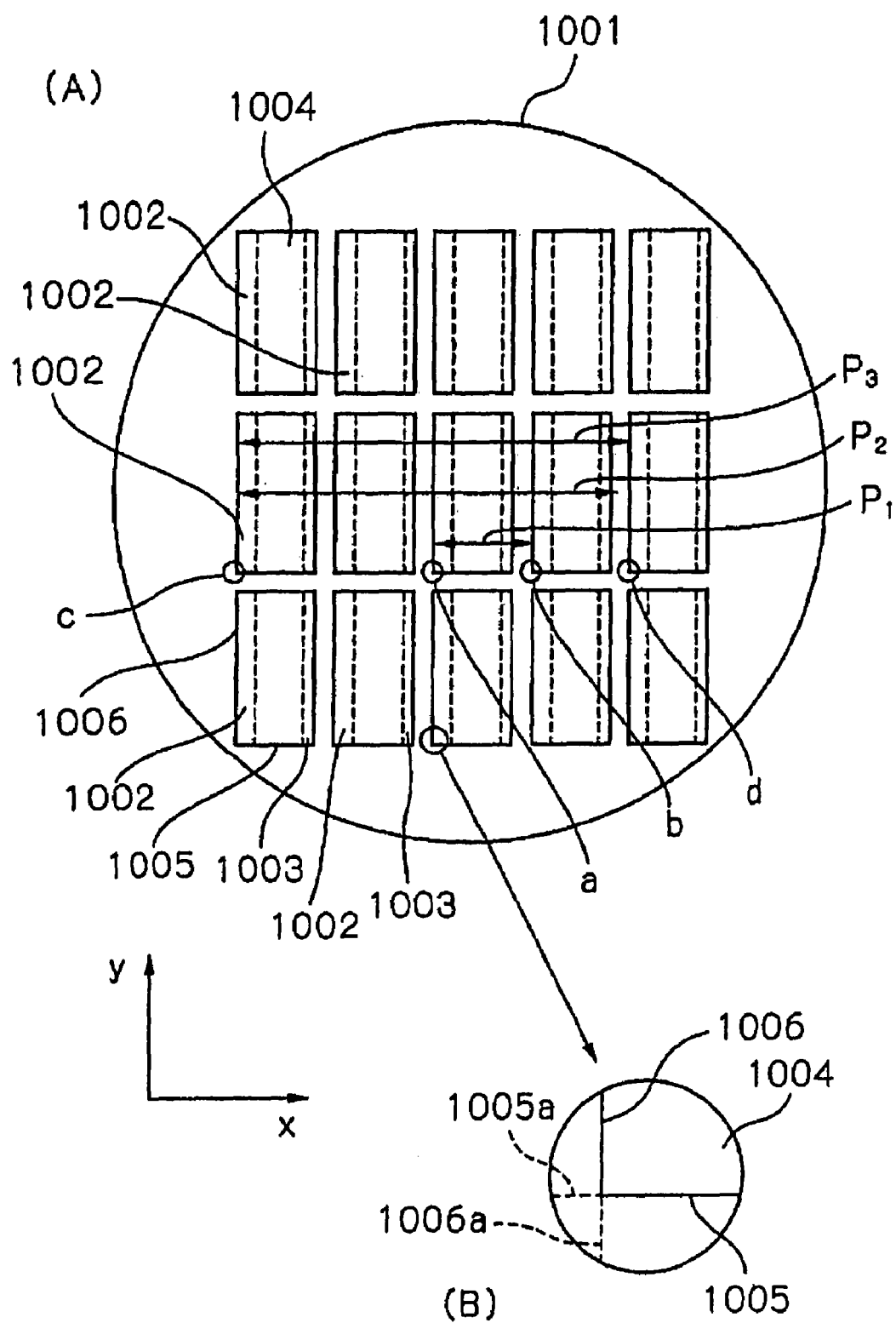

In fact, for many cases, respective dies may define an equally spaced grid. One embodiment of a pattern defect inspection method according to the present invention will now be described specifically, with reference to FIG. 15 showing a plan view of the wafer 1001, by taking one case as a general example, in which respective dies define the equally spaced grid, meaning that the target grid represents the equally spaced grid. As shown in FIG. 15, a plurality of dies 1004 are formed on a surface of a wafer 1001 (15 dies are formed by way of example in FIG. 15), which are arranged regularly along the X- and the Y-directions orthogonal to each other. When each of dies 1004 is to be inspected for any defects, preferably the coordinate system on which the dies 1004 are placed and the coordinate system of the defect inspection apparatus should be accurately matched to each other. However, in practice, a misalignment (error) in the rotational direction could be occasionally introduced between the coordinate system on which the dies 1004 are arranged and the coordinate system of the defect inspection apparatus, when the wafer 1001 is loaded on the stage. Also, the lithography process for creating a pattern on the wafer 1001 contains a possibility that a misalignment in a range of some 10 nm to some 100 nm could be induced as compared to the value defined by the design. The defect inspection method according to the present invention allows an accurate defect inspection even in such cases. A specific procedure of the pattern defect inspection method according to the present invention will now be described.

First, a step for detecting a virtual pitch by using an optical microscope and/or an electron microscope is performed. In this step, it is desired that the detection of the pitch should be carried out in some steps from a broad range in a low magnification to a narrow range in a high magnification. Specifically, the pitch between adjacent dies may be detected on an enlarged image of the sample (e.g., a distance, $P_1$, between corresponding corners, "a" and "b", of the adjacent dies in FIG. 15) by using the dicing lines 1005 and 1006. From this, the X-directional pitch between dies can be determined. For the Y-direction, similarly, the pitch between the adjacent dies may be detected.

It is to be noted that since there might be a case where the pitch determined for the adjacent dies is significantly different from the actual pitch, in order to improve the accuracy, the pitch between widely spaced dies is additionally detected, and an average value of the detected pitches may be determined. This averaging process will be described later. It is to be noted that, instead of detecting an actual pitch between adjacent dies, the data which can be used as a reference such as the CAD data created in the design process may be used to determine the pitch. Further, although the dicing line has been used to determine the pitch between dies, the application should not be limited to that. For example, if such a characteristic pattern is selected, which is a predetermined pattern having no similar patterns existing in its surrounding within the same field of view, which could be unintentionally pattern-matched to said pattern, then said characteristic pattern may be used to detect the pitch between dies similarly to the case with the dicing line. This characteristic pattern may be selected based on the pattern data of the dies, for example.

Subsequently, "an equally spaced virtual grid" is generated. In this "equally spaced virtual grid", the dies are equally spaced both in the X- and the Y-axial directions. Further, typically the X-axis and the Y-axis of said equally spaced grid are orthogonal to each other. The "equally spaced virtual grid" is generated by using the virtual pitches in the X- and the Y-axial directions that have been detected in the above manner. In this illustrated embodiment, since the die is a rectangle elongated in the Y-axial direction as shown in FIG. 15, therefore the "equally spaced virtual grid" defines a grid having a longer pitch in the Y-axial direction than in the X-axial direction. Thus formed "equally space virtual grid" represents a virtual grid used as a target for re-arranging the dies that have been actually formed with uneven pitches to be equally spaced and/or for compensating for a misalignment of a die which could appear in the image for inspection due to a manufacturing error of the defect inspection apparatus. Accordingly, there would be a probability that the position of the actual die is slightly offset from the position of the die in the "equally spaced virtual grid".

Figure 16:
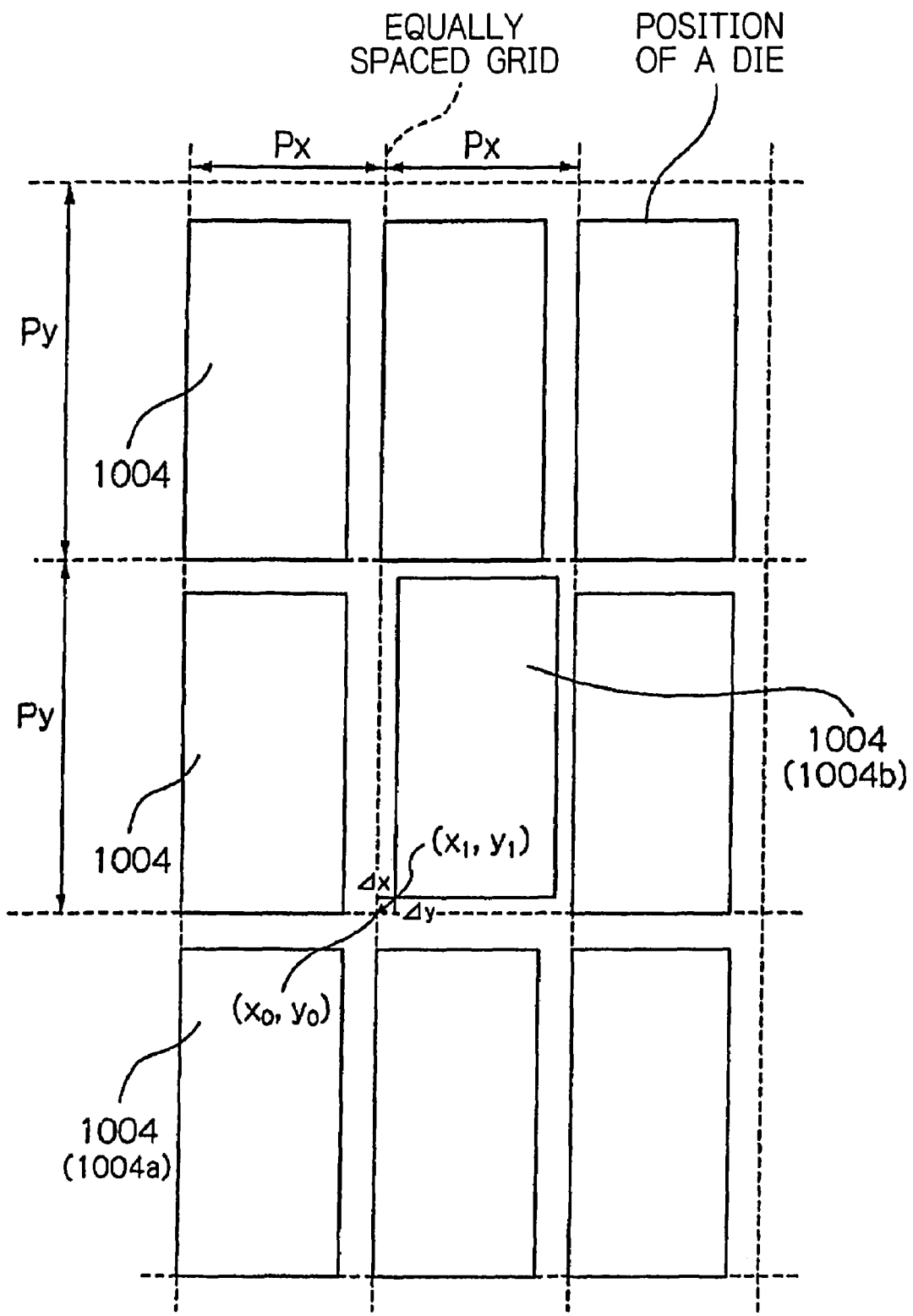
FIG. 16 is a plan view for illustrating an equally spaced virtual grid and a misalignment of a die that has been induced in the lithography process of the die.
Figure 17:
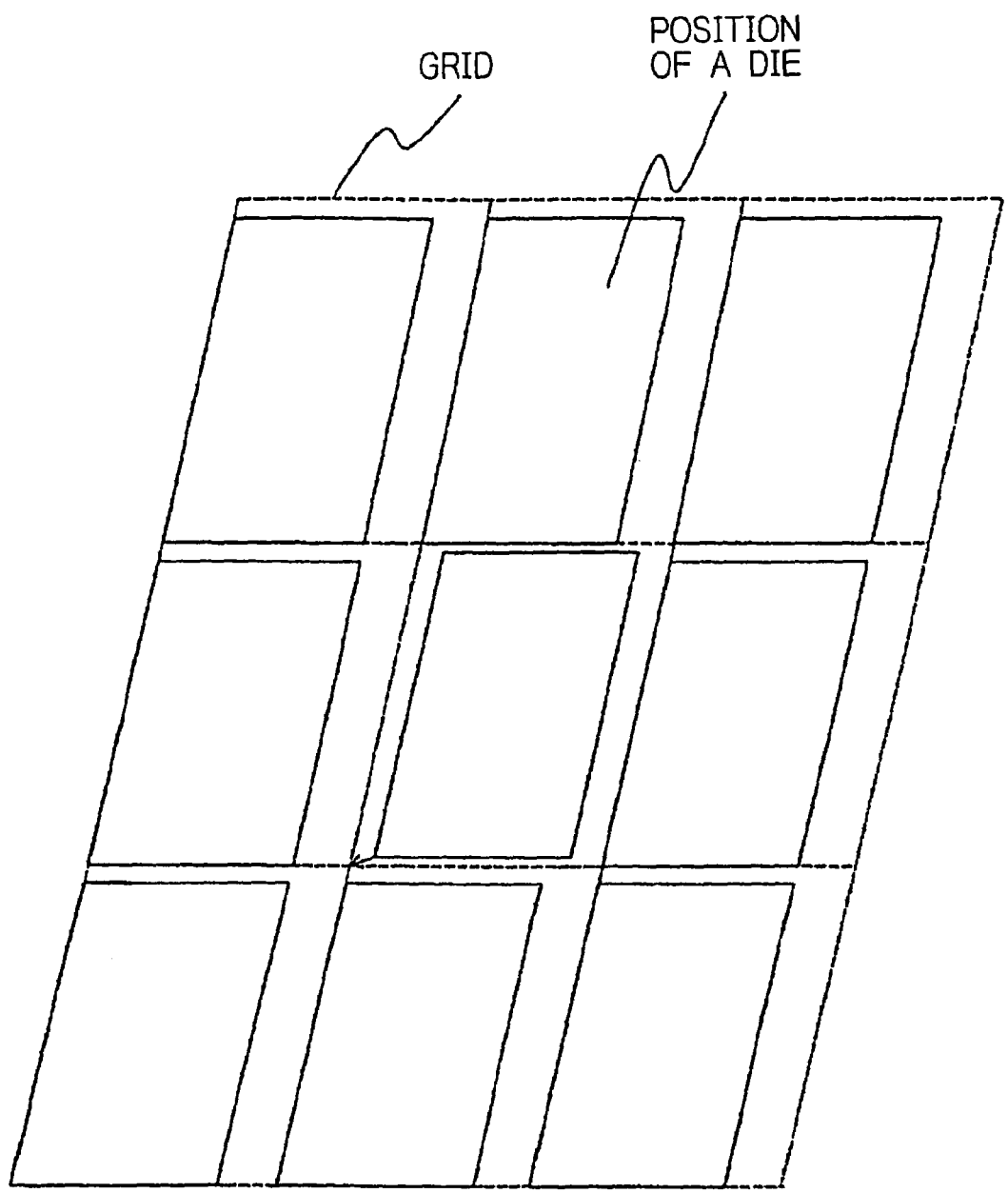
FIG. 17 is a plan view for illustrating another example of an equally spaced virtual grid and a misalignment of a die.

FIG. 16 shows an "equally spaced virtual grid" defined by the pitch in the X-axial direction denoted by $P_x$ and the pitch in the Y-axial direction denoted by $P_y$. It is to be noted that the "equally spaced virtual grid" may be a parallelogram, as shown in FIG. 17.

A step for detecting a position coordinate of each die on the wafer will now be described. The detection of the position coordinate of the die may be achieved by way of a mark detection by using the electron beam, in which the straight lines represented by the dicing lines 1005 and 1006, respectively in parallel with the X- and the Y-axial directions, are used as the marks. The dicing lines 1005 and 1006 to be detected are located in the left-hand and the lower sides of the die 1004 in the example illustrated in FIG. 15(B).

Once the straight line in the X-axial direction 1005a and the straight line in the Y-axial direction 1006a of the die 1004 are determined through this mark detection, the position coordinate at the corner of the die 1004 (e.g., the lower left corner of the die 1004) may be detected from an intersection point of the straight lines 1005a and 1006a. The thus detected position coordinate value at the corner of each die 1004 may be stored in a predetermined memory. It is to be noted that the position coordinate at the corner of each die 1004 may be determined for every die on the wafer 100, or otherwise the position coordinate may be determined for about one half of the total number of dies and may be calculated by interpolation for the rest of dies by using the position coordinates for the adjacent dies.

Figure 18:
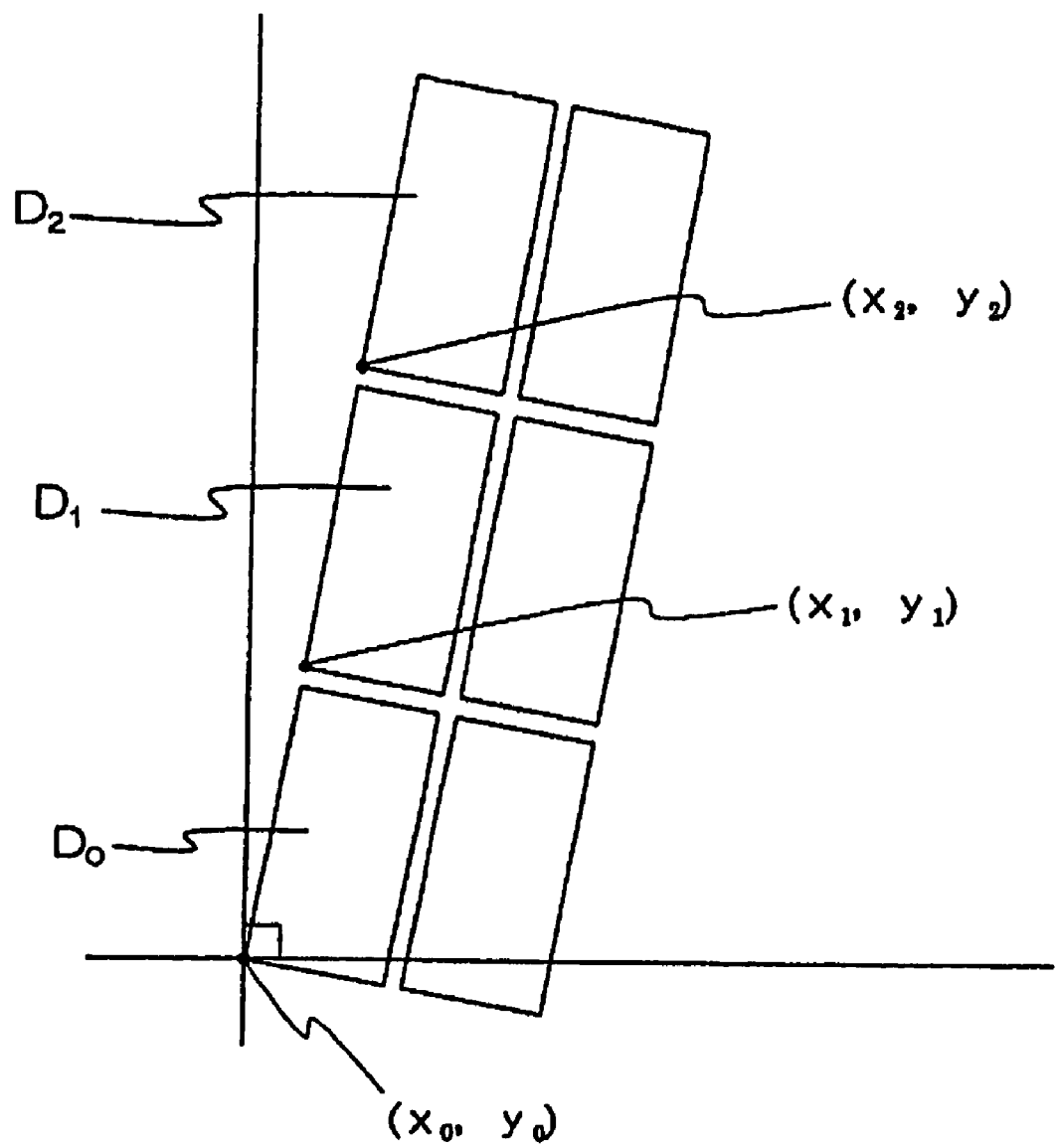
FIG. 18 is a diagram for illustrating an interpolation for a position coordinate of a die.

In this regard, referring to FIG. 19, one example of said interpolation will be described. If the X-axis and the Y-axis of the stage guide for moving the stage are not precisely orthogonal to each other, the interpolation may be applied as described below. That is, assuming that the coordinates at the lower left corners of the dies $D_0$ and $D_2$, $(x_0, y_0)$ and $(x_2, y_2)$, have been determined in advance by the actual measurements, the coordinate at the lower left corner of the die $D_1$, $(x_1, y_1)$, is to be determined. As described above, since the compensation is to be applied to the case where the X-axis and the Y-axis are not precisely orthogonal to each other, the interpolation by way of the linear operation may be applied. As it is, in FIG. 18, since the die $D_1$ is expected to be located just in the middle between the die $D_0$ and the die $D_2$, the $x_1$ and the $y_1$ may be determined by the calculations: $x_1=(x_0+x_2)\div2$, and $y_1=(y_0+y_2)\div2$. Further, a polynomial expression may be employed when the position coordinate of the die is to be determined by using the interpolation, which has experienced a misalignment introduced by the combined factors. For example, in a case using a quadratic polynomial: $(y=ax^2+bx+c)$, as the interpolative expression, if there are values of the actual measurements at three locations: $(x_{10}, y_{10})$, $(x_{20}, y_{20})$ and $(x_{30}, y_{30})$, then variables a, b and c can be determined, from which the interpolative expression can be derived.

Subsequently, based on the generated "equally spaced virtual grid" and the position coordinate of each die on the wafer, the position error for each die 1004 on the wafer with respect to each corresponding die on the "equally space virtual grid" is calculated. FIG. 16 is a conceptual diagram for illustrating a case where the die has been formed as it is offset in the lithography process, in which the "equally spaced virtual grid" is indicated by the dotted line and each die is represented by a rectangle with the solid line. To calculate said position error, firstly the coordinate system of the generated "equally spaced virtual grid" should be correlated with the coordinate system of the dies at some position. In the case shown in FIG. 16, the die 1004a located in the lower left position corresponds to the "equally spaced virtual grid", but the die 1004b located in the center among those nine dies is offset slightly by $\varDelta x$, $\varDelta y$ in the X- and the Y-axial directions, respectively, from the "equally spaced virtual grid".

Said position error refers to a difference between the position coordinate in the "equally spaced virtual grid" and the corresponding position coordinate of the die of misalignment, and in FIG. 16, the position error, $\varDelta x$ and $\varDelta y$, between the reference coordinate $(x_0, y_0)$ and the coordinate of the center die 1004b, $(x_1, y_1)$, is calculated. The calculated position error, $\varDelta x$ and $\varDelta y$, may be stored in a predetermined memory.

Subsequently, an actual defect inspection is performed. When the defect inspection is to be performed, an electron beam is irradiated so as to scan the surface of the die 1004, and secondary electron groups emanated from the die 1004 are detected and visualized into an image for inspecting the die for any defects. At this time, since the wafer 1001 is loaded on the stage and moved along a predetermined path, if no compensation is applied, the scanning of the die 1004 of misalignment may cause the misalignment also in the image to be obtained.

To solve this problem, the position error, $\varDelta x$ and $\varDelta y$, which has been determined in the above manner is read out of the memory, and a compensation is applied to the deflection of the electron beam so that the position error may be cancelled to zero. That is, the direction and amount of deflection of the electron beam is compensated for so that the electron beam may be irradiated on the point determined from $x_1 = x_0 + \varDelta x$ and $y_1 = y_0 + \varDelta y$.

Alternatively, without using the memory, the variables a, b and c may be derived from the position compensations of the die, $(\Delta x_0, \Delta y_0)$, $(\Delta x_1, \Delta y_1)$ and $(\Delta x_2, \Delta y_2)$ by using a polynomial expression: $\Delta y = a\Delta x^2 + b\Delta x + c$, and then the compensation amount for the deflection may be determined by the calculation for respective positions of scanning.

Such compensation for the deflection may be carried out by using the deflector of the electron optical system. For example, in the electron optical device 70a of FIG. 10, the position of irradiation of the electron beam may be compensated for by the deflectors 729a and 730a, while the position of the electron beam incident onto the MCP 762a may be compensated for by the deflector 742a. Thus, by applying the compensation for the deflection to the electron beam M to be irradiated to the die with position error, resultantly the image of every single die would be located on the "equally spaced virtual grid".

As for the misalignment in the X-axial direction, in addition to such a fixed one that is generated in the lithography process as described above, if the stage guide has a distortion (not shown), there could be also a misalignment generated during the movement of the stage on which the wafer 1001 is loaded. If the stage guide has the distortion, the movement of the stage would not be accurately parallel to the Y-axis but occasionally make a slight deviation in the X-axial direction. To address this, in the circumstance that the actual position of the stage is kept monitored all the time by a laser interferometer, preferably a difference between this actual position of the stage and the theoretical position of the stage may be detected, and the compensation may be applied to the amount of deflection of the electron beam by the deflector so that the difference should be cancelled to zero.

Further, as to the compensation for the misalignment in the Y-axial direction, such a disposition error of the die generated in the lithography process may be compensated for in the same way as described above for the error in the X-axial direction. An error from the theoretical value generated during the movement of the stage may be compensated for in the following manner. For example, assuming that the electron optical system is actuated by a clock frequency at 100 MHz per pixel, the wafer can be theoretically scanned at a rate of 100 pixels/μs. Actually, when the electron beam is irradiated onto the wafer, the electron beam is not irradiated entirely across the die, but the die is divided into a plurality of elongated areas and each of said elongated areas is scanned as a unit of scanning operation. This area is referred to as a "stripe", which is designated by reference numeral 1002 in FIG. 15(A). Since the width of the stripe 1002 in the X-axial direction has been set to a size for 2048 pixels, as will be described later, it takes 20.48 μs for one-time scanning of the stripe 1002 along the X-axial direction. Assuming that there is a total injury or loss time of 9.52 μs for the starting and ending in one scanning operation, then the time required for the one-time scanning of the stripe 1002 along the X-axial direction is totally 30 μs. Since one pixel length (0.1 μm) of scanning operation is performed along the Y-axial direction within said time period, the speed of the stage for making a continuous scanning along the Y-axial direction is calculated as 0.1 μm/30 μs=3.3 mm/s. Thus, this value is taken as an average speed of the stage along the Y-axial direction, and a relationship between the time and the theoretical position of the stage is calculated and a result is stored in a memory. On one hand, the actual position of the stage is kept under monitoring all the time by using a laser interferometer. Owing to this circumstance, since any fluctuation in the speed of stage can be detected from a comparison between said calculated position of the stage and the actual position of the stage, if any position error due to the fluctuation in the speed of stage along the Y-axial direction is detected, feed-back or feed-forward operation may be applied to the deflector of the electron optical system in order to cancel this position error.

In this way, after the "equally spaced virtual grid" is determined and then the position coordinate of each die on the wafer having been compensated for, the defect inspection is now performed. To determine a defect, a plurality of images for the regions expected to contain the identical patterns are extracted from the obtained images. For example, a plurality of images for the respective stripes 1002 shown in FIG. 15(A) are extracted. Then, the extracted images are compared to one another, wherein if the images are not precisely matched, it is determined that a defect exists. A specified technique for the determination will be described later.

Applying the compensation as described above may help generate an image for a precise region, and so even in the case of the cell-to-cell or die-to-die image comparison, only creating of the offset images to the extent of ±2 pixels can provide the defect inspection with a satisfactorily high precision.

A variation of a method for detecting a pitch between dies will be now described. This time, firstly the pitch between dies 1004 located in the central region of the wafer 1001 is detected. For example, an interval between the corners "a" and "b" in FIG. 15(A) is detected. This interval is taken as a first pitch $P_1$. Subsequently, the first pitch $P_1$ is multiplied by a predetermined integer, and a resultant value is taken as a second pitch $P_2$. For example, the first pitch $P_1$ is multiplied by 4, or $P_2=4P_1$. Subsequently, two dies are selected, which are spaced by a distance proximal to the determined second pitch $P_2$, and the actual pitch between them is detected, which is in turn taken as a third pitch $P_3$. In FIG. 15(A), the distance between the points, "c" and "d", represents the third pitch $P_3$. This third pitch $P_3$ is divided by said predetermined integer to thereby determine a virtual pitch between dies. The above steps are applied to the X- and the Y-axial directions so as to determine the pitches between dies in both directions, or $P_x$ and $P_y$ (see FIG. 16). By way of such a process, the values $P_x$ and $P_y$, which may be more proximal to the actual pitch between dies, can be determined.

The dividing operation of the die into stripes will now be described. As already described, in the actual defect inspection, each die 1004 is virtually divided into a plurality of stripes 1002, 1003, each extending in a direction parallel to the Y-axis. This stripe defines a unit of scanning operation in the X-axial direction by the electron beam E when the defect inspection is performed.

The width of a single stripe in the X-axial direction has been set to a size for 2048 pixels, for example, wherein if one pixel corresponds to 100 nm (0.11 μm) on the wafer, the width of the stripe is 204.8 μm.

Although the size of the die 1004 in the X-axial direction is not necessarily the integer-multiple of the width of the stripe, 204.8 μm, the width of the stripe 1002 may be set such that the integer-multiple of the width of the stripe may be equal to the width of the die 1004 in the X-axial direction, or the last stripe 1003 may be the one having a reduced width. In dividing the die into stripes, however, the die should be divided such that the patterns at the identical locations on all of the dies 1004 should be included in the corresponding identical stripes.

A defect determination as described previously will now be described in detail. As stated above, in determination of a defect, the images of the stripes 1002 located on the different dies but corresponding to each other are compared. This is because the corresponding stripes are expected to contain identical patterns to each other if no defect exists, but a mismatch should be found in the result from the comparison if any defect exists.

In FIG. 15(A), when the defect inspection is carried out by comparing the patterns in the stripes 1002 on the adjacent dies on the same wafer to each other, the stage is moved continuously in the Y-axial direction to thereby enable a sequential observation of the two patterns to be compared, thus helping complete the inspection across the entire surface of the wafer in a shorter time.

In an alternative defect inspection technique, the CAD data may be used, for example. In this technique, the same pattern as that contained in the stripe 1002 is generated as a reference image onto a memory by an arithmetic operation from the CAD data for generating the pattern contained in the stripe 1002, and said reference image is compared to the pattern on the wafer (the image for the stripe 1002 in FIG. 15(A)) to determine a difference therebetween, from which a defect may be detected.

In the technique for making a comparison between the patterns of two dies, in a case of performing the inspection across the entire surface of the wafer, the identical patterns on the dies adjacent to each other on a wafer are compared and examined sequentially thus making the inspection time shorter. In contrast to this, in the technique for making a comparison with the reference image obtained from the CAD data comprises: a step of converting a vector data representing the CAD data to a cluster data representing the image data, storing that image data into a memory, and generating the reference image; a step of making an image conversion of such a portion that is predicted to contain a difference in its image subject to the inspection from the reference image but contains no defect, for example, a corner of a pattern, and reflecting said converted image to the reference image, in order to avoid the detection error; a step of converting the density of the reference image into a density predicted to appear when the image subject to the inspection is obtained from the wafer; and a step of aligning the position of the reference image with the position of the image subject to the inspection, which has been obtained from the wafer. Either one of the above defect inspection techniques allows detection of a shape defect or a particle in the pattern, and further, since the electron beam is used to obtain the image on the wafer, voltage contrast data can be also obtained to help favorably detect any electrical defects.

Figure 19:
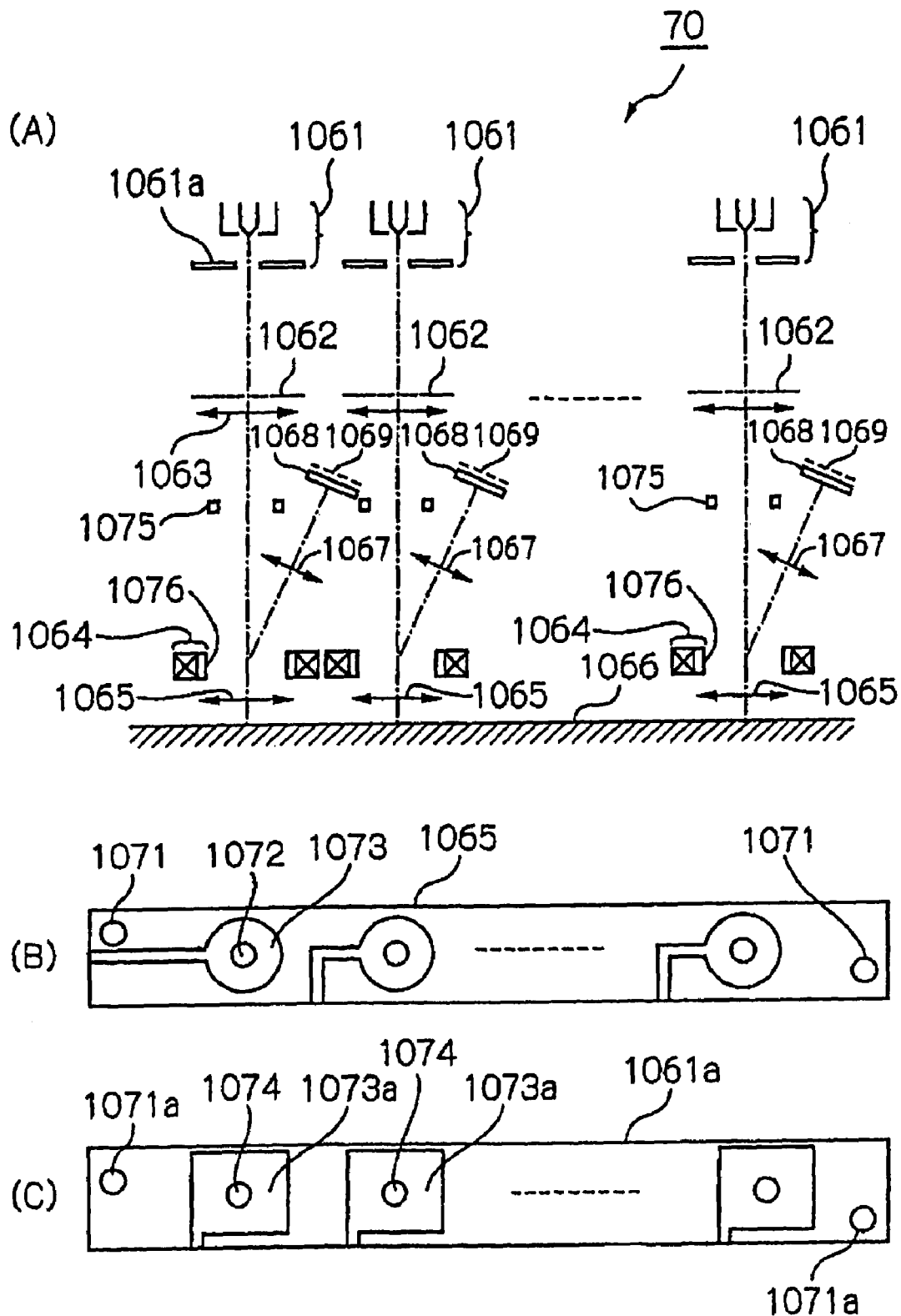

The pattern defect inspection method that has been described above may be implemented in the electron optical device 70 according to the embodiment shown in FIG. 7, which has been described already, or in a defect inspection apparatus equipped with an electron optical device employing an alternative type of electron optical system illustrated in FIG. 19.

FIG. 19(A) schematically shows the configuration of a fourth embodiment of an electron optical device 70c used in a defect inspection apparatus according to the present invention, and said electron optical device 70c employs an electron optical system of multi-optical axis and multi-beam type. Each set of the electron optical systems in the electron optical device 70c comprises an electron gun 1061, a multi-aperture plate 1062, a condenser lens 1063, an objective lens 1065, an E×B separator 1064, a secondary electron image magnifying lens 1067, a MCP 1068 and a multi-anode 1069, in which two or more sets of those components are arranged in a line so as to face to the wafer 1066. As a result, respective optical axes of the primary optical systems of respective sets would be set in the identical positions of the corresponding stripes on the different dies.

Each of optical components of the primary optical system represented by the objective lens 1065 or an anode 1061a is designed to define a plurality of optical elements by forming a plurality of through holes working as optical axes penetrated through a single sheet of ceramics having a coefficient of thermal expansion approximately equal to zero and aligning it with a knock hole 1071, as shown in FIG. 19(B). In case of the objective lens 1065, metal coating is selectively applied to an inner side of an electrode hole 1072 and a vicinity of the optical axis so as to prevent charging and to allow an independent voltage to be applied to the surrounding of each electrode hole 1072, as well.

As illustrated in FIG. 19(C), also in case of the anode 1061a, since the metal coating is applied to the periphery of each anode hole 1074 so as to allow the voltage to be applied independently, an anode current is adjustable individually for each anode hole. The intervals between those anode holes 1074 are designed so as to match precisely with the integer-multiple of the pitch between dies on the wafer 1066 in the X-axial direction, and owing to this, the electron beam passing through each anode hole can inspect an identical location in the corresponding stripe of the different die. It is to be noted that the anode 1061*a* is adapted to adjust its position by rotating around an axis passing through the center of the wafer 1066. Once the position error resultant from the fluctuation in the moving speed of the stage and/or the error resultant from the misalignment of the die has been calculated in a similar manner to that described with reference to the first and the second embodiments of the present invention, the feed-forward compensation is applied to a deflector 1075 and an electrostatic deflector 1076 in the E×B separator 1064, so that two dimensional images for regions containing the identical patterns formed therein in different dies can be obtainable all the time. Even in case of the occurrence of misalignment from another factor that could drift the beam position, since a total of 25 images consisting of 24 images that have been taken by shifting from the position of previously obtained image in the X- and the Y-axial directions by up to ±2 pixels plus one image that has not been shifted is sequentially compared to the obtained image, no problem would arise.

Figure 20:
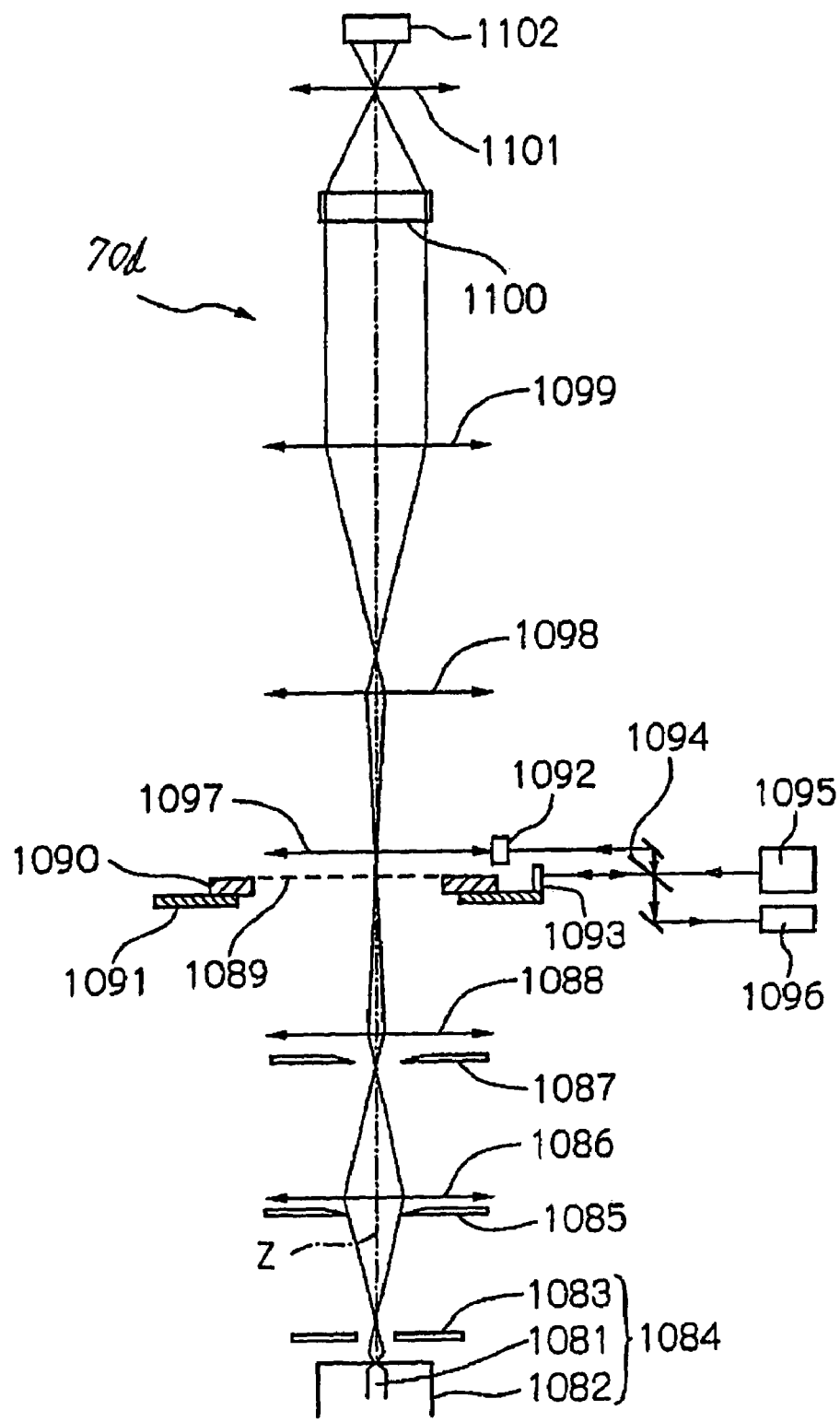
FIG. 20 is a schematic diagram showing a fifth embodiment of a defect inspection apparatus according to the present invention, in which a sample is transmittable for an electron beam.

FIG. 20 schematically shows a configuration of a fifth embodiment of an electron optical device 70*d* used in an defect inspection apparatus according to the present invention, in which a sample to be inspected is a stencil mask transmittable for an electron. A configuration of the defect inspection apparatus of FIG. 20 together with an inspection method executable in said apparatus will be described in combination. In FIG. 20, an electron beam is emitted from an electron gun 1084 comprising a cathode made of $LaB_6$ 1081, a Wehnelt 1082 and an anode 1083 along an axis "Z". The emitted electron beam is irradiated on a rectangular shaping aperture 1085, where it is formed appropriately to define a rectangle in a cross section vertical to the axis Z. The electron beam that has passed through the shaping aperture 1085 to be formed into the rectangular shape is then focused by a condenser lens 1086 and forms a crossover in an NA aperture 1087. The electron beam, after passing through the NA aperture 1087, forms a rectangular image on a stencil mask 1089, representing a mask to be inspected, by an irradiation lens 1088.

It is to be noted that the stencil mask 1089 is secured fixedly to a stage 1091 with its periphery chucked by an electrostatic chuck 1090. In order to measure the position of the stage 1091 all the time, the apparatus is provided with a laser measuring machine comprising a stationary mirror 1092, a movable mirror 1093, a stationary half-mirror 1094, a laser oscillator 1095 and a laser receiver 1096, in which the movable mirror 1093 is adapted to move in association with the movement of the stage 1091. Owing to this configuration, the laser measuring machine is operable to determine the position of the stage 1091 based on a difference between a time necessary for a laser light emitted from the laser oscillator 1095 to be reflected by the fixed mirror 1092 and to return to the laser receiver 1096 and a time necessary for the laser light emitted from the laser oscillator 1095 to be reflected by the movable mirror 1093 and to return to the laser receiver 1096. The result from this measurement is used to measure the position of the stage 1091 with high accuracy and thus accomplishes a registration of the stencil mask 1089. This registration will be described later in detail.

Thus, the electron beam emitted from the electron gun 1084 is transmitted through the stencil mask 1089, formed and magnified into an image on a principal plane of an objective lens 1097, further magnified by a two-step of magnifying lenses 1098 and 1099 and then enters a scintillator 1100. The scintillator 1100 converts the entering electron beam into a corresponding image of light, and thus converted image of light, after having been formed into an image by an optical lens 1101, is further converted into an electric signal by a TDI detector 1102. By processing this electric signal, a two-dimensional image involved in one region subject to the inspection on the stencil mask 1089 can be obtained.

A series of the above-described processes is applied to a row of areas subject to the inspection on the stencil mask 1089 while moving the stage 1091 in one direction and also while emitting the electron beam from the electron gun 1084. Then, the stage 1091 is shifted so that the electron beam may be irradiated onto a next row adjacent to the inspected row of areas subject to the inspection, and thereby the two-dimensional image is obtained from the TDI detector 1102. Subsequently, similar steps are repeated to obtain the two-dimensional images on the entire region subject to the inspection, and thus obtained two-dimensional images are sequentially processed to thereby provide the defect inspection of the stencil mask 1089.

A registration of the stencil mask 1089 will now be described. In order to perform the registration, firstly two patterns spaced by a known interval on the stencil mask 1089 are brought into the field of view to take a two-dimensional image thereof. After the two-dimensional image is obtained in the above manner, a magnification at the time when the region on the stencil mask 1089 subject to the inspection appears in the two-dimensional image is measured and stored. This stored magnification, said interval and the number of pixels existing within said interval are used to calculate a size per pixel, $\alpha$, (nm/pixel), which is stored, as well.

Then, the stage 1091 is moved and the two-dimensional images of the patterns at two different locations on the stencil mask 1089 are obtained, wherein the position of the stage 1091 at the time when each of the two-dimensional images has been taken is measured by the above-described laser measuring machine and stored. Consequently, from the thus obtained two-dimensional images, the respective positions of the stage and said size, $\alpha$, a positioning of the stencil mask 1089 and its reference position can be determined accurately. The registration is thus completed.

Thus, the two-dimensional image of improved S/N ratio can be obtained by integrating the image signal along the direction of the movement of the stage 1091, said image signal having been obtained in association with the movement of the stage 1091 by the TDI detector 1102 while continuously moving the stage 1091 in one direction along the pattern on the stencil mask 1089 based on the registration that has been determined as described above. Once the scanning of the one row of the areas subject to the inspection is completed in this way, the next row adjacent to the scanned row is then scanned in a similar manner to obtain a two-dimensional image thereof. The TDI detector 1102 can inspect the pattern on the stencil mask 1089 for any defects existing therein by comparing the obtained two-dimensional image with that of the reference pattern accumulated in the memory (not shown) of the computer.

As described above, since in the fifth embodiment of the present invention, the size per pixel, $\alpha$, determined in the above-designated procedure is used prior to the registration, therefore accurate registration can be achieved even if the magnification varies. It is to be noted that if the magnification goes out of the acceptable range, the magnification may be adjusted to the acceptable value by zooming the magnifying lenses 1098 and 1099.

Figure 21:
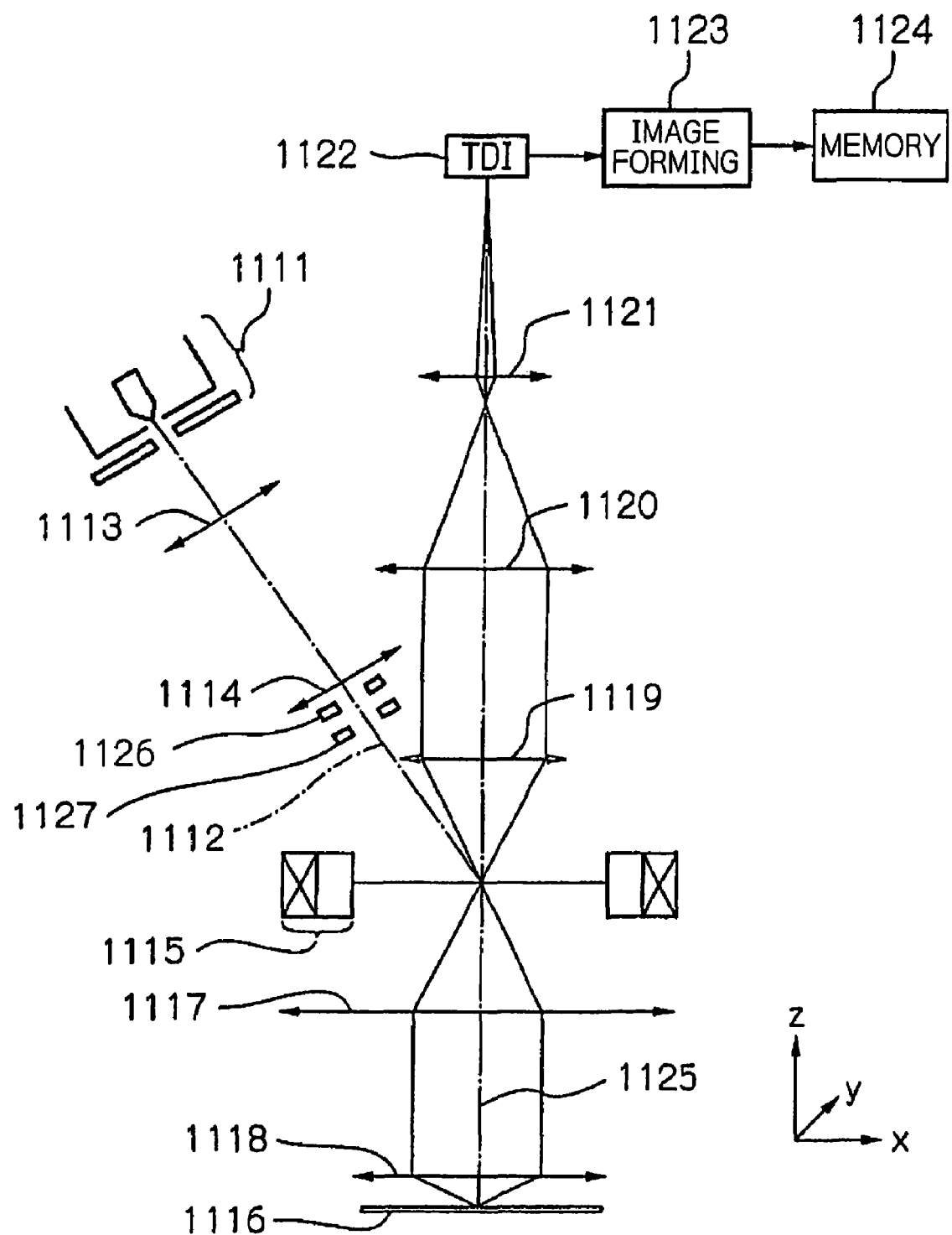
FIG. 21 is a schematic diagram showing a sixth embodiment of a defect inspection apparatus according to the present invention, in which a sample is not transmittable to an electron beam.

FIG. 21 is a diagram schematically showing a configuration of a sixth embodiment of an electron optical device 70*e* used in a defect inspection apparatus according to the present invention. In FIG. 21, the object to be inspected is a wafer of non-transmittance. The configuration of the sixth embodiment will be described below in combination with an inspection procedure executed in the apparatus. In FIG. 21, an electron beam emitted from an electron gun 111, in which a thermionic emission cathode is operated in the space-charge-limited condition, is shaped into a rectangle by a condenser lens 113, an irradiating lens 114, a beam shaping aperture (not shown) and an NA aperture (not shown), all of which are disposed along an optical axis 1112 of a primary optical system, and the shaped beam now enters an E×B separator 1115. Then, an advancing heading direction of the electron beam is deflected from the optical axis 1112 to a direction vertical to the wafer, and the electron beam passes through an objective lens doublet consisting of a first objective lens 1117 and a second objective lens 1118 for irradiating the wafer 1116. Similarly to FIG. 20, the wafer 1116 is fixedly secured to a stage (not shown), and the position of the stage is observed by a laser measuring machine (not shown).

Secondary electrons emanated from the wafer 1116 by the irradiation of the electron beam is magnified by the first objective lens 1117, the second objective lens 1118 and a image projection optical system composed of three magnifying lenses 1119, 1120 and 1121. The thus magnified electron beam is detected by a TDI detector 1122 having a sensibility to the electron beam and converted to the corresponding electric signal. This electric signal is supplied to an image forming circuit 1123, and a two-dimensional image corresponding to the secondary electrons emanated from the wafer 1116 is formed. This two-dimensional image is accumulated in a pattern memory 1124.

The description will be now directed to how to obtain the two-dimensional images from an entire area subject to the inspection of the wafer 1116. In FIG. 21, assuming a coordinate system that takes the optical axis 1125 of the secondary optical system as the Z-axis, defines the X-axis to be normal to the Z-axis and parallel to the sheet surface of FIG. 21, and defines the Y-axis to be normal to both the Z- and the X-axes, the electron beam emitted from the electron gun 1111 is shaped into a rectangle as described above to irradiate a rectangular area 1131 elongated in the Y-axial direction on the surface of the wafer 1116 (i.e., a shaded portion in FIG. 22(A)). This area 1131 is, in association with the deflecting operation of the electron beam by the deflectors 1126 and 1127, moved in the X-axial direction by a distance corresponding to a width 1132 of a stripe of the pattern formed on the wafer 1116. This allows the segment elongated in the X-axial direction (referred to as a scanning field) 1133 on the surface of the wafer 1116 to be scanned, while at the same time, the wafer 1116 is moved continuously in the Y-axial direction along with the stage. In this manner, a single stripe on the wafer 1116 is scanned in the X- and the Y-axial directions, and in association with this scanning, an image of the secondary electrons emanated from the wafer 1116 is obtained, thus completing the scanning of said stripe. Then, the stage is shifted in the X-direction by a distance equal to the width of a single stripe, and the scanning of the next stripe is carried out so as to take the next image.

Since the surface of the wafer 1116 is not necessarily flat, in the illustrated sixth embodiment of the present invention, a focusing condition on the sample surface has been measured and stored prior to the image taking. To measure this focusing condition, in one example, a density distribution over the surface of the wafer 1116 is observed. To achieve this, the image in the scanning field 1135, which contains an adequate pattern 1134, is obtained within the surface of the wafer 1116, as shown in FIG. 22(B), to thereby measure the density distribution in the X-axial direction. It is herein assumed that the result is the measured density distribution 1136 shown in FIG. 22(C). Then, a distance Δx in the scanning field 1135 corresponding to a rise-up of the density from 12% to 88% is calculated. This distance Δx is calculated at each time when a voltage $V_{48}$ applied to the objective lens 1118 is changed so as to obtain a characteristic curve 1137 indicating a relationship between the Δx and the $V_{48}$ as shown in FIG. 22(D), and then a voltage value $V_{48}$(min) applied to the objective lens 1118 where the curve 1137 indicates a minimum value is determined. Thus, the voltage value for one of the scanning field is determined. Such an operation is applied to the entire area subject to the inspection on the wafer 1116, and thereby respective scanning fields and the voltage values $V_{48}$(min) for these scanning fields are determined.

Then, the registration of the wafer 1116 is performed in a similar procedure as described with reference to FIG. 20. First of all, two patterns with a known interval on the sample are introduced into a single field of view and a two-dimensional image is taken. After the two-dimensional image is obtained in this manner, a magnification at the time when the region subject to the inspection on the wafer 1116 appears in the two-dimensional image is measured and stored. This stored magnification, said interval and the number of pixels existing in this interval are used to calculate a size per pixel α(nm/pixel) in the wafer 1116, which is also stored.

Then, the stage is moved and the two-dimensional images of the patterns at two different locations on the wafer 1116 are obtained, while the position of the stage at the time when each of the two-dimensional images is taken is measured by the above-described laser measuring machine and stored. Consequently, from thus obtained two-dimensional images, the respective positions of the stage and said size α, the positioning of the wafer 1116 and its reference position can be determined accurately. The registration is thus completed.

Since the size per pixel α, determined in the above-designated procedure is used to perform the registration, accurate registration can be achieved even if the magnification varies. It is to be noted that if the magnification goes out of the acceptable range, the magnification may be adjusted to the acceptable value by zooming the magnifying lenses 1120 and 1121.

Thus, the two-dimensional image of which S/N ratio is improved can be obtained by integrating the image signal along the direction of the movement of the stage, said image signal having been obtained in association with the movement of the stage by the TDI detector 1122 while continuously moving the stage in one direction along the pattern on the wafer 1116 based on the registration that has been determined as described above. Once the scanning on one row of the areas subject to the inspection is completed in this way, the next row adjacent to the scanned row is then scanned in a similar manner to obtain a two-dimensional image thereof. The TDI detector 1122 can inspect the pattern on the wafer 1116 for any defects existing therein by comparing the obtained two-dimensional image with that of the reference pattern accumulated in the memory (not shown) of the computer. In this way, when the two-dimensional image of the wafer 1116 is to be obtained, in each scanning field, or in each position of the stage, the excitation voltage of the objective lens 1118 is set to the previously determined voltage value, $V_{48}$(min). This allows the two-dimensional image to be obtained under a condition where the lens in the image projection optical system satisfies the focusing condition thereof.

It is to be noted that the fifth and the sixth embodiments according to the present invention are not limited to those described above. For example, in the case of the electron optical device having the configuration as shown in FIG. 21, a description has been given, by way of example, to the procedure for setting the lens to satisfy the focusing condition to take the two-dimensional image from the sample of non-transmittance, such as a wafer, but even in the case of a transmittable sample represented by a stencil mask, the electron optical device having the configuration as shown in FIG. 20 may be used to set the lens to satisfy the focusing condition by executing the similar procedure.

Figure 23:
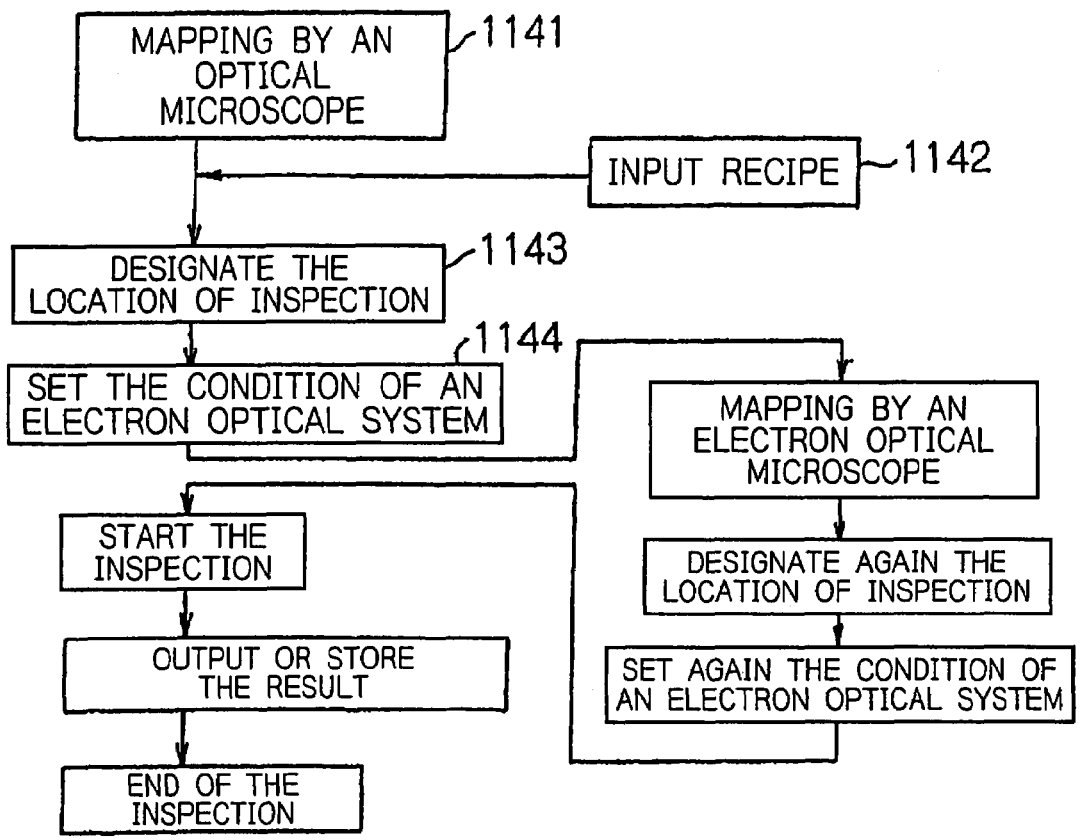
FIG. 23 is a chart for illustrating a flow of inspection procedure in a semiconductor device manufacturing method.

Turning now to FIG. 23, an inspection procedure in an inspection process of a wafer will be explained. For the reason that a defect inspection apparatus using an electron beam is typically expensive and its throughput is relatively low as compared to other processing apparatuses, in the current circumstances, it is used after the essential processes considered to need the inspection most (e.g., the etching, the film deposition or the CMP (Chemical Mechanical Polishing) flattening processes), or in the wiring process especially in the fine pitch wiring process, or the first and second wiring processes and a gate wiring process prior thereto.

The wafer to be inspected is, after having been aligned on an ultra-precision X-Y stage via an atmospheric transfer system and a vacuum transfer system, fixed by an electrostatic chuck mechanism or the like, to which the defect inspection or the like may be applied in accordance with a procedure shown in FIG. 23. Firstly, an optical microscope is used to perform a position recognition of each die and/or a detection of height of each location, as desired, which are then stored (Step 1141). The optical microscope additionally takes any other optical microscopic images of desired locations, such as defects which may be also used in the comparison with an electron beam image. Secondly, information on recipe in association with the type of wafer (e.g., after which process?, wafer size 200 mm? or 300 mm? and so on) is input to the apparatus (Step 1142), and then, after completing the steps of specifying an inspection site (1143), setting an electron optical system (Step 1143) and setting an inspection condition (Step 1144) and so on, a defect inspection is performed while executing the image taking, typically in real time. The cell-to-cell comparison, die-to-die comparison and the like may be executed for inspection by a high-speed information processing system containing an algorithm, and the result may be output to a CRT or the like and/or stored in a memory appropriately as desired.

The defect may include a particle defect, an abnormal shape (a pattern defect), an electrical defect (including disconnection in a wiring or a via and bad conduction) and so on, and those defects can be distinguished and/or the classification of the size of the defect and the identification of a killer defect (a serious defect making the chip no longer usable) can be carried out at real time. The detection of the electrical defect may be achieved by detecting an abnormal contrast. For example, the location of bad conduction can be distinguished from the location of normal conduction from the fact that the former is typically charged to be positive by the irradiation of an electron beam (at about 500 eV) and thereby the contrast is deteriorated. As an electron beam irradiation means for applying the charge, a low potential (low energy) electron beam generating means (for emitting thermion, UV/photoelectron) may be installed for emphasizing the contrast owing to a potential difference, in addition to an electron beam irradiating means used for a typical inspection. Prior to the irradiation of the electron beam for the inspection onto a region subject to the inspection, this low potential (energy) electron beam is generated and irradiated thereto. In the case of the image projection method, which can charge the wafer to be positive by irradiating the electron beam for the inspection onto the wafer, depending on the specification thereof, the electron beam generating means of low potential need not be installed additionally. Further, the defect can be detected from a difference in contrast (resultant from a difference in flowability depending on the forward or backward direction of the device) caused by applying a positive or negative potential relative to a reference potential to a sample such as a wafer. This is applicable to a line width measuring apparatus and an overlay accuracy measuring, as well.

Figure 24:
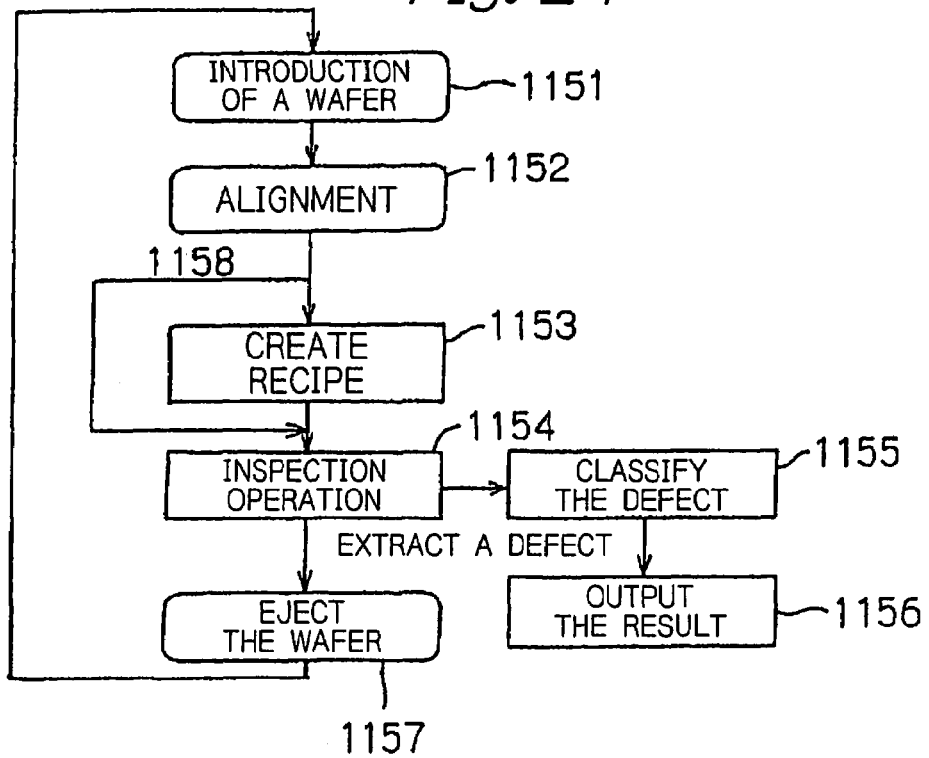
FIG. 24 is a chart for illustrating a basic flow of inspection procedure in the semiconductor device manufacturing method.

The inspection of a sample, such as a wafer, by using an electron beam can be performed in accordance with a basic procedure as shown in FIG. 24. Firstly, in Step 1151, the wafer is introduced onto a stage by a transfer mechanism. Typically, a plurality (e.g., 25 pieces) of wafers to be inspected are accommodated in a cassette holder and one or more of them are simultaneously taken out of it and mounted on the stage of a defect inspection apparatus, wherein, since the defect inspection apparatus is installed in a housing kept in a vacuum condition, a device for interfacing between the atmosphere and the vacuum is necessary in order to carrying out the operation for taking the wafer subject to the inspection out of the cassette holder and mounting it on the stage and the operation for taking the wafer having finished with the inspection out of the housing. To this end, when the wafer is to be introduced, the wafer that has been taken out of the cassette holder is firstly cleaned in a mini-environment unit and then transferred into a loading chamber. Since the loading chamber is coupled with the housing via a shutter, once the wafer is transferred into the loading chamber, the loading chamber is evacuated into vacuum. After the loading chamber is evacuated to vacuum, the shutter is opened so as to allow a communication between the loading chamber and the housing, wherein the wafer finished with the inspection is removed from the stage and taken out of the housing, while at the same time, another wafer to be inspected is transferred from the loading chamber to the housing and then loaded on the stage.

Next, in step 1152, an aligning operation is performed so as to make the wafer aligned. When the wafer is loaded on the stage from the loading chamber, usually, the X- and the Y-axes of a die on the wafer are not in conformity with the moving direction of the stage or the scanning direction of the electron beam. In this condition, in order to perform an accurate inspection for the die on the wafer, firstly the wafer is rotated on the stage to compensate for an angular misalignment of the die so that the axes defining the die on the wafer are matched with the moving direction of the stage or the scanning direction of the electron beam. This operation is referred to as an alignment operation.

After the alignment operation of Step 1152, Step 1153 for creating the recipe to set a condition or the like on the inspection is performed. At least one type of recipe is necessary for the wafer subject to the inspection, while in order to satisfy a plurality of conditions on the inspection, occasionally a plurality of recipe may be prepared for a single wafer subject to the inspection. Further, if there is a plurality of wafers subject to the inspection, which have identical patterns, only one recipe may be used for the inspection of said plurality of wafers. In the case of the inspection using the previously created recipe, it is not necessary to create a new recipe before the inspection operation.

Next, in Step 1154, the inspection operation is carried out in accordance with the condition and sequence defined in the recipe, and thus the wafer is inspected. The defect extraction is executed immediately upon each discovery of the defect during the inspection operation, and the extracted defect is classified in Step 1155, in which the data on the location and others of the extracted defect is accumulated together with the classification data and the image of the defect, while the defect information, such as the location of the defect, on the extracted defect may be displayed on the operating screen (Step 1156). In this way, when the inspection of the wafer is completed, the wafer is ejected (Step 1157), and the next wafer is transferred in position, on which a series of above steps are repeated. It is to be noted that the path 1158 indicates that if the previously prepared recipe is used in the inspection, the creation of a new recipe is not necessary prior to the inspection operation.

In FIG. 24, the inspection operation (Step 1154) executes the inspection of the wafer in accordance with the condition and sequence described in the recipe. The defect extraction is executed immediately at each time when the defect is found during the inspection operation, and the following operations from a) to c) are performed substantially in parallel.

a) The defect classification (Step 1155) is executed, and the data on the extracted defect and the data on the defect classification are added to a file for outputting the result.

b) An image of the extracted defect is added to a file for outputting the result exclusively for the image or the file for outputting the result specified in said a) (Step 1156).

c) The defect data such as the location of the extracted defect is indicated on the operating screen.

Once the inspection has been completed as per each wafer subject to the inspection, then the following operations from a) to c) are performed substantially in parallel.

a) The file for outputting the result is closed and saved.

b) When the external communication requests the inspection result, in response thereto the inspection result is sent.

c) The wafer is ejected.

In the case where the serial inspection of the wafers is set, the next wafer to be inspected is transferred and the above operations are repeated.

The flow in FIG. 24 will be described further in detail.

(1) Making of Recipe (Step 1153)

The recipe is a file for setting a condition or the like involved in the inspection and also can be saved. The recipe is used during or before the inspection so as to make a setting for the apparatus, and the condition on the inspection defined in the recipe includes:

a) The die subject to the inspection;

b) The region subject to the inspection within the die;

c) The inspection algorithm;

d) The condition for detection (conditions required in the defect extraction, including the inspection sensibility and the like); and e) The condition for observation (conditions required in the observation, including the magnification, the lens voltage, the stage speed, the sequence of inspection and so on). The inspection algorithm of c) will be described later more specifically.

Figure 25:
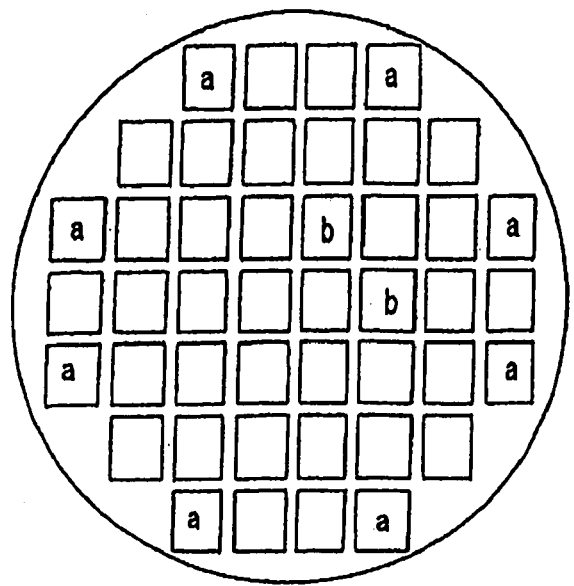
FIG. 25 is a diagram showing a setting of dies subject to an inspection.

Among those items listed above, the setting of the die subject to the inspection may be performed by an operator who designates the die to be inspected on a die map diagram displayed in the operating screen, as shown in FIG. 25. In the example illustrated in FIG. 25, the die "a" located in an edge area of the wafer and the die "b" that has been determined to be defective beyond any doubt in the previous step are grayed out to preclude them from the inspection, and the rest of the dies are subject to the inspection. The apparatus further includes a function for designating the die subject to inspection automatically based on the distance from the edge of the wafer and/or the information on whether the die is good or bad, which has been detected in the previous step.

Figure 26:
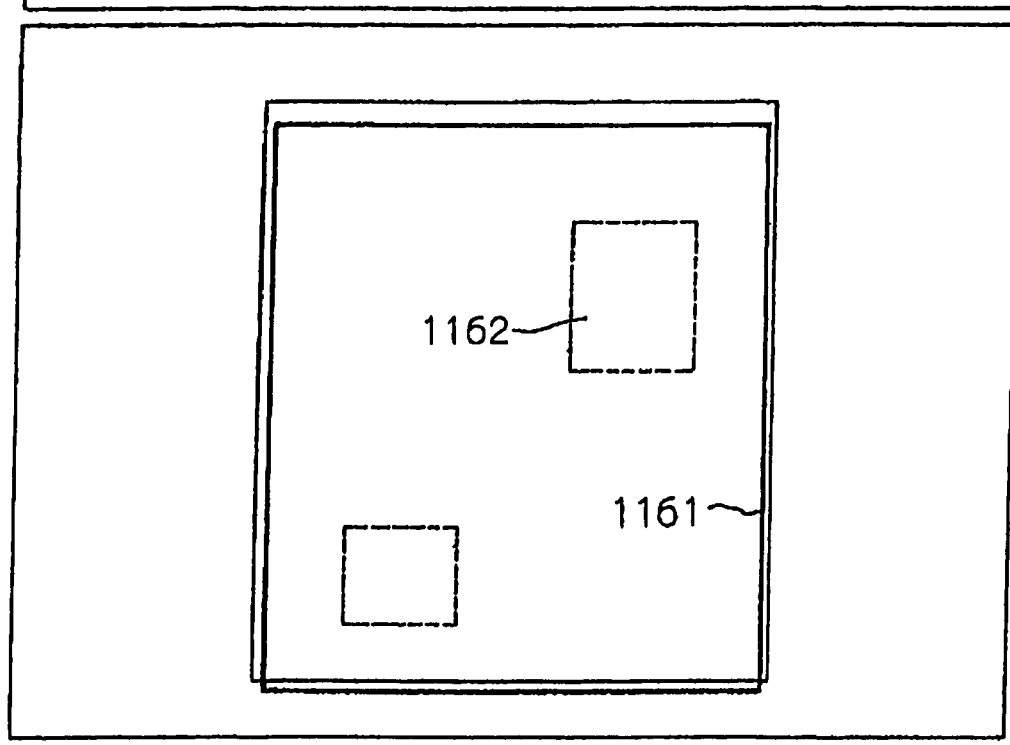
FIG. 26 is a diagram showing the setting of an inspection area in the die.

Further, to set the region subject to the inspection within the die, the operator may designate the region subject to the inspection on a diagram for setting a region to be inspected within the die displayed in the operating screen by using an input device, such as a mouse, based on the image obtained by the optical microscope or the EB microscope. In the example illustrated in FIG. 26, the region 1161 indicated by the solid line and the region 1162 indicated by the broken line have been set as the regions subject to the inspection.

The region 1161 includes substantially entire area of the die that has been set as the region subject to the inspection. The inspection algorithm specifies the adjacent die comparison method (i.e., the die-to-die inspection), in which the details of the condition on the detection and the condition on the observation applied to this region may be separately established. As for the region 1162, the inspection algorithm specifies the array inspection (i.e., cell-to-cell inspection), in which the details of the condition on the detection and the condition on the observation applied to this region may be separately established. This means that it is possible to set a plurality of regions subject to the inspection, and for each of those regions subject to the inspection, the individual conditions on the inspection algorithm and/or on the inspection sensibility can be set respectively. Further, the regions subject to the inspection can be placed on one another, and in this case, different sets of inspection algorithm may be applied to the same region simultaneously.

(2) Inspection Operation (Step 1154)

Figure 27:
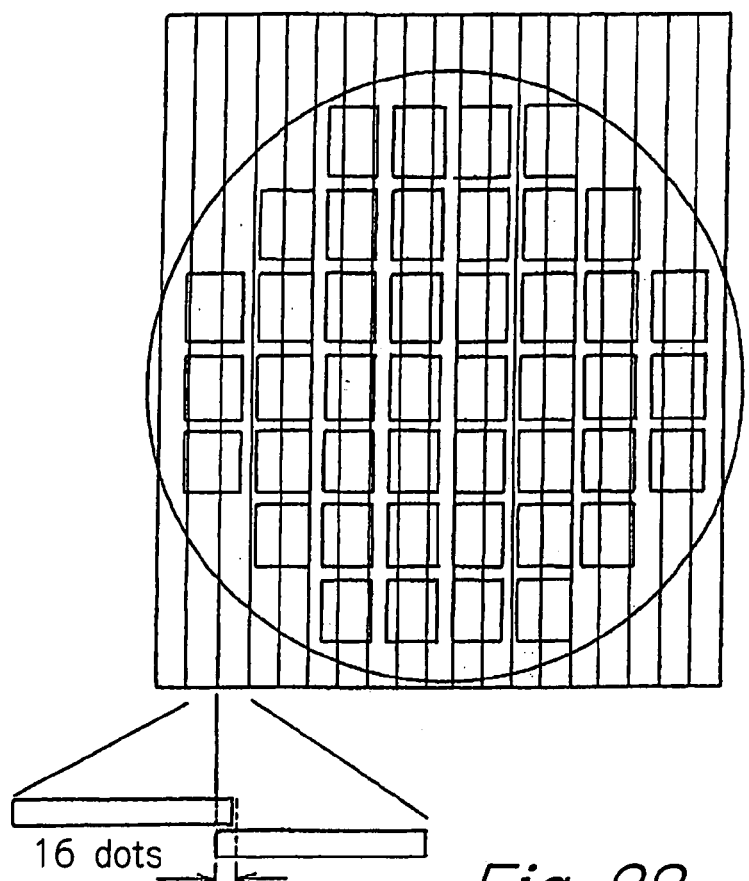
FIG. 27 is a diagram for illustrating an inspection procedure in a semiconductor device manufacturing method.

In the inspection operation, the wafer subject to the inspection is divided into segments each defined by a certain scanning width as shown in FIG. 27 and scanned. The scanning width is determined substantially based on a length of the line sensor, and the line sensor is arranged such that the end portions of the line sensor are slightly overlapped with each other. This is intended to provide a correct judgment on the continuity between lines when the detected defects are to be processed integrally in a final stage and to ensure an extra margin for the image alignment when the comparative inspection is carried out. The amount of overlapping may be about 16 dots for the 2048 dots of line sensor.

Figure 28:
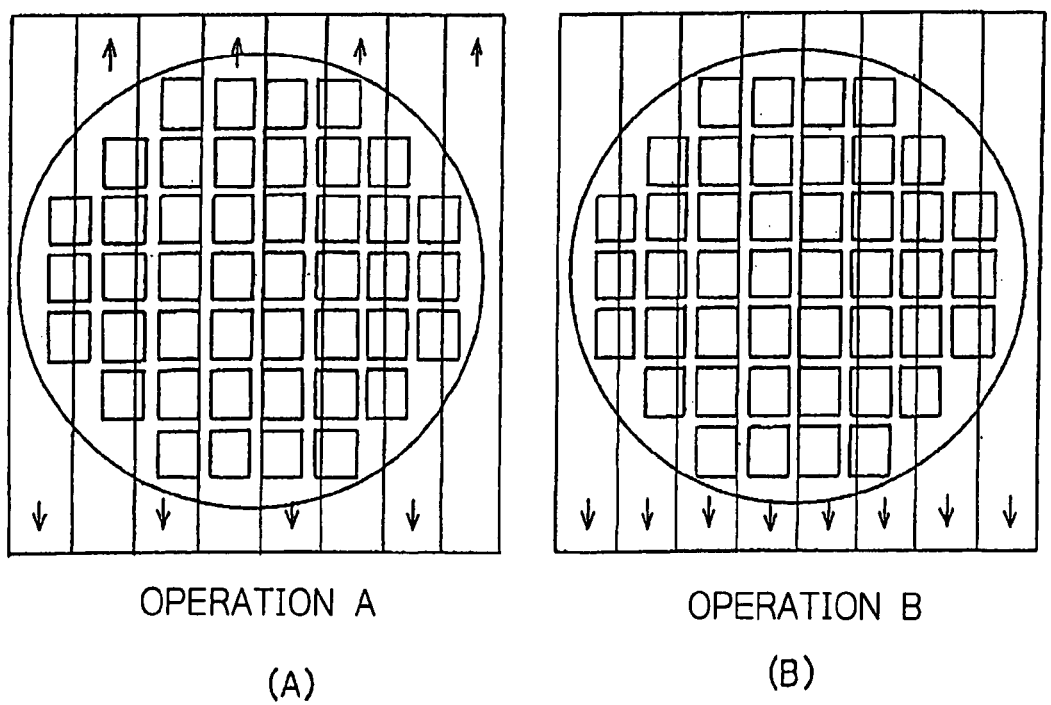
FIGS. 28(A) and 28(B) are diagrams for illustrating the inspection procedure in the semiconductor device manufacturing method.
Figure 29:
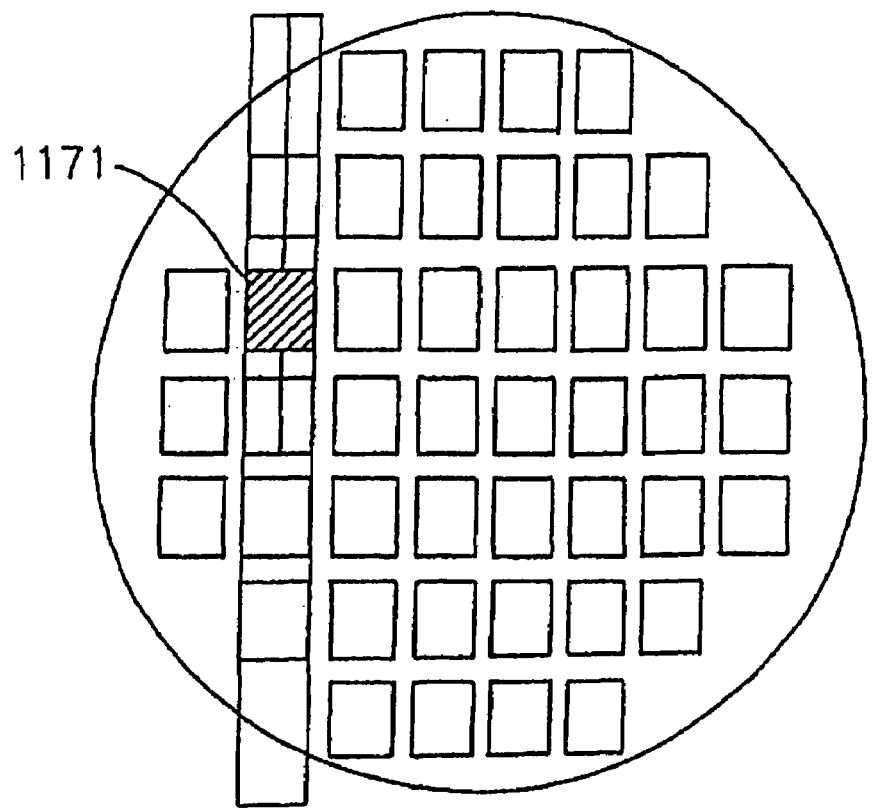
FIG. 29 is a diagram showing an example of scanning for a case of a single die to be inspected in the inspection procedure in the semiconductor device manufacturing method.

FIG. 28(A) and FIG. 28(B) schematically show the direction and sequence of the scanning operation, respectively. The operator may select either one of a bi-directional operation A aiming for reducing the inspection time or a unidirectional operation B due to the mechanical constraint. Further, the apparatus has a function for automatically calculating an operation for reducing the scanning amount based on the setting in the recipe for the die subject to the inspection and for carrying out this operation. FIG. 29 illustrates an example of scanning operation for a case where there is a single die 1171 subject to the inspection, wherein an unnecessary scanning operation is not performed.

The algorithm to be implemented in the present apparatus may be categorized principally into two types:

1. An array inspection (Cell inspection); and
2. A random inspection (Die inspection), where the random inspection may be further classified depending on the object to be compared as follows;

a) An adjacent die comparison method (Die-Die inspection);

b) A reference die comparison method (Die-Any die inspection); and c) A CAD data comparison method (Cad Data-Any Die inspection).

A method generally referred to as a golden template method includes b) the reference die comparison method and c) the CAD data comparison method, wherein in the reference die comparison method, the reference die is used as the golden template, and in the CAD data comparison method, the CAD data is used as the golden template. An operation in accordance with each algorithm will be described below.

(1) Array Inspection (Cell Inspection)

The array inspection may be applied to the inspection of a cyclic structure. One example thereof may be represented by a DRAM cell. In this inspection, an image to be inspected is compared with a reference image and a difference therebetween is extracted as a defect. The reference image and the image subject to the inspection may be either one of a two-valued image or a multi-valued image for improving the detection precision. The difference between the reference image and the image subject to the inspection may be in itself treated as the detected defect, and a secondary determination for avoiding a detection error may be further performed based on the difference data, including a differential amount of the detected difference and a total area of the pixels containing the difference.

In the array inspection, the comparison between the reference image and the image subject to the inspection may be carried out on a structural cycle basis. That is, the comparison may be performed by every structural cycle while reading out the images that have been obtained at once by a CCD, or otherwise if the reference image is defined by n structural cycles, the comparison may be performed by every n structural cycle.

Figure 30:
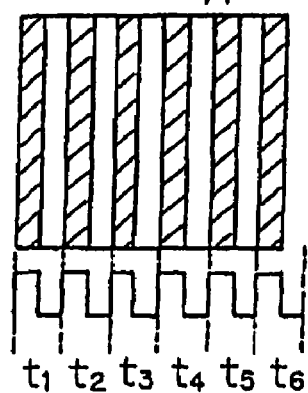
FIG. 30 is a diagram for illustrating a method for generating a reference image in the inspection procedure in the semiconductor device manufacturing method.

One example of a method for generating the reference image is shown in FIG. 30, in which an example for making the comparison by every structural cycle is illustrated so as to represent single structural cycle generation. The same method may be employed to make the number of cycles to n. On the assumption, the direction of the inspection in FIG. 30 is indicated by an arrow A. Besides, the cycle indicated by $t_4$ denotes a cycle subject to the inspection. Since the operator can input a size representing the cycle while watching the screen, therefore the cycles $t_1$ to $t_6$ can be easily identified in FIG. 30.

A reference cycle image may be generated by adding the data in the cycles $t_1$ to $t_3$ just before the cycle subject to the inspection in each pixel and averaging the result. Even if a defect is contained in either one of the $t_1$ to $t_3$ cycle images, they are averaged and consequently less affective to the outcome. Thus formed reference cycle image and the image of the cycle $t_4$ to be inspected are compared to each other to extract the defect.

In the next step, when the image of the cycle $t_5$ subject to the inspection is to be inspected, the data in the cycles $t_2$ to $t_4$ are added and averaged to thereby generate the reference cycle image. In the following steps of inspection, the reference cycle image may be generated successively in a similar manner from the images obtained before the image of the cycle to be inspected having been taken so as to continue the inspection operation.

(2) Random Inspection (Die Inspection)

The random inspection may be applied without restriction of the structure of a die. In the inspection, an image subject to the inspection is compared with a reference image as an image to be referred to and a difference therebetween is extracted as a defect. The reference image and the image subject to the inspection may be either one of a two-valued image or a multi-valued image for improving the detection precision. The difference between the reference image and the image subject to the inspection may be in itself treated as the detected defect, and a secondary determination for avoiding a detection error may be further performed based on the difference data, including a differential amount of the detected difference and a total area of the pixels containing the difference.

The random inspection may be classified based on how to determine the reference image. An operation specific to the method for determining the reference image will now be described.

A. An Adjacent Die Comparison Method (Die-Die Inspection)

Figure 31:
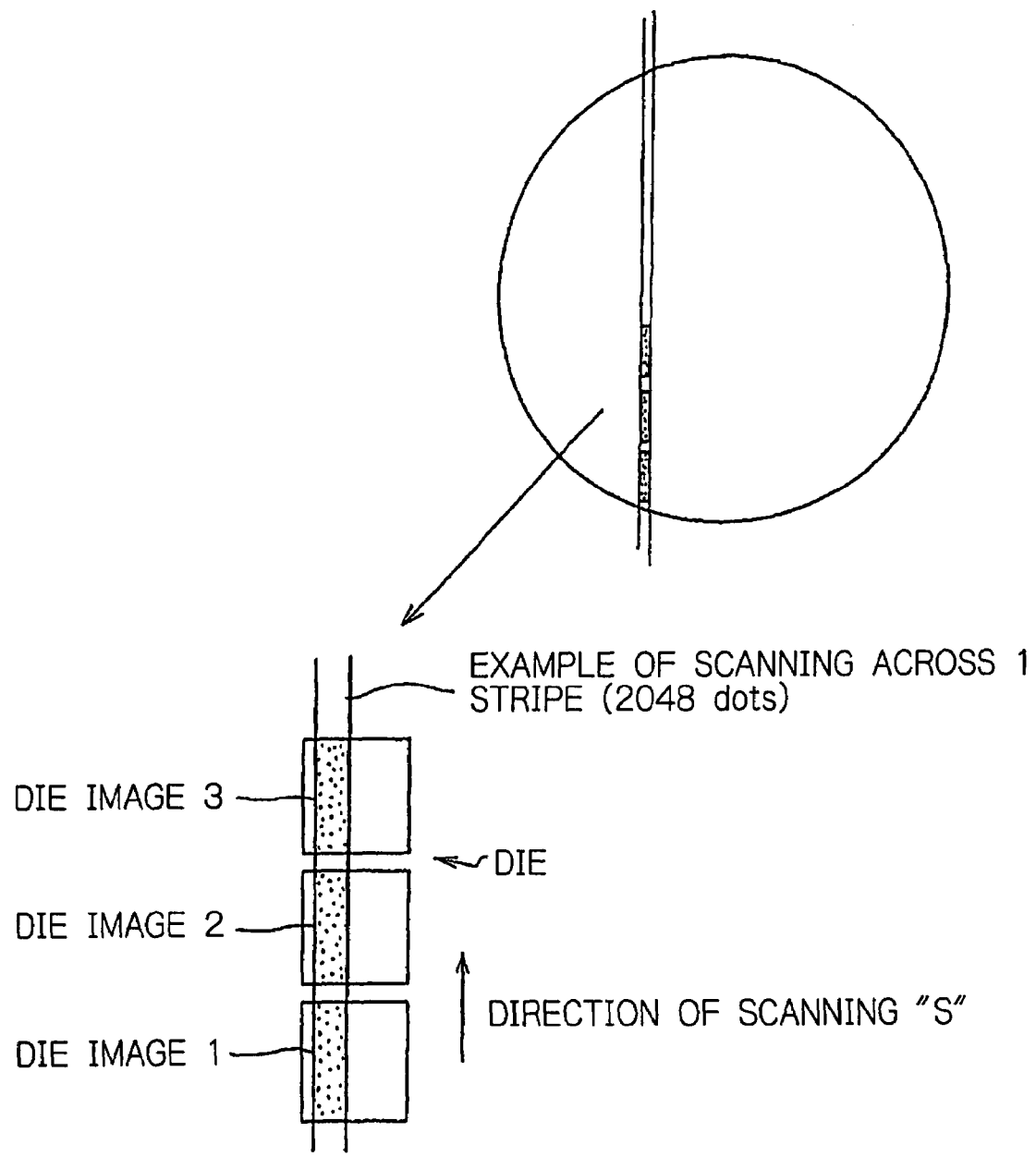
FIG. 31 is a diagram for illustrating a method for comparing one die with another die adjacent thereto in the inspection procedure in the semiconductor device manufacturing method.
Figure 32:
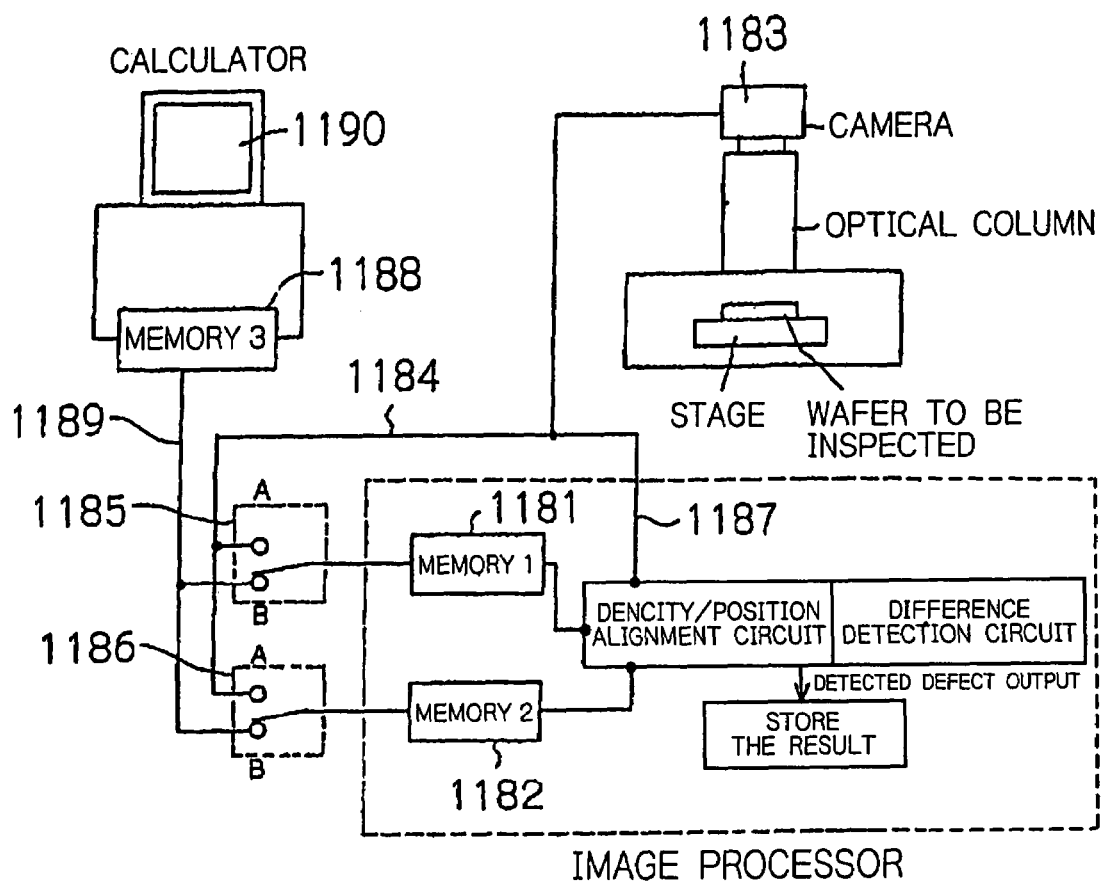
FIG. 32 is a block diagram for illustrating a system configuration for implementing the method for comparing one die with another die adjacent thereto in the inspection procedure in the semiconductor device manufacturing method.
Figure 33:
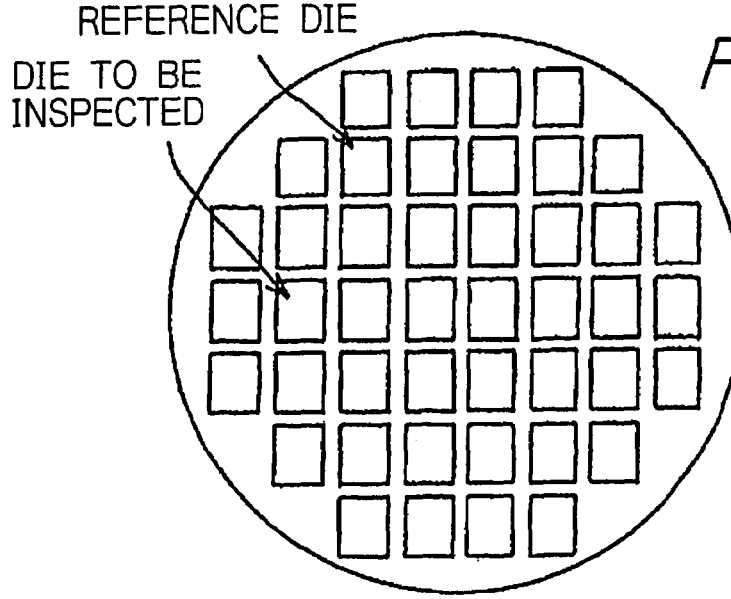
FIG. 33 is a diagram for illustrating a method for comparing one die with a reference die in the inspection procedure in the semiconductor device manufacturing method.

The reference image is an image of a die adjacent to another die whose image is to be inspected. The image of a die subject to the inspection is compared with two reference images of dies located adjacent to said die subject to the inspection to thereby determine a defect. This method is illustrated in FIGS. 31 and 32, wherein under a condition where a switch 1185 and a switch 1186 are set such that a memory 1181 and a memory 1182 of an image processor are connected to a path 1184 from a camera 1183, the following steps a) through i) are executed.

a) A step of storing a die image 1 (FIG. 31) from the path 1184 into the memory 1181 in accordance with a scanning direction "S".

b) A step of storing a die image 2 from the path 1184 into the memory 1182.

c) A step of obtaining the die image 2 from the path 1187 in synchronization with said step b), and comparing the thus obtained die image 2 with the image data stored in the memory 1181, which represent the data in the same relative position in the die, to thereby determine a difference between them.

d) A step of saving the difference from said step c).

e) A step of storing a die image 3 from the path 1184 into the memory 1181.

f) A step of obtaining the die image 3 from the path 1187 in synchronization with said step e), and comparing the thus obtained die image 3 with the image data stored in the memory 1182, which represent the data in the same relative position in the die, to thereby determine a difference between them.

g) A step of saving the difference from said step f).

h) A step of determining a defect in the die image 2 from the results stored in said steps d) and g).

i) A step of sequentially repeating said steps a) through h) on a series of dies.

Depending on the specific setting, prior to the step of determining the differences in said c) and f), the compensation may be applied so as to cancel the positional difference between two images to be compared (position alignment). Alternatively, the compensation may be applied so as to cancel the density difference therebetween (density alignment). Otherwise, both of said alignments may be applied.

B. A Reference Die Comparison Method (Die-Any Die Inspection)

Figure 34:
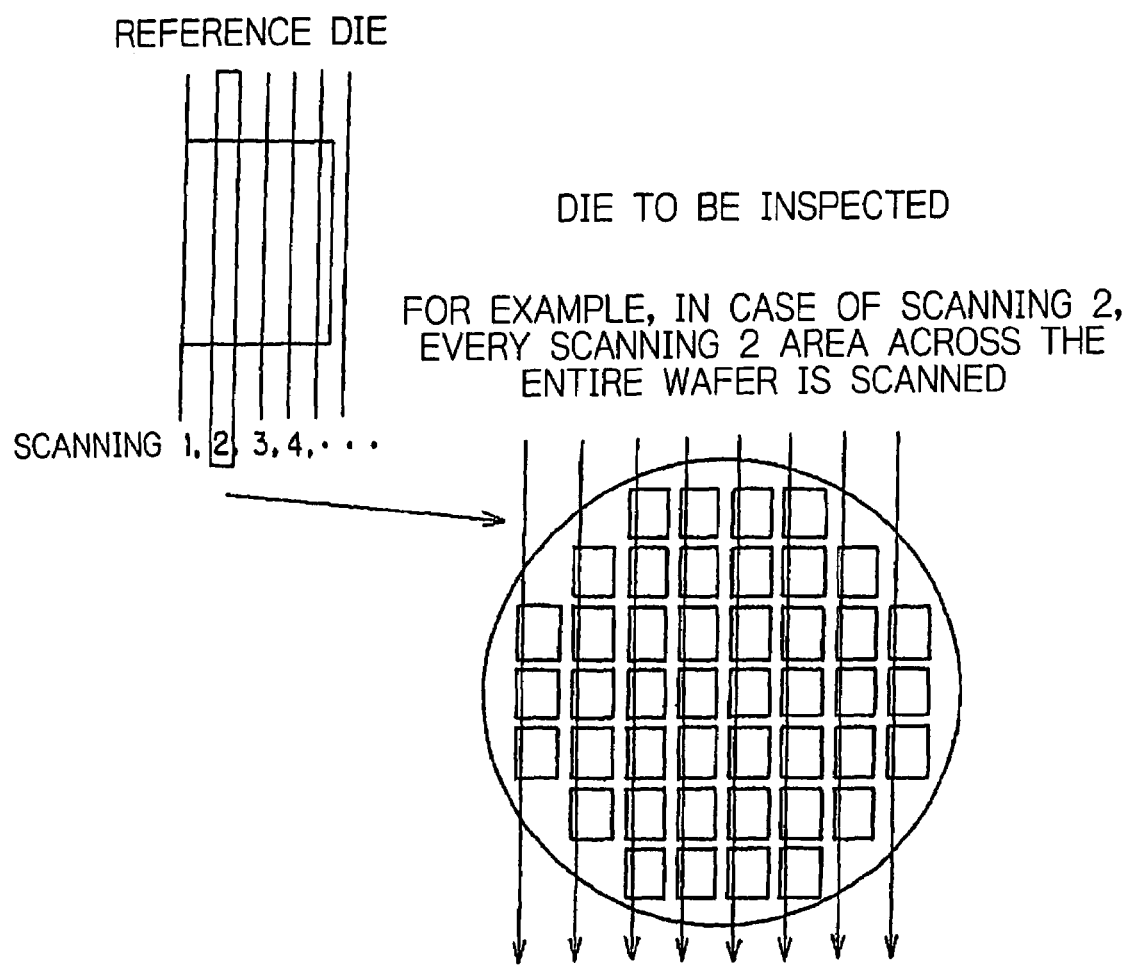
FIG. 34 is another diagram for illustrating the method for comparing one die with the reference die in the inspection procedure in the semiconductor device manufacturing method.

The operator designates a reference die. The reference die may be a die existing on the wafer or another die whose image has been stored prior to the inspection, and first of all, the reference die is scanned or the image having stored in advance is transferred so that the image may be stored in a memory as a reference image. Steps a) through h) to be carried out in this method will be described below with reference to FIGS. 31 and 32.

a) A step of selecting by the operator the reference die from the dies on the wafer subject to the inspection or from the die images having been stored prior to the inspection.

b) In the case of the reference die existing on the wafer subject to the inspection, a step of setting the switch 1185 and the switch 1186 such that at least either one of the memory 1181 or the memory 1182 of the image processor is connected to the path 1184 from the camera 1183.

c) In the case of the reference image being represented by the die image having been stored prior to the inspection, a step of setting the switch 1185 and the switch 1186 such that at least either one of the memory 1181 or the memory 1182 of the image processor is connected to the path 1189 from a memory 1188 storing the reference image representing the die image.

d) In the case of the reference die existing on the wafer subject to the inspection, a step of scanning the reference die and transferring the reference image representing the reference die image into a memory of the image processor.

e) In the case of the reference image being represented by the die image having been stored prior to the inspection, a step of transferring the reference image representing the reference die image into the memory of the image processor without any necessity for the step of scanning.

f) A step of comparing the images obtained by scanning the dies subject to the inspection in sequence with the image in the memory formed by the transferred reference image which is the reference die image and/or the image in which the data in the same relative position in the die is the same, and thereby determining a difference therebetween.

g) A step of determining a defect from the difference obtained in said step f).

h) A step of repeating said procedure as defined in the above steps d) through g) by inspecting the scanning position of the reference and the portion on the die to be inspected, which corresponds to the scanning position on the reference die, across the entire area of the wafer continuously, as shown in FIG. 34, while changing the scanning position on the reference die until the die to be inspected is entirely inspected.

Depending on the specific setting, prior to the step of determining the differences in said step f), the compensation may be applied so as to cancel the positional difference between two images to be compared (position alignment). Alternatively, the compensation may be applied so as to cancel the density difference therebetween (density alignment). Otherwise, both of said alignments may be applied.

In said step d) or e), the reference die image stored in the memory of the image processor may be an entire image of the reference die or a partial image thereof, and if the partial image of the reference die is taken as the reference die image, then the partial image of the reference die shall be renewed continuously during the inspection.

C. A CAD Data Comparison Method (CadData-AnyDie Inspection)

Figure 35:
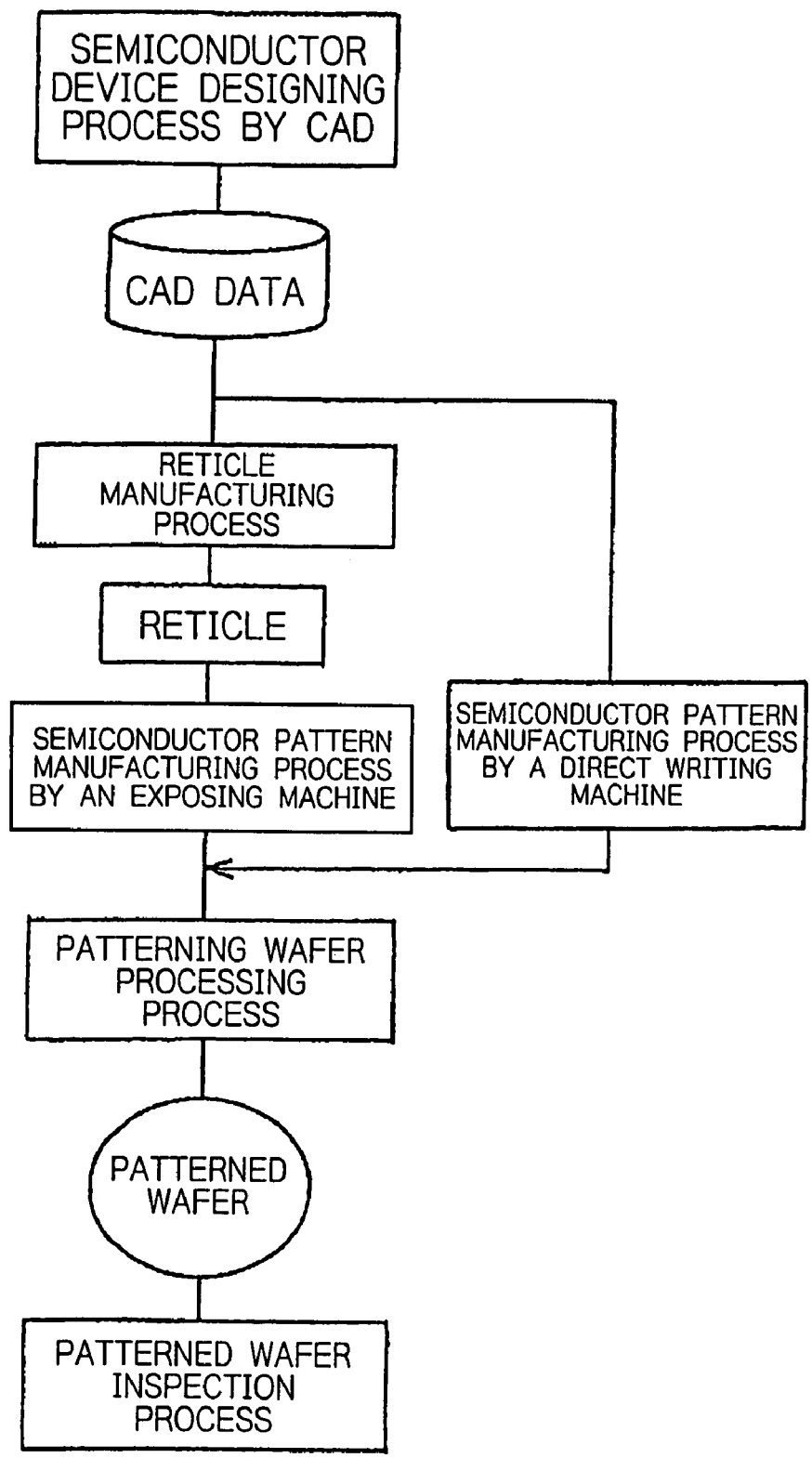
FIG. 35 is a flow chart for illustrating the method for comparing one die with the reference die in the inspection procedure in the semiconductor device manufacturing method.

In the semiconductor manufacturing process shown in FIG. 35, a reference image is made from the CAD data representing an output from the semiconductor pattern designing step by the CAD, as an image to be referred to. The reference image may an entire image of the die or a partial image thereof containing the area to be inspected.

Since the CAD data is typically represented by the vector data, it cannot be used directly as the data for the reference image, unless it is converted to the raster data corresponding to the image data obtained by the scanning operation. Accordingly the vector data representing the CAD data should be converted into the raster data, and this conversion may be executed for each unit defined by the scanning width of the image obtained by scanning the die subject to the inspection during the inspection. At that time, the conversion may be applied to the image data representing the same relative position on the die as of an image expected to be obtained by scanning the die subject to the inspection. The inspection scanning and the conversion task may be performed as they are overlapped.

The above conversion task from the vector data to the raster data may be added with at least one of the following functions:

a) A function of making the raster data multi-valued;

b) A function of, in conjunction with said a), setting a gradient weighting and/or an offsetting in making the data multi-valued, by taking the sensibility of the inspection apparatus into account; and c) A function of, after the vector data is converted into the raster data, performing an image processing for processing pixels, including expanding and contracting of the pixels.

In FIG. 32, the inspection steps by way of the CAD data comparison method include the following steps a) through f):

a) A step of converting the CAD data into the raster data by a calculator 1190, and making a reference image with said additional function and storing it in the memory 1188;

b) A step of setting the switch 1185 and the switch 1186 such that at least either one of the memory 1181 or the memory 1182 of the image processor is connected to the path 1184 from the memory 1188;

c) A step of transferring the reference image in the memory 1188 to a memory in the image processor;

d) A step of comparing the images obtained by scanning the dies subject to the inspection in sequence with the image in the memory formed by the transferred reference image and/or the image in which the data in the same relative position in the die is the same, and thereby determining a difference therebetween.

e) A step of determining a defect from the difference obtained in said step d); and f) A step of repeating said procedure as defined in the above steps a) through e) by inspecting the scanning position of the reference die and the portion on the die to be inspected, corresponds to the scanning position on the reference die, across the entire area of the wafer continuously, as shown in FIG. 34, while changing the scanning position on the reference die until the die to be inspected is entirely inspected.

Depending on the specific setting, prior to the step of determining the differences in said d), the compensation may be applied so as to cancel the positional difference between two images to be compared (position alignment). Alternatively, the compensation may be applied so as to cancel the density difference therebetween (density alignment). Otherwise, both of said alignments may be applied.

In said step c), the reference die image stored in the memory of the image processor may be an entire image of the reference die or a partial image thereof, and if the partial image of the reference die is taken as the reference die image, then the partial image of the reference die shall be renewed continuously during the inspection.

(3) Focus Mapping

Figure 36:
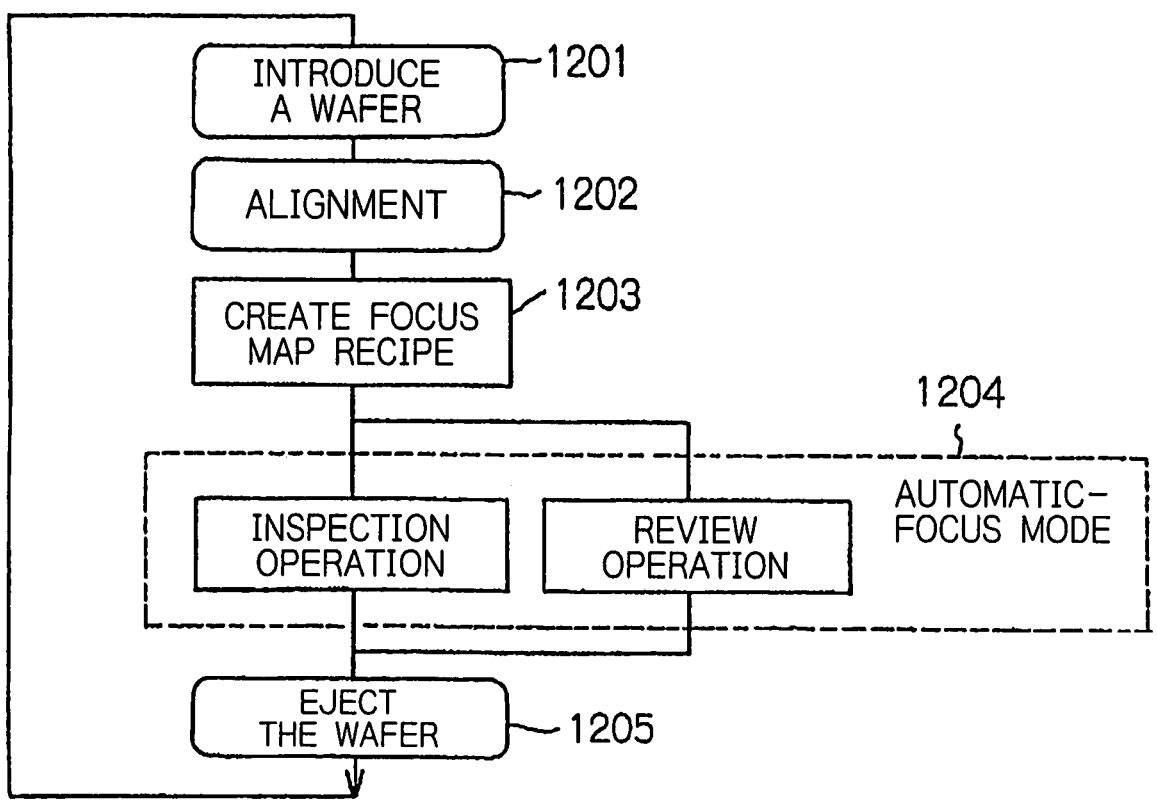
FIG. 36 is a flow chart for illustrating a focus mapping in the inspection procedure in the semiconductor device manufacturing method.

FIG. 36 shows a basic flow of the focusing function. Firstly, after a wafer transfer (Step 1201) including an alignment operation (Step 1202), a recipe is made, which specifies a condition and the like on involving the inspection. One of the recipes is a focus map recipe, and according to the focusing information specified in this recipe, an inspection operation and a reviewing operation are executed in the automatic-focusing mode (Step 1204). After this, the wafer is ejected (Step 1205). A procedure for making the focus map recipe along with a procedure for operating the automatic-focusing will be described below.

1. Procedure for Making the Focus Map Recipe

Figure 37:
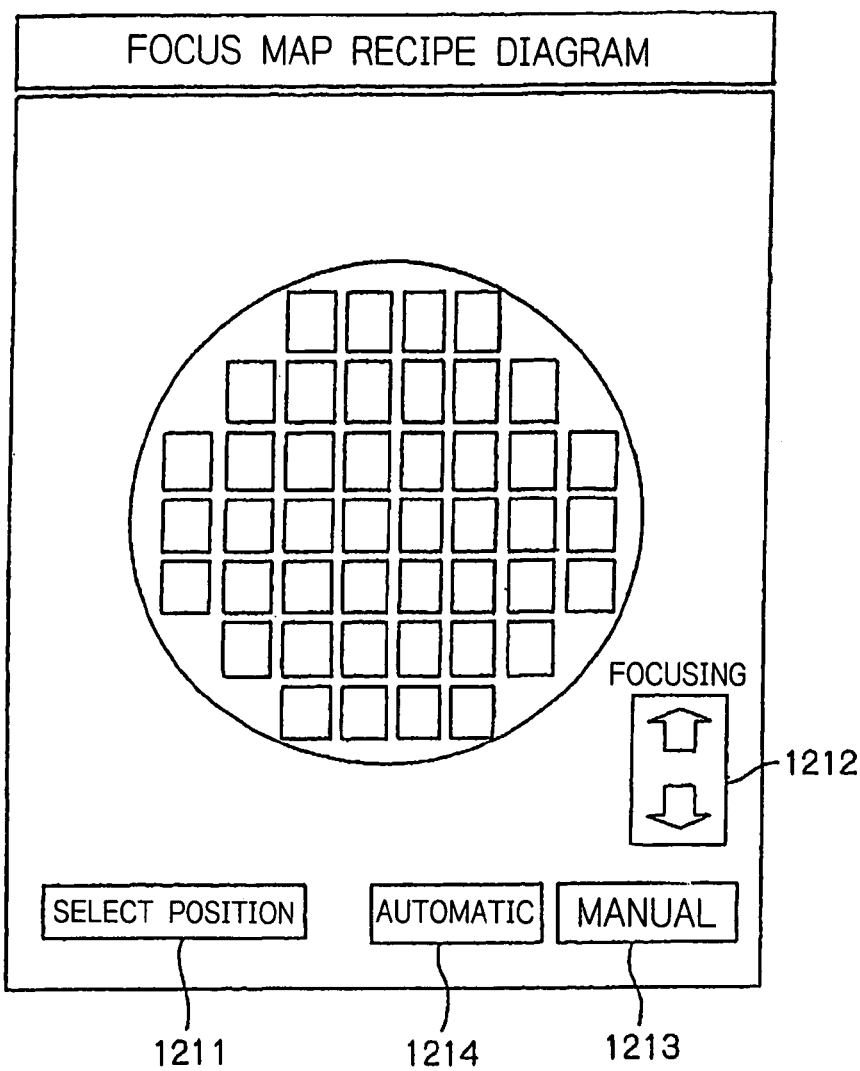
FIG. 37 is a diagram for illustrating the focus mapping in the inspection procedure in the semiconductor device manufacturing method.

The focus map recipe has its independent input screen, and the operator can make the recipe by executing the following steps a) through c).

a) A step of inputting a focus map coordinate, such as a position of die and/or a pattern in a die, to which the focus value is to be input by means of a position selecting switch 1211 of FIG. 37;

b) A step of setting a die pattern, which is required in automatic measuring of the focus value (it is to be noted that this step may be skipped if the focus value is not measured automatically); and c) A step of setting a best focus value on the focus map coordinate determined in said step a).

It is to be noted that in said step a), the operator can designate any desired die, and alternatively it is possible to make a setting such that the operator may select all of the dies or every n pieces of dies. Further, the operator can select as an input screen a diagram schematically representing an array of dies within the wafer or an image using an actual image.

In said step c), the operator can set the best focus value on manual by using a manual switch 1213 in FIG. 37, or can select and set it automatically by using a focus switch 1212 operative in association with the voltage value of a focusing electrode or by using an auto-switch 1214.

2. Procedure for Measuring the Focus Value

Figure 38:
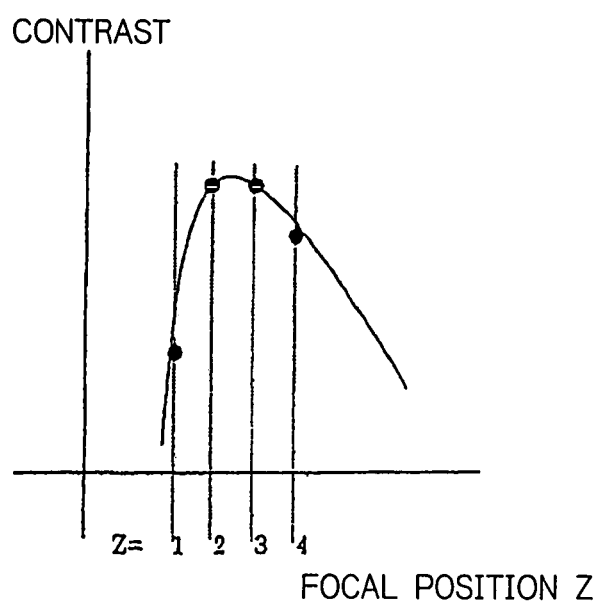
FIG. 38 is a graphical representation for illustrating the focus mapping in the inspection procedure in the semiconductor device manufacturing method.

An exemplary procedure for automatically determining a focus value in said step c) includes:

a) A step of obtaining an image with the focus position Z=1 and calculating its contrast, as shown in FIG. 38;

b) A step of performing said step a) with respect to Z=2, 3 and 4, respectively;

c) A step of determining a contrast function through a regression from the contrast values obtained in said steps a) and b), and d) A step of determining by an arithmetic operation the Z that can give a maximum value of the contrast function, and setting this value as the best focus value.

For example, if such a line and a space as shown in FIG. 39 are chosen as the die pattern necessary for automatically measuring the focus value, a good result will be obtained. The contrast is measurable, if it includes a black and white pattern, regardless of its shape.

By executing the above steps a) through d), the best focus value on one point can be determined. A data format at this time is represented by (X, Y, Z), or a set of the coordinate XY used in the determination of the focus with the best focus value Z, meaning that the focus map coordinate number (X, Y, Z) determined in the focus map recipe is existing. This is a part of the focus map recipe, and is referred to as a focus map file.

3. Procedure for Operating the Automatic-focusing

A method for setting the best focus based on the focus map recipe, during the inspection operation for obtaining an image and the reviewing operation, may be performed in a following manner.

Firstly, the position data is further subdivided based on the focus map file 1 made at the time of making the focus map recipe, and the best focus at that time is determined by the calculation to thereby make a subdivided focus map file 2. This calculation is executed by using an interpolation function, which may be specified by the operator during making the focus map recipe, for example, as a linear interpolation, a spline interpolation or the like. Secondly, the XY position of the stage is monitored, and a voltage to be applied to the focusing electrode is changed to the focus value specified in the focus map file 2.

To explain more specifically, in FIGS. 40(A) through (C), assuming that a black dot indicates the focus value in the focus map file 1 and a white dot indicates the focus value in the focus map file 2, then the focus values in the focus map file is used to interpolate the focus values in the focus map file, and the Z coordinate of the focusing position is changed in association with the scanning so as to maintain the best focusing. At that time, in the space between the specified points (indicated by the white dots) in the focus map file, a current value is used until the next changing point is encountered.

Figure 41:
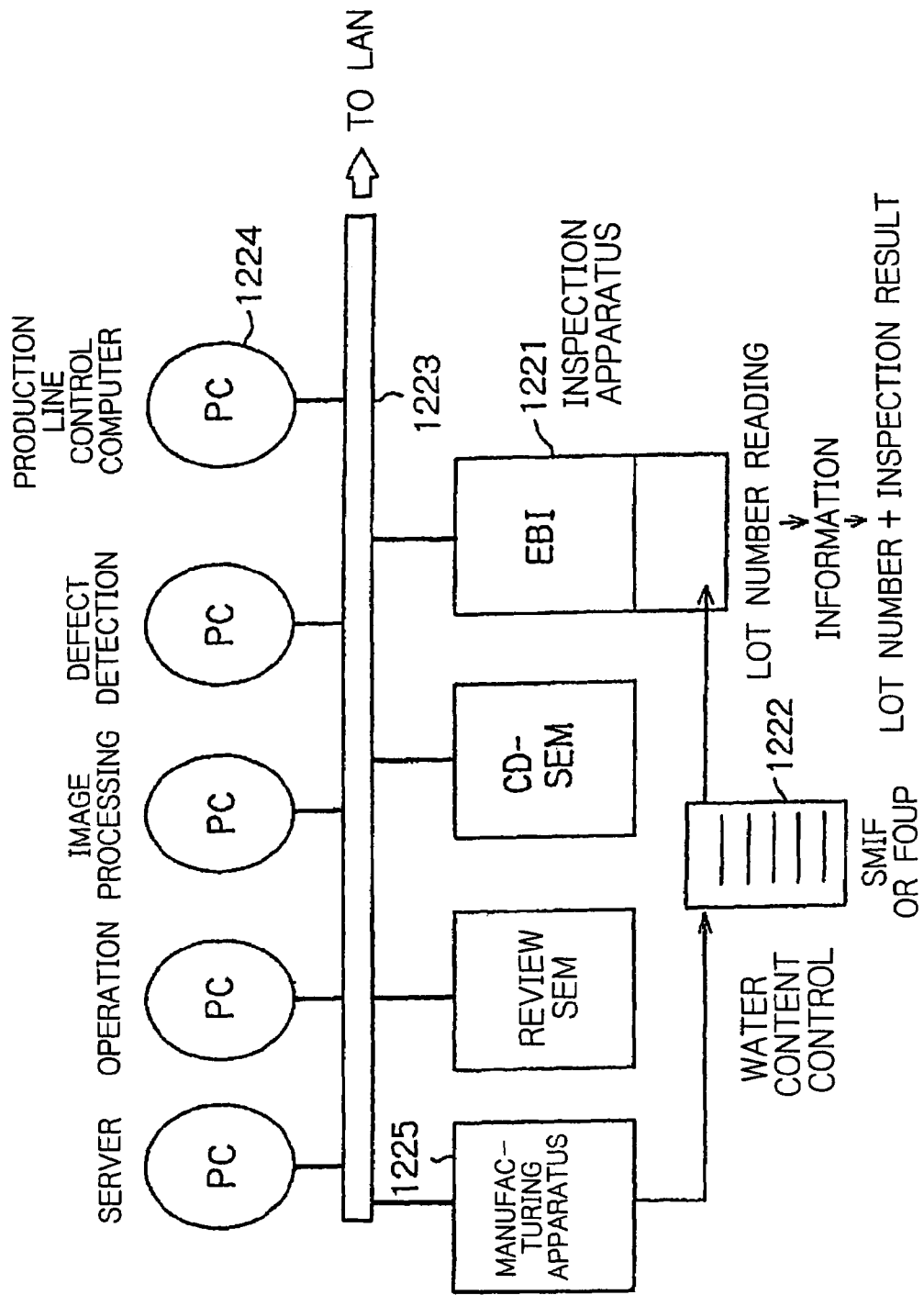
FIG. 41 is a block diagram showing an embodiment of a defect inspection apparatus according to the present invention, which has been incorporated into a manufacturing line.

FIG. 41 shows an example of the manufacturing line using a defect inspection apparatus according to the present invention. It is designed such that the information, including a lot number of a wafer subject to the inspection with the inspection apparatus 1221 and a history indicating specific manufacturing apparatuses used to manufacture said wafer, can be read out of the memory arranged in the SMIF or FOUP 1222, or otherwise its lot number can be identified by reading the ID number of the SMIF, FOUP or the wafer cassette.

The defect inspection apparatus 1221 is adapted to be connected with a network system of a production line, and via this network system 1223, it can send the information such as a lot number of a wafer representing an object to be inspected and a result from inspection on the wafer to a production line controlling computer 1224 that controls the production line, respective manufacturing apparatuses 1225, and other inspection apparatuses. The manufacturing apparatus may include lithography-related apparatuses, such as an exposure, a coater, a curing device, and a developer, or a film deposition apparatus, such as an etching device, a sputtering device and a CVD device, a CMP apparatus, a variety of types of measuring apparatuses and other inspection apparatuses.

In the inspection of the wafer, it is preferred from the viewpoint of the resolution that an image of a surface of the wafer can be obtained by controlling the electron beam to impinge upon the wafer and detecting the secondary electrons emanated from the wafer. Based on this understanding, the description has been so far centered mainly to the secondary electrons, the reflected electrons or the back-scattered electrons. However, the electrons to be detected may be any types of electrons in so far as the information on the surface of the substrate can be obtained therefrom, including, for example, mirror electrons (in a broad sense, referred to as reflected electrons) that do not directly impinge upon the substrate but are reflected in the vicinity of the substrate owing to the negative electric field formed in that region, or transmission electrons that are transmittable through the substrate. Especially, for the case of using the mirror electrons, in which the electrons do not directly impinge upon the sample, the effect of the charge-up can advantageously be made extremely low.

For the case of using the mirror electrons, a negative potential lower than the accelerating voltage is applied to the wafer, so that the negative electric field can be formed in the vicinity of the wafer. This negative potential should be favorably set to such a value sufficient to cause almost all of the electrons to be returned in the vicinity of the surface of the wafer. Specifically, the potential should be set to a value lower than the accelerating electrons by 0.5 to 1.0V or more. For example, in the present invention, for the case of accelerating voltage of −4 kV, preferably, the voltage to be applied to the sample should be in a range of −4.0005 kV to −4.0050 kV. More preferably, it should be in a range of −4.0005 kV to −4.0020 kV, and most preferably in a range of −4.0005 kV to −4.0010 kV.

Further, for the case of using the transmission electrons, when the accelerating voltage is set at −4 kV, the voltage to be applied to the wafer should be in a range of 0 to −4 kV, preferably in a range of 0 to −3.9 kV, and more preferably in a range of 0 to −3.5 kV. Further, a light ray or an X-ray may be used. These rays are satisfactorily applicable to the alignment, the secondary system and the die comparison in the defect inspection apparatus according to the present invention.

Further, the electrons or the secondary beam to be detected in the defect inspection apparatus according to the present invention may be of any types in so far as the information on the sample surface is contained therein, including, not only the secondary electrons, the reflected electrons (also referred to as the mirror electrons) and the back-scattered electrons, but also those reflected electrons that are reflected in the vicinity of the sample without making the primary beam impinge upon the sample with the aid of the negative electric field formed in the vicinity of the sample. Further, the primary beam is not limited to the electrons but may be a light ray. In the case of the primary beam represented by the light ray, the secondary beam is also the light ray, and in the case of the UV ray to be used, the secondary beam may be formed by the electrons.

Figure 42:
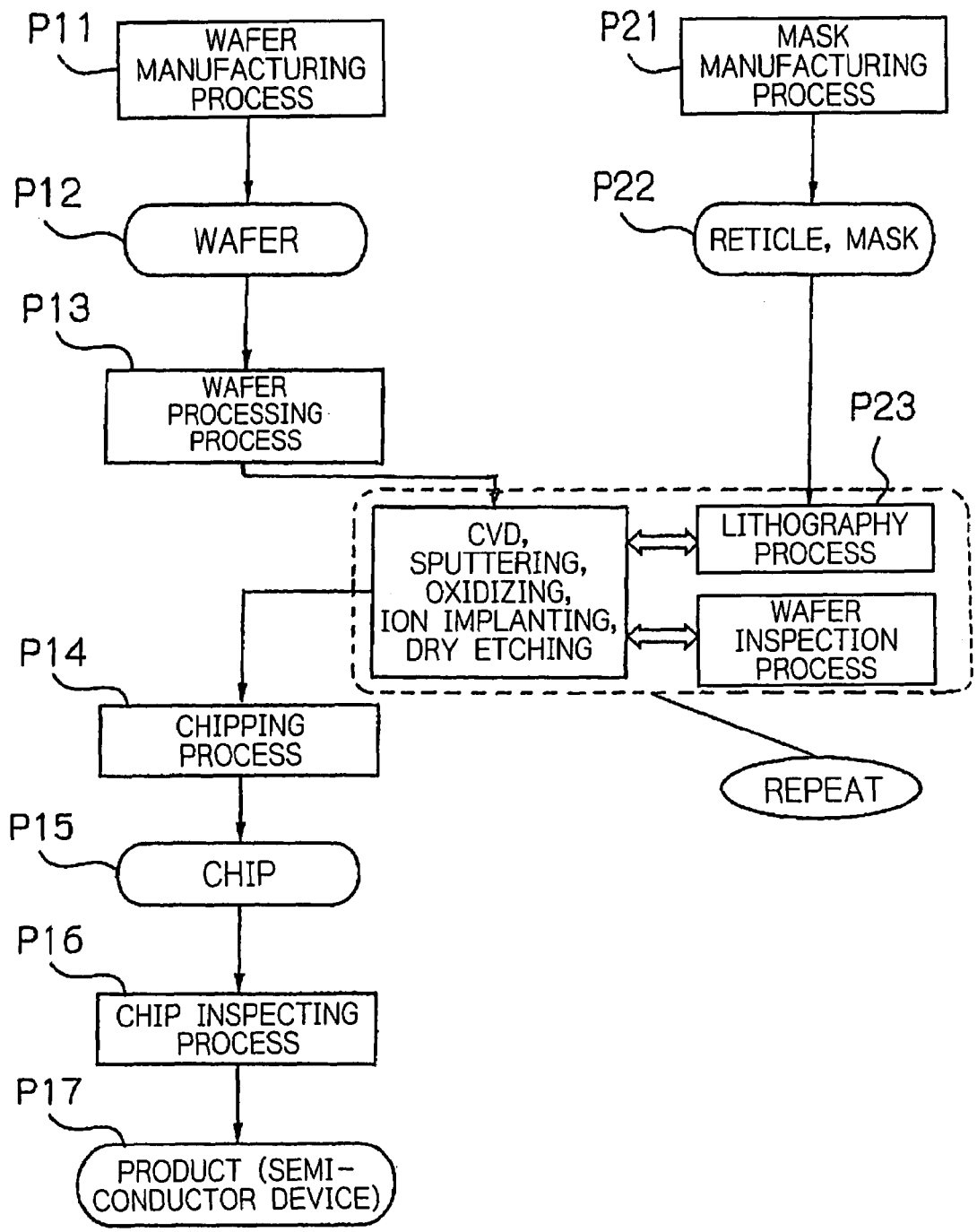
FIG. 42 is a flow chart showing a semiconductor device manufacturing process employing a defect inspection apparatus according to the present invention.

The defect inspection apparatus according to the present invention, which has been described above, is effectively used, for example, in the inspection step in the semiconductor device manufacturing method as shown in FIGS. 42 and 43. The semiconductor device manufacturing method will now be described with reference to FIGS. 42 and 43.

The manufacturing method shown in FIG. 42 includes the following main processes, each of main processes consisting of several sub-processes.

(1) A process P11 for manufacturing a wafer P12 (or preparing a sample).

(2) A mask manufacturing process P21 for fabricating a mask (reticle) P22 to be used in the exposure (or a mask preparing process for preparing a mask).

(3) A wafer processing process P13 for applying any necessary processing treatments to the wafer P12.

(4) A chip assembling process P14 for cutting out those chips P15 formed on the wafer P12 one by one to make them operative.

(5) A chip inspection process P16 for inspecting the chips P15 assembled in the chip assembling process P14 and then taking those chips that have successfully passed the inspection as finished products P17.

Among those main processes, one main process that has a critical effect on the performance of the semiconductor device is the wafer processing process P13. In this wafer processing process, the designed circuit patterns are deposited on the wafer one on another, thus to form many chips, which will function as memories or MPUs. This wafer processing process P13 includes the following sub-processes.

(A) A thin film deposition process for forming a dielectric thin film to be used as an insulation layer, a metallic thin film to be formed into a wiring section or an electrode section, and the like (by using the CVD process or the sputtering);

(B) An oxidizing process for oxidizing thus formed thin film and/or the wafer substrate;

(C) A lithography process P23 for forming a resist pattern by using a mask (reticle) P22 in order to selectively process the thin film layer and/or the wafer substrate;

(D) An ions/impurities implant and diffusion process;

(E) A resist stripping process; and (F) An inspection process for inspecting the processed wafer.

It should be noted that the wafer processing process P13 must be carried out repeatedly as desired depending on the number of layers contained in the wafer, thus to manufacture the products (the semiconductor device) P17 that will be able to operate as designed.

The process defining a core process in the wafer processing process P13 of FIG. 42 is the lithography process P23, and FIG. 43 shows the steps performed in the lithography process P23. The lithography process P23 includes:

(a) A resist coating process P31 for coating the resist on the wafer having a circuit pattern formed thereon in the preceding stage;

(b) An exposing process P32 for exposing the resist;

(c) A developing process P33 for developing the exposed resist to obtain the pattern of the resist; and (d) An annealing process P34 for stabilizing the developed resist pattern.

Known procedures may be applied to all of the processes described above including semiconductor device manufacturing process, the wafer processing process P13 and the lithography process P23, and any further explanation about those will be omitted.

When a defect inspection apparatus according to the present invention is used in the chip inspection process P16 to perform a defect inspection, even such a semiconductor device having a fine pattern can be inspected with high throughput, so that not only a 100% inspection can be employed, but also it is possible to improve the yield of the products and to prevent any defective products from being delivered.

INDUSTRIAL APPLICABILITY

As understood from the detailed description on some specific embodiments of the present invention as given above, the present invention can bring about following excellent effects:

(1) Since an image is generated while applying a position compensation so that each die may be positioned along an equally spaced grid, the image can be generated appropriately so as to perform a pattern inspection without any problem arising even when a stage carrying a sample is not moved as designed or when each die is not formed precisely in its position specified in design, wherein taking as an example the case of using an electron beam for scanning to obtain the image, since when being irradiated upon the sample, the electron beam is controlled by a deflector to direct to its appropriate position in order to compensate for the misalignment of the pattern and also the electrons from the sample (i.e., secondary electrons, reflected electrons, back-scattered electrons and transmission electrons) are also controlled by the deflector to apply necessary compensation, therefore the image for a desired region can be formed accurately and the generated image can be positioned in accordance with an equally spaced virtual grid, thus improving the precision in a defect inspection;

(2) Since, before performing a registration and/or an image-taking, a focusing condition is appropriately measured over an entire region to be inspected and a two-dimensional image is obtained while changing an excitation voltage of an objective lens in conformity with said focusing condition, therefore even with the uneven sample surface, the image having a high resolution can be obtained, which is advantageous in the defect inspection of the sample, such as a stencil mask and a sample; and (3) Since a semiconductor device can be manufactured while performing a defect inspection in the course of processing or after the completion of the processing, a high yield can be expected in the semiconductor device manufacturing process.

The present invention has been described in detail by the above description with reference to the attached drawings, which are made for to allow better understanding but not intended to limit the features of the present invention. These are made simply to illustrate and explain the preferred embodiments of the present invention, and it should be understood that all of the variations and modifications to be made without departing from the scope of the spirit of the present invention shall be protected.

What is claimed is:

1. A method for measuring a magnification of a secondary optical system in an image projection type inspection apparatus, in which a surface of a substrate including a chip formed therein is inspected by using a beam, said method comprising steps of:
   (a) placing said substrate so that said chip is positioned within a field of view subject to the inspection;
   (b) irradiating a rectangular beam onto a characteristic pattern on said substrate to detect back-scattered electrons or secondary electrons from said substrate by a detector, thereby obtaining a two-dimensional image;
   (c) storing a coordinate of the stage (Xc, Yc) when said two-dimensional image is obtained in said step (b) by a laser interferometer;
   (d) moving the stage by a certain distance and thus moving said characteristic pattern, within said field of view;
   (e) performing the same operation as said step (b) so as to obtain the two-dimensional image of said characteristic pattern in said moved position;
   (f) storing a coordinate of the stage (Xf, Yf) when said image has been obtained in said step (e) by said laser interferometer;
   (g) applying a pattern matching between a portion of said image obtained in said step (b) and said image obtained in said step (e) to calculate a displacement between said two images in the X- and Y-directions ($\Delta X$ pixel, $\Delta Y$ pixel);
   (h) calculating a difference between said coordinate (Xc, Yc) stored in said step (c) and said coordinate (Xf, Yf) stored in said step (f), defined by (Xf–Xc) or (Yf–Yc);
   (i) calculating a size per pixel, (Xf–Xc)/$\Delta X$ or (Yf–Yc)/$\Delta Y$, as a magnification of a projection optical system.

2. A method in accordance with claim 1, in which said beam used in said step (b) defines a shape having a longitudinal axis in one axial direction and said beam is controlled by a deflector so as to scan the field of view along the other axial direction, while, in synchronization with said scanning, an optical parameter of a secondary optical system is changed.

3. A method for manufacturing a semiconductor device, in which an evaluation of a wafer in the course of processing or after having been processed is performed by using a method in accordance with claim 1.

4. A method for measuring a magnification of a secondary optical system in an image projection type inspection apparatus, in which a surface of a substrate including a chip formed therein is inspected by using a beam, said method comprising steps of:
   (a) placing said substrate so that said chip is positioned within a field of view subject to the inspection;
   (b) irradiating a rectangular beam onto a characteristic pattern on said substrate to detect back-scattered electrons or secondary electrons from said substrate by a detector, thereby obtaining a first two-dimensional image;
   (c) storing a first coordinate of the stage when said two-dimensional image is obtained in said step (b) by a laser interferometer;
   (d) moving the stage by a certain distance and thus moving said characteristic pattern, within said field of view;
   (e) performing the same operation as said step (b) so as to obtain a second two-dimensional image;
   (f) storing a second coordinate of the stage when said image has been obtained in said step (e) by said laser interferometer;
   (g) applying a pattern matching between said first and second two-dimensional image to calculate a displacement between said first and second images;
   (h) calculating a difference between said first and second coordinate of the stage;
   (i) calculating said difference between said first and second coordinate of the stage per said displacement between said first and second images as a magnification of a projection optical system.

5. A method for manufacturing a semiconductor device, in which an evaluation of a wafer in the course of processing or after having been processed is performed by using a method in accordance with claim 4.

6. An apparatus for inspecting a substrate surface, in which a surface of a substrate having a chip formed therein is inspected by using a beam, for aligning of said chips, said apparatus comprising:
   a device for placing said substrate so that said chip is positioned within a field of view subject to the inspection;
   a measuring device for measuring a magnification for a detection by following steps;
   (a) irradiating a rectangular beam onto a characteristic pattern on said substrate to detect back-scattered electrons or secondary electrons from said substrate by a detector, thereby obtaining a two-dimensional image;
   (b) storing a coordinate of the stage (Xc, Yc) when said two-dimensional image is obtained in said step (a) by a laser interferometer;
   (c) moving the stage by a certain distance and thus moving said characteristic pattern, within said field of view;
   (d) irradiating a rectangular beam onto said characteristic pattern on said substrate to detect back-scattered electrons or secondary electrons from said substrate by said detector so as to obtain the two-dimensional image of said characteristic pattern in said moved position;
   (e) storing a coordinate of the stage (Xf, Yf) when said image has been obtained in said step (d) by said laser interferometer;
   (f) applying a pattern matching between a portion of said image obtained in said step (a) and said image obtained in said step (d) to calculate a displacement between said two images in the X- and Y-directions ($\Delta X$ pixel, $\Delta Y$ pixel);
   (g) calculating a difference between said coordinate (Xc, Yc) stored in said step (b) and said coordinate (Xf, Yf) stored in said step (e), defined by (Xf–Xc) or (Yf–Yc);
   (h) calculating a size per pixel, (Xf–Xc)/$\Delta X$ or (Yf–Yc)/$\Delta Y$, as a magnification of a projection optical system.

7. An apparatus for inspecting a substrate surface, in which a surface of a substrate having a chip formed therein is inspected by using a beam, for placing said substrate so that said chip is positioned within the field of view subject to the inspection, said apparatus comprising:
   a measuring device for measuring a magnification for a detection by following steps:
   (a) irradiating a rectangular beam onto a characteristic pattern on said substrate to detect back-scattered electrons or secondary electrons from said substrate by a detector, thereby obtaining a first two-dimensional image;

(b) storing a first coordinate of the stage when said two-dimensional image is obtained in said step (a) by a laser interferometer;
(c) moving the stage by a certain distance and thus moving said characteristic pattern, within said field of view;
(d) irradiating a rectangular beam onto said characteristic pattern on said substrate to detect back-scattered electrons or secondary electrons from said substrate by said detector so as to obtain a second two-dimensional image in said moved position;
(e) storing a second coordinate of the stage when said image has been obtained in said step (d) by said laser interferometer;
(f) applying a pattern matching between said first and second two-dimensional image to calculate a displacement between said first and second images;
(g) calculating a difference between said first and second coordinate of the stage;
(h) calculating said difference between said first and second coordinate of the stage per said displacement between said first and second images as a magnification of a projection optical system.

* * * * *